US008856610B2

(12) United States Patent
Tada et al.

(10) Patent No.: US 8,856,610 B2
(45) Date of Patent: Oct. 7, 2014

(54) COMPUTER READABLE STORAGE MEDIUM STORING ERROR CORRECTION PROGRAM AND COMMUNICATION APPARATUS

(75) Inventors: Atsuko Tada, Kawasaki (JP); Ryuta Tanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 110 days.

(21) Appl. No.: 13/293,457

(22) Filed: Nov. 10, 2011

(65) Prior Publication Data

US 2012/0131408 A1 May 24, 2012

(30) Foreign Application Priority Data

Nov. 22, 2010 (JP) ................................. 2010-260618

(51) Int. Cl.
H03M 13/00 (2006.01)
H04L 1/18 (2006.01)
H03M 13/37 (2006.01)
H03M 13/05 (2006.01)
H03M 13/11 (2006.01)
H04L 1/20 (2006.01)

(52) U.S. Cl.
CPC ............. *H03M 13/11* (2013.01); *H04L 1/1838* (2013.01); *H03M 13/373* (2013.01); *H04L 1/1809* (2013.01); *H03M 13/6547* (2013.01); H04L 1/203 (2013.01); *H03M 13/05* (2013.01)
USPC .......................................... 714/758; 714/752

(58) Field of Classification Search
None
See application file for complete search history.

(56) References Cited

U.S. PATENT DOCUMENTS

| 7,320,099 B2* | 1/2008 | Miura et al. ................... 714/748 |
| 2005/0289441 A1* | 12/2005 | Kawagoe et al. ............. 714/763 |
| 2007/0260850 A1* | 11/2007 | Kameyama et al. .......... 712/200 |
| 2008/0034270 A1* | 2/2008 | Onishi et al. ................... 714/758 |

(Continued)

FOREIGN PATENT DOCUMENTS

| JP | 63-234632 A | 9/1988 |
| JP | 2004-254127 A | 9/2004 |

(Continued)

OTHER PUBLICATIONS

Adam, H. L. "RTP Payload Format for Generic Forward Error Correction", Network Working Group Request for Comments: 5109, Dec. 1, 2007, pp. 1-44.

(Continued)

*Primary Examiner* — Albert Decady
*Assistant Examiner* — Enamul M Kabir
(74) *Attorney, Agent, or Firm* — Fujitsu Patent Center

(57) ABSTRACT

A computer-readable medium storing a program causing a computer to execute a process includes, acquiring a plurality of data units that belong to a first block in a certain hierarchy among hierarchical blocks defined by a plurality of hierarchies; generating error correction information corresponding to the first block that equals to an exclusive-OR of the plurality of data units; generating, in each individual hierarchy of one or more individual hierarchies that are continuous from and are lower than the certain hierarchy, error correction information corresponding to each individual block that equals to the exclusive-OR of all data units that belong to the individual block among the plurality of data units, where the individual block is one or more individual blocks other than one specific block in two or more blocks in the individual hierarchy that are included in the same block in a hierarchy.

10 Claims, 25 Drawing Sheets

(56) References Cited

U.S. PATENT DOCUMENTS

| | | | |
|---|---|---|---|
| 2008/0134266 A1* | 6/2008 | Kang | 725/110 |
| 2009/0080510 A1* | 3/2009 | Wiegand et al. | 375/240.01 |
| 2010/0077273 A1 | 3/2010 | Tada et al. | |
| 2010/0115383 A1* | 5/2010 | Toda | 714/785 |

FOREIGN PATENT DOCUMENTS

| | | |
|---|---|---|
| JP | 2005-323171 A | 11/2005 |
| JP | 2006-067072 A | 3/2006 |
| JP | 2006-345523 A | 12/2006 |
| JP | 2007-251737 A | 9/2007 |
| JP | 2010-074595 A | 4/2010 |
| WO | 2009/039903 A1 | 4/2009 |

OTHER PUBLICATIONS

Japanese Office Action mailed Apr. 22, 2014 for corresponding Japanese Patent Application No. 2010-260618, with Partial Translation, 7 pages.

* cited by examiner

| NO. | IP ADDRESS | HIERARCHY | BLOCK SIZE | ERROR RATE |
|-----|------------|-----------|------------|------------|
| 1 | 195.173.1.200 | 1 | 24 | 0.02 |
| 2 | 206.89.2.10 | 2 | 12 | 0.05 |
| 3 | 220.161.1.30 | 1 | 24 | 0.025 |
| ⋮ | ⋮ | ⋮ | ⋮ | ⋮ |
| Z | 217.25.10.300 | 3 | 6 | 0.15 |

| HIERARCHY | BLOCK START NO. | BLOCK END NO. |
|---|---|---|
| 4 | 0 | 2 |
| 3 | 0 | 5 |
| 4 | 6 | 8 |
| 2 | 0 | 11 |
| 4 | 12 | 14 |
| 3 | 12 | 17 |
| 4 | 18 | 20 |
| 1 | 0 | 23 |

| V | P | X | CC | M | PT | SEQUENCE NO. |
|---|---|---|----|---|----|--------------|
| TIME STAMP ||||||||
| SYNCHRONIZATION SOURCE (SSRC) IDENTIFIER ||||||||
| CONTRIBUTING SOURCE (CSRC) IDENTIFIER ||||||||

| E | L | P | X | CC | M | PT RECOVERY | SN BASE |
|---|---|---|---|----|----|-------------|---------|
| TS RECOVERY ||||||||
| LENGTH RECOVERY |||||| HIERARCHY ||

708

```
                    1 1 1 1 1 1 1 1 1 1 2 2 2 2 2 2 2 2 2 2 3 3
0 1 2 3 4 5 6 7 8 9 0 1 2 3 4 5 6 7 8 9 0 1 2 3 4 5 6 7 8 9 0 1
```

| PROTECTION LENGTH | MASK |
|---|---|
| MASK (PRESENT ONLY WHEN L = 1) ||

COMPUTER READABLE STORAGE MEDIUM STORING ERROR CORRECTION PROGRAM AND COMMUNICATION APPARATUS

CROSS-REFERENCE TO RELATED APPLICATION

This application is based upon and claims the benefit of priority of the prior Japanese Patent Application No. 2010-260618, filed on Nov. 22, 2010, the entire contents of which are incorporated herein by reference.

FIELD

The embodiments discussed herein are related to an error correction program and a communication apparatus.

BACKGROUND

Various studies have been conducted for error correction. For example, in a type of error correction code, a check bit for error correction is calculated by using exclusive OR operation. Meanwhile, in other kind of error correction code, more complicated operations are used. The error correction may be applied to various applications, for example, a multicast distribution system.

As techniques to correct an error caused at data transmission, for example, a Forward Error Correction (FEC) and an Automatic Repeat-reQuest (ARQ) are known.

The FEC adds redundancy to data to be transmitted. Several techniques are proposed that take account of a balance between redundancy and efficiency.

For example, Japanese Laid-open Patent Publication Nos. Sho. 63-234632 and 2010-74595 discuss data transmission methods that aim to achieve an appropriate error correction control without deteriorating data transmission efficiency.

Japanese Laid-open Patent Publication No. 2004-254127 that the disclosure includes receiving a NACK (negative acknowledgement) indicating there is a lost packet that may not be recovered by FEC from a reception device. Moreover, the disclosure includes redundant data amount adjustment operation to adjust amount of redundant data depending on a reception status of NACK (or identification information of a lost packet included in the NACK).

Furthermore, Japanese Laid-open Patent Publication No. 2004-254127 discusses that the disclosure includes a transmission speed control operation to adjust the number of packets to be transmitted per hour according to the amount of redundant data adjusted at the redundant data amount adjustment operation. Moreover, the disclosure includes an operation to adjust a shuffling span according to a reception status of NACK and an operation to adjust a packet size according to a reception status of NACK.

A method is proposed in order to efficiently calculate error correction data as will be described below. In other words, Japanese Laid-open Patent Publication No. 2006-067072 discusses that when error correction data to be inserted into transmission data at specific intervals is generated by calculating exclusive-OR of the transmission data, the exclusive-OR is continuously calculated cumulatively independent of the insertion intervals. Exclusive-OR between a calculated value of the exclusive-OR at the time of the previous error correction data insertion and a calculated value of the exclusive-OR at the time of the current error correction data insertion is calculated, and error correction data to be inserted at the present time is generated by the calculated exclusive-OR.

A transmission rate control method using an error correction packet is also proposed. Japanese Laid-open Patent Publication No. 2006-345523 discusses that the disclosure includes an operation to transmit a first packet group that is made up of data packets and error correction packets with a certain ratio to a reception device. Moreover, the disclosure includes an operation to transmit a second packet group in which a ratio of error correction packets is adjusted by feedback information related to the first packet group. Furthermore, the disclosure includes an operation to adjust a transmission rate by feedback information related to the second packet group.

Japanese Laid-open Patent Publication No. 2007-251737 discusses a communication system to improve a decoding success rate by making RPS dynamically respond to a communication status. The communication system transfers data through a transmission route between a transmission side device and a reception side device.

The above-described transmission-side device includes an encoding device that generates data that is obtained by redundantly encoding original data, a transmission device that transmits data encoded by the encoding device to a transmission route, and an encoding rate determination device that sets and controls an encoding rate in the encoding device. Moreover, the reception side device includes a reception device that receives encoded data transmitted through the transmission route, a decoding device that decodes original data from received encoded data, and a loss rate assumption device that measures a loss rate on a route of transmitted encoded data. The encoding rate determination device of the transmission-side device changes and controls an encoding rate at the encoding device based on an obtained loss rate.

SUMMARY

In accordance with an aspect of the embodiments, a computer-readable medium storing a program causing a computer to execute a process includes, acquiring a plurality of data units that belong to a first block in a certain hierarchy among hierarchical blocks defined by a plurality of hierarchies; generating error correction information corresponding to the first block that equals to exclusive-OR of the plurality of data units; generating, in each individual hierarchy of one or more individual hierarchies that are continuous from and are lower than the certain hierarchy, error correction information corresponding to each individual block that equals to an exclusive-OR of all data units that belong to the individual block among the plurality of data units, where the individual block is one or more individual blocks other than one specific block in two or more blocks in the individual hierarchy that are included in a same block in a hierarchy that is one hierarchy above the individual hierarchy; transmitting the plurality of data units; transmitting the error correction information corresponding to the first block; and transmitting the error correction information corresponding to each individual block.

The object and advantages of the invention will be realized and attained by at least the features, elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

These and/or other aspects and advantages will become apparent and more readily appreciated from the following description of the embodiments, taken in conjunction with the accompanying drawing of which:

FIG. 13 illustrates an example of a distribution destination management tale;

FIG. 14 illustrates an example of a block management table;

FIG. 16 illustrates a RTP header;

FIG. 17 illustrates an FEC header and an FEC level 0 header;

DESCRIPTION OF EMBODIMENTS

Verification by the inventor reveals the following new findings. In a communication system that transmits data from a first node to a third node through a second node, an error rate of a first communication route between the first and the second nodes, and an error rate of a second communication route between the second and the third nodes may differ. Thus, error correction capability that is preferable to the first communication route and that of the second communication route may be different.

Moreover, an error rate may be changed with time. Thus, error correction capability that is preferable to the first communication route and that of the second communication route may be changed.

Error correction capability may be different depending on a ratio to insert error correction information in data. Accordingly, a ratio to insert error correction information in data differs depending on an error rate.

For example, if a ratio to insert error correction information is excessive for an error rate, wasteful traffic may be caused due to transmitting error correction information more than necessary. Conversely, if a ratio to insert error correction information is insufficient for an error rate, an irrecoverable error may be caused.

Hereinafter, embodiments will be described by referring to the accompanying drawings. The embodiments will be described by the following order. Hierarchical blocks and error correction information that is hierarchically inserted will be described by referring to FIGS. 1 to 2. Examples of network topologies to which the embodiment is applied will be described by referring to FIG. 3. An overview of operation of a node in a network will be described by referring to FIGS. 4 to 7. Configuration by which each node in FIG. 3 achieves operations of FIGS. 4 to 7 will be described by referring to FIGS. 8 to 9. Moreover, the embodiment and an example are compared in order to facilitate understanding advantages of the embodiment by referring to FIGS. 10 to 12.

The embodiment will be described in detail by referring to FIGS. 13 to 25.

In other words, examples of management information used by a node will be described by referring to FIGS. 13 and 14. Examples of formats of packets used by the embodiment will be described by referring to FIGS. 15 to 17. Details of operations of a node will be described by referring to flow charts in FIGS. 18 to 23. Moreover, examples of operation sequence in two cases illustrated in FIGS. 24 to 25 will be referred to as appropriate when the node operation is described. In the end, other alternative embodiments will be described as well.

Figure 1:
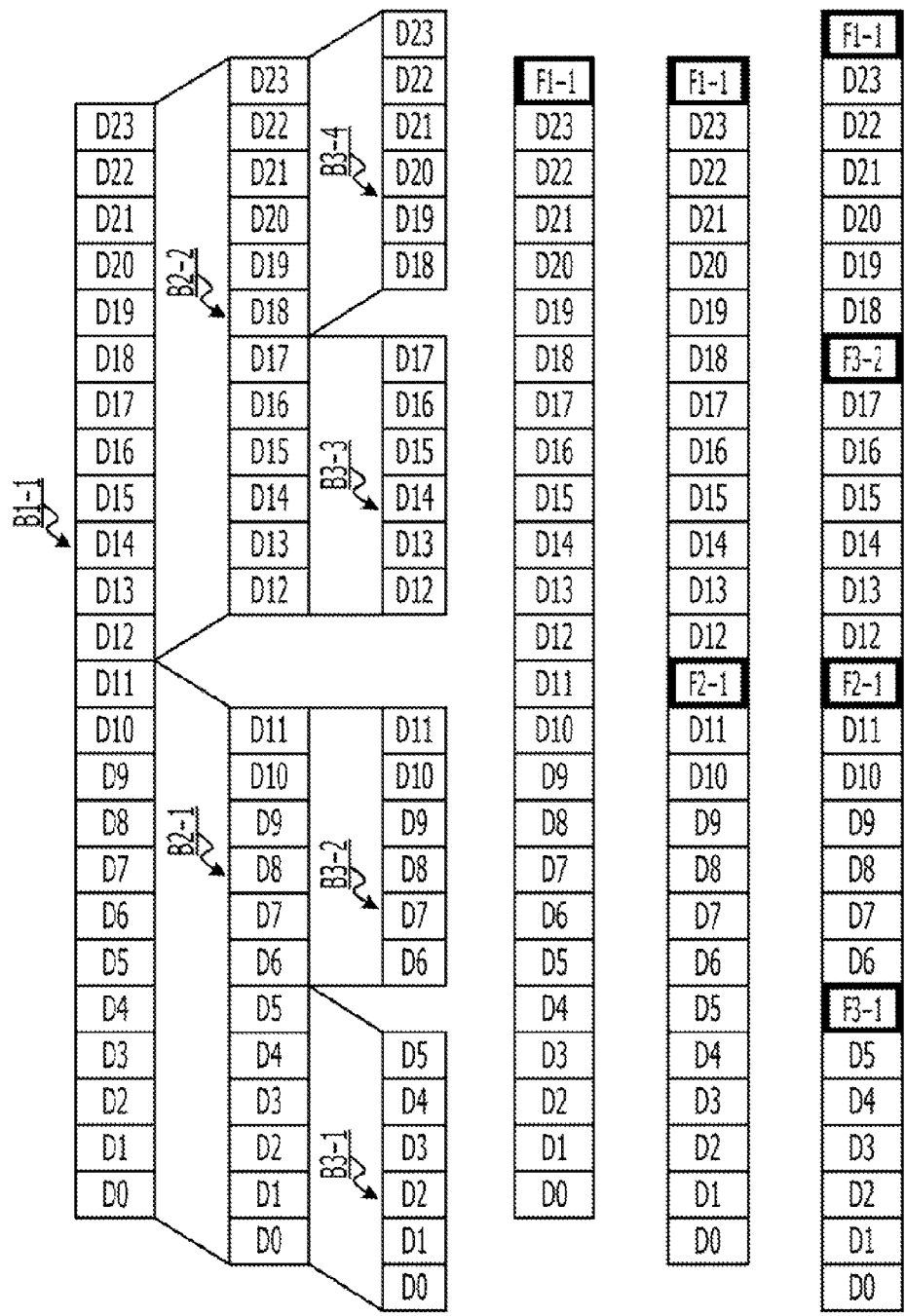
FIG. 1 illustrates hierarchies.

FIG. 1 illustrates hierarchies. FIG. 1 illustrates three hierarchies from a first layer to a third layer. The first layer is the highest layer. The maximum number of hierarchies may be any number depending on an embodiment, and the number of hierarchies is changed according to a state of an error rate (in other words, a packet loss rate) in a communication route.

In the example of FIG. 1, a block B1-1 is defined in the first layer. The block B1-1 includes 24 data packets, D0 to D23. Each of the data packets D0 to D23 is formatted to a Protocol Data Unit (PDU) of an appropriate protocol and includes a data unit that is an error correction target as a payload. Examples of protocols that may be used for the embodiment will be described later. Furthermore, the number of data units that a block in the first layer includes is 24 in the example of FIG. 1. However, any number of data units may be included in the block in the first layer according to an embodiment.

As illustrated in FIG. 1, blocks are defined hierarchically. For example, the block B1-1 includes two blocks, B2-1 and B2-2 of the second layer. The block B2-1 includes 12 data packets, D0 to D11 while the block B2-2 includes 12 data packets, D12 to D23. Thus, the blocks B2-1 and B2-2 are subsets of the block B1-1.

The block B2-1 includes two blocks, B3-1 and B3-2 of the third layer. The block B3-1 includes six data packets, D0 to D5, while the block B3-2 includes six data packets, D6 to D11. Thus, the blocks B3-1 and B3-2 are subsets of the block B2-1.

Likewise, the block B2-2 includes two blocks, B3-3 and B3-4 of the third layer. The block B3-3 includes six data packets, D12 to D17, and the block B3-4 includes six data packets, D18 to D23. Thus, the blocks B3-3 and B3-4 are subsets of the block B2-2.

As described above, data packets, D0 to D23 belong to the same block B1-1 in the first layer, which is the highest hierarchy. Moreover, each of the data packets D0 to D23 belongs to any one of the blocks in each of the plurality of hierarchies. For example, the data packet D7 belongs to the block B1-1 in the first layer, to the block B2-1 in the second layer, and to the block B3-2 in the third layer.

According to the embodiment, an error correction by Forward Error Correction (FEC) is performed. An error to be corrected according to the embodiment is, for example, a data packet loss (in other words, a packet loss). According to the embodiment, error correction information to recover a lost data packet is generated and transmitted by a transfer device, which will be described later. The error correction information is formatted to a protocol data unit (PDU) of an appropriate protocol. Hereinafter, a PDU that includes error correction information as a payload is called an "FEC packet."

According to the embodiment, FEC packets are also hierarchically generated because the blocks are hierarchically defined. In other words, error correction information for the block B1-1 in the first layer that is equal to exclusive-OR of 24 data units that belong to the block B1-1 is generated. For example, exclusive-OR of data units that are error correction targets in payloads of the data packets D0 to D23 is generated as error correction information. An FEC packet F1-1 that includes the generated error correction information as the payload is generated.

Hereinafter, exclusive-OR "x3" of "x1" and "x2" is represented by "^" as in the expression (1.1), where "x1" and "x2" are bit values with a length of 1 bit.

$$x3 = x1 \char`\^ x2 \qquad (1.1)$$

Hereinafter, exclusive-OR "y3" of "y1" and "y2" is represented by "^" as in the expression (1.2), where "y1" is a bit string with a length of m1 bit (1 m1) and "y2" is a bit string with a length of m2 bit (1≤m2).

$$y3 = y1 \char`\^ y2 \qquad (1.2)$$

Here, the Most Significant Bit (MSB) is referred to as 0 th bit, and a maximum value of the "m1" and "m2" is assumed to be "m3." The exclusive-OR, "y3" is a bit string with a length of m3.

For example, the bit string "y3" is obtained as follows. A shorter bit string between the bit strings "y1" and "y2" is padded by a bit value 0 as required to match with the longer bit string with a length "m3." Exclusive-OR of the longer bit string and the bit string that is padded as required is calculated to obtain the bit string "y3." In other words, when the "j" th bit of the bit strings, "y1," "y2," and "y3" is represented as y1 [j], y2[j], and y3[j], the bit value y3 [j] is represented by the following expressions (1.3) to (1.5).

$$y3[j] = y1[j] \char`\^ y2[j] \text{ (when } j \leq m1-1 \text{ and } j \leq m2-1) \qquad (1.3)$$

$$y3[j] = 0 \char`\^ y2[j] \text{ (when } m1-1 < j \leq m2-1) \qquad (1.4)$$

$$y3[j] = y1[j] \char`\^ 0 \text{ (when } m2-1 < j \leq m1-1) \qquad (1.5)$$

Hereinafter, unless misunderstanding is likely to be caused, description may be made by ignoring a header in order to simplify the description such as, "FEC packet F1-1 is exclusive-OR of data packets D0 to D23." Hereinafter, a relationship between the data packets D0 to D23 and the FEC packet F1-1 may be represented by an expression using reference numerals in figures as in the expression (1.6) below. Moreover, similar simplified description may be made for FEC packets in hierarchies other than those in the first layer.

$$[F1-1] = [D0] \char`\^ [D1] \char`\^ [D2] \char`\^ [D3] \char`\^ [D4] \char`\^ [D5] \char`\^ [D6] \char`\^ [D7] \char`\^$$
$$[D8] \char`\^ [D9] \char`\^ [D10] \char`\^ [D11] \char`\^ [D12] \char`\^ [D13] \char`\^ [D14] \char`\^$$
$$[D15] \char`\^ [D16] \char`\^ [D17] \char`\^ [D18] \char`\^ [D19] \char`\^ [D20] \char`\^ [D21] \char`\^$$
$$[D22] \char`\^ [D23] \qquad (1.6)$$

In the expression (1.6) and descriptions hereinafter, the description "[D0]" indicates a part of a data unit that is an error correction target in the data packet D0 excluding, for example, a header. For example, [D0] is a payload of the data packet D0.

Likewise, the description, "[F1-1]" indicates a part of error correction information in the FEC packet, F1-1 excluding a header, etc. For example, the [F1-1] is a part of a payload of the FEC packet, F1-1.

Furthermore, an FEC packet is "associated with (or corresponding to)" one or more data packets" indicates that the FEC packet is generated from the one or more data packets. Similarly, the one or more data packets are associated with the FEC packet. The expression (1.6) is an example indicating a relationship between a data packet and an FEC packet that are interrelated each other.

According to the embodiment, not only error correction information corresponding to the first layer is generated but also FEC packets are generated by a transfer device depending on an environment such as an error rate, which will be described later, for the second layer or lower. In other words, in each of one or more hierarchies that are continuous from a certain hierarchy, error correction information is generated for each of one or more blocks other than the last block in two or more blocks that are included in the same block in a hierarchy that is one hierarchy above the each hierarchy. Moreover, as described above, error correction information generated for each of the one or more blocks in the each hierarchy that is the second layer or lower equals to exclusive-OR of all data units that belong to the each block.

Here, a "certain hierarchy" is, for example, a first layer that is a top hierarchy. However, as will be described later, the "certain hierarchy" may be a second layer or lower, and in that case, the above-described generation of error correction information corresponds to processing that increases the number of hierarchies.

Moreover, for example, the above described "one or more hierarchies that is continuous from a certain hierarchy" may be typically the second layer, the second layer and the third layer, or the second to the fourth layers.

In the example of FIG. 1, in blocks B2-1 and B2-2 that are included in the same block, B1-1 in the first layer which is one hierarchy above the second layer, a block excluding the last block B2-2 is only the block B2-1. Thus, when an FEC packet is generated in the second layer, for example, an FEC packet F2-1 that corresponds to the block B2-1 is generated in the second layer and is inserted to the end of the block B2-1. However, even when an FEC packet of the second layer is generated, no FEC packet that corresponds to the block B2-2 is generated.

For example, error correction information is generated that equals to exclusive-OR of parts of data units that are error correction targets in the payloads of 12 data packets, D0 to D11 that belong to the block B2-1. The generated error correction information is included in the FEC packet F2-1 as a payload. In other words, the FEC packet F2-1 represented in the expression (1.7) is generated corresponding to the block B2-1.

$$[F2-1] = [D0] \char`\^ [D1] \char`\^ [D2] \char`\^ [D3] \char`\^ [D4] \char`\^ [D5] \char`\^ [D6] \char`\^ [D7] \char`\^$$
$$[D8] \char`\^ [D9] \char`\^ [D10] \char`\^ [D11] \qquad (1.7)$$

In the example of FIG. 1, between blocks B3-1 and B3-2 that are included in the same block, B2-1 in the second layer, which is one hierarchy above the third layer, a block excluding the last block B3-2 is only the block B3-1. Thus, when an FEC packet is generated in the third layer, for example, an FEC packet F3-1 is generated that corresponds to the block B3-1 in the third layer and is inserted to the end of the block B3-1. However, even when FEC packets of the third layer are generated, no FEC packet is generated corresponding to the block B3-2.

$$[F3\text{-}1]=[D0]\hat{}[D1]\hat{}[D2]\hat{}[D3]\hat{}[D4]\hat{}[D5] \quad (1.8)$$

For example, error correction information is generated that equals to exclusive-OR of parts of data units that are error correction targets in the payloads of six data packets, D0 to D5 that belong to the block B3-1. The generated error correction information is included in the FEC packet F2-1 as a payload. In other words, the FEC packet F3-1 represented in the expression 1.8 is generated corresponding to the block B3-1.

$$[F3\text{-}1]=[D0]\hat{}[D1]\hat{}[D2]\hat{}[D3]\hat{}[D4]\hat{}[D5] \quad (1.8)$$

In the example of FIG. 1, between blocks B3-3 and B3-4 that are included in the same block, B2-2 in the second layer which is one layer above the third layer, a block excluding the last block B3-4 is only the block B3-3. Thus, when an FEC packet is generated in the third layer, for example, an FEC packet F3-2 that corresponds to the block B3-3 is generated in the third layer and is inserted to the end of the block B3-3. However, even when FEC packets of the third layer are generated, no FEC packet corresponding to the block B3-4 is generated.

For example, error correction information is generated that equals to exclusive-OR of parts of data units that are error correction targets in the payloads of six data packets, D12 to D17 that belong to the block B3-3. The generated error correction information is included in the FEC packet F3-2 as a payload. In other words, the FEC packet F3-2 represented in the expression (1.9) is generated corresponding to the block B3-3.

$$[F3\text{-}2]=[D12]\hat{}[D13]\hat{}[D14]\hat{}[D15]\hat{}[D16]\hat{}[D17] \quad (1.9)$$

When an FEC packet is generated for a deeper hierarchy that is a fourth layer or deeper; the FEC packet is generated for a block excluding the last block among blocks included in the same block in a layer that is one hierarchy above the fourth layer or deeper. As illustrated in FIG. 1, FEC packets that are generated corresponding to blocks in any of the layers are inserted in the end of each block of the deepest hierarchy that is a FEC packet generation target. The data packets and the FEC packet are sequentially transmitted.

For example, when the deepest layer is the second layer, the FEC packet F2-1 that is generated corresponding to the block B2-1 is inserted in the end of the block B2-1. Meanwhile, no FEC packet is generated that corresponds to the block B2-2. However, the end of the block B2-2 is also the end of the block B1-1, and therefore the FEC packet F1-1 that is generated corresponding to the block B1-1 of the first layer is inserted in the end of the block B2-2.

Alternatively, when the deepest hierarchy is the third layer, the FEC packet F3-1 that is generated corresponding to the block B3-1 is inserted in the end of the block B3-1. Meanwhile, no FEC packet is generated corresponding to the block B3-2. However, the end of the block B3-2 is also the end of the block B2-1, and therefore the FEC packet F2-1 that is generated corresponding to the block B2-1 of the second layer is inserted at the end of the block B3-3. Moreover, no FEC packet is generated corresponding to the block B3-4. However, the end of the block B3-4 is also the end of the block B1-1. Therefore, the FEC packet F1-1 that is generated corresponding to the block B1-1 of the first layer is inserted in the end of the block B3-4.

As described above, an FEC packet is inserted for each block in the lowest layer among hierarchies to which FEC packets are to be generated. For any 1≤i, blocks in the "i" th layer may include three or more blocks of the (i+1) th layer. However, according to the embodiment, a block in the "i" th layer include two blocks of the (i+1) th layer.

This is because when a maximum depth of a hierarchy for which FEC packets are generated is adjusted in response to an error rate, a change caused by an adjustment is substantially the most gradual when the number of blocks in the (i+1) th layer is 2. In other words, substantially the most efficient adjustment with substantially the finest granularity may be achieved when hierarchical blocks are defined so that a block in the "i" th layer includes two blocks of the (i+1) th layer.

The above-described "change caused by an adjustment" is, for example, a change in a ratio of the number of FEC packets to the number of data packets. In the example of FIG. 1, when the deepest hierarchy is changed from the third layer to the second layer, the above-described ratio is changed from 1/6 to 1/12. Conversely, when the deepest hierarchy is changed from the second layer to the third layer, the above-described ratio is changed from 1/12 to 1/6. In other words, when the number of blocks in the (i+1) th layer that is included in the "i" th layer is Q, increasing the deepest hierarchy for 1 increases the ratio "Q" times, and decreasing the deepest hierarchy for 1 decreases the ratio to 1/Q.

Accordingly, a change caused by an adjustment is more gradual when the Q is smaller, granularity of the adjustment is finer, and adjustment efficiency is higher. When blocks are defined hierarchically, it is obvious that Q is integer of 2 or more. Thus, according to the embodiment, "2" which is substantially the most preferable value is used as Q.

FIG. 1 illustrates typically one block that is the block B1-1 as a block in the first layer. However, data units the number of which is more than the number of data units that belong to the block in the first layer (in other words, a block size of the first layer) may be transmitted. In this case, FEC packets are inserted as appropriate for each block in the first layer by similar processing illustrated in FIG. 1.

Figure 2:
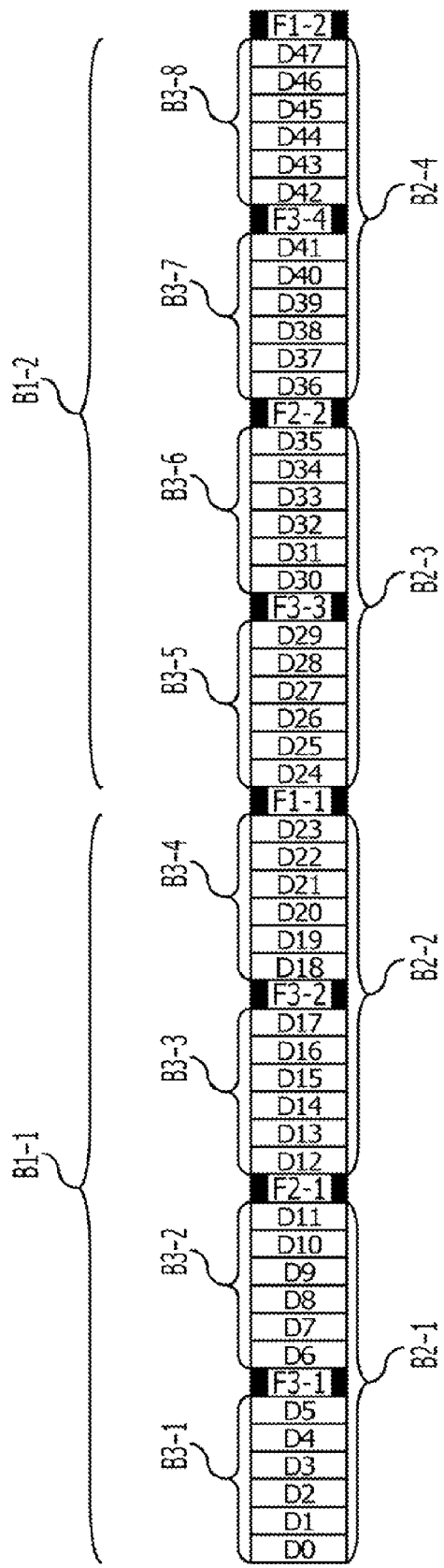
FIG. 2 illustrates arrangement of data packets and FEC packets that are hierarchically inserted.

For example, FIG. 2 illustrates an arrangement of data packets and hierarchically inserted FEC packets. As in FIG. 1, even when a block size of the first layer is 24, 24 or more data packets may be transmitted. For example, the example of FIG. 2 illustrates a case in which 48 data packets are transmitted, and FEC packets are appropriately inserted for each block in the first layer by substantially the same processing as illustrated in FIG. 1. FIG. 2 illustrates an example that the deepest hierarchy for which FEC packets are to be generated is three.

For example, among 48 data packets, D0 to D47, the first 24 data packets, D0 to D23 belong to the first block of the first layer, the block B1-1. Moreover, the latter 24 data packets, D24 to D47 belong to the second block of the first layer, the block B1-2. As in FIG. 1, the block B1-1 includes the blocks B2-1 and B2-2, and the block B2-1 includes blocks B3-1 and B3-2, and the block B2-2 includes blocks B3-3 and B3-4.

The block B1-2 includes blocks of subsets that are hierarchically defined as in the block B1-1. In other words, the block B1-2 includes the blocks B2-3 and B2-4 of the second layer, the block B2-3 includes the blocks B3-5 and B3-6 of the third layer, and the block B2-4 includes the blocks B3-7 and B3-8 of the third layer. The data packets, D24 to D29, D30 to D35, D36 to D41 and D42 to D47 belong to the blocks B3-5 to B3-8 respectively.

When FEC packets are generated corresponding to the blocks up to the third layer, as in FIG. 1, the FEC packet F3-1 is inserted after the block B3-1, while the FEC packet F2-1 is inserted after the block B3-2. Furthermore, the FEC packet F3-2 is inserted after the block B3-3, while the FEC packet F1-1 is inserted after the block B3-4.

The hierarchical FEC packet insertion applies to the second block of the first layer, the block B1-2 as well. In other words, the FEC packet F3-3 is generated corresponding to the block B3-5 of the third layer and is inserted after the block B3-5. The FEC packet F2-2 is generated corresponding to the block B2-3 of the second layer and is inserted after the block B3-6. Moreover, the FEC packet F3-4 is generated corresponding to the block B3-7 of the third layer and is inserted after the block B3-7. The FEC packet F1-2 is generated for the block B1-2 of the first layer and is inserted after the block B3-8.

The above-described FEC packets that are inserted corresponding to the block B1-2 or blocks of the subset of the block B1-2 are represented by the following expressions (2.1) to (2.4).

$$[F3\text{-}3]=[D24]\hat{}[D25]\hat{}[D26]\hat{}[D27]\hat{}[D28]\hat{}[D29] \quad (2.1)$$

$$[F2\text{-}2]=[D24]\hat{}[D25]\hat{}[D26]\hat{}[D27]\hat{}[D28]\hat{}[D29]\hat{}\\ [D30]\hat{}[D31]\hat{}[D32]\hat{}[D33]\hat{}[D34]\hat{}[D35] \quad (2.2)$$

$$[F3\text{-}4]=[D36]\hat{}[D37]\hat{}[D38]\hat{}[D39]\hat{}[D40]\hat{}[D41] \quad (2.3)$$

$$[F1\text{-}2]=[D24]\hat{}[D25]\hat{}[D26]\hat{}[D27]\hat{}[D28]\hat{}[D29]\hat{}\\ [D30]\hat{}[D31]\hat{}[D32]\hat{}[D33]\hat{}[D34]\hat{}[D35]\hat{}[D36]\hat{}\\ [D37]\hat{}[D38]\hat{}[D39]\hat{}[D40]\hat{}[D41]\hat{}[D42]\hat{}[D43]\hat{}\\ [D44]\hat{}[D45]\hat{}[D46]\hat{}[D47] \quad (2.4)$$

As described above, even if data packets more than the block size of the first layer are transmitted, the FEC packets are generated and inserted as appropriate.

Figure 3:
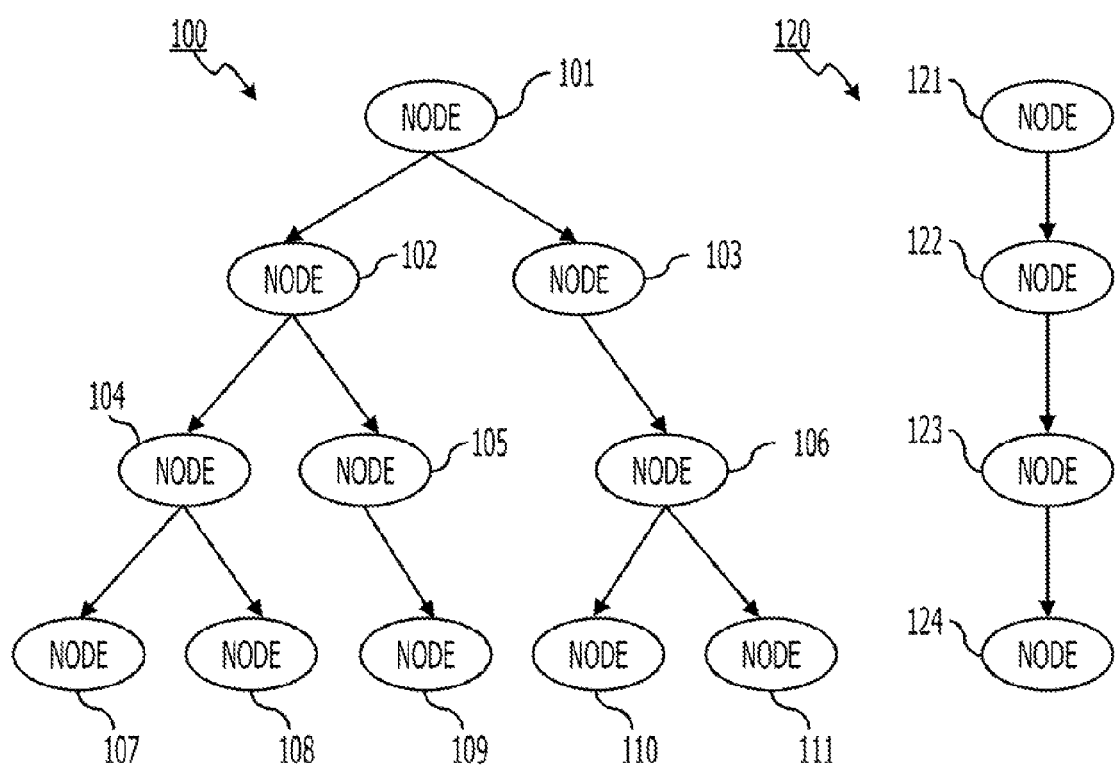
FIG. 3 illustrates two examples of network topologies.

An example of a network in which the above-described data packets and FEC packets are transmitted will be described by referring to FIG. 3. FIG. 3 illustrates two examples of network topologies. The embodiment may be applied to, for example, a network 100 or a network 120.

The network 100 is an example of a tree type topology network. A root node in the network 100 is a node 101. The node 101 transmits packets (in other words, data packets and FEC packets) to a node 102 and a node 103. The node 102 transfers the packets received from the node 101 to the node 104 and the node 105. Likewise, the node 103 transfers the packets received from the node 101 to the node 106.

Moreover, the node 104 transfers the packets received from the node 102 to the node 107 and the node 108. The node 105 transfers the packets received from the node 102 to the node 109. The node 106 transfers the packets received from the node 103 to the node 110 and the node 111.

The nodes 107 to 111 are, as illustrated in FIG. 3, leaf nodes in the network 100, and therefore do not transfer the received packets. Hereinafter, nodes 102 to 106 that are neither a root node nor a leaf node are referred to as "relay nodes."

The network 120 is an example of a network without any branch (in other words, a network without a node that has two or more child nodes). The topology of the network 120 is a kind of a tree. A root node of the network 120 is a node 121. The node 121 transmits packets to the node 122. The node 122 transfers the packets received from the node 121 to the node 123. The node 123 transfers the packets received from the node 122 to the node 124. The nodes 122 and 123 are relay nodes while the node 124 is a leaf node. Accordingly, the node 124 does not transfer any packet.

Each link in the network 100 may have different error rates. For example, an error rate of a link between the node 101 and the node 103 may be much higher than an error rate of a link between the node 101 and the node 102. As a result, if the node 101 inserts FEC packets between data packets with substantially the same ratio both for the node 102 and the node 103, the FEC packets may be excessive or insufficient. In other words, the node 102 may receive unnecessary FEC packets or conversely, the FEC packets may be insufficient for the node 103.

Thus, node 101 may insert the FEC packets between the data packets with ratios that are appropriate for the node 102 and the node 103 respectively. However, if the number of child nodes of the node 101 is not 2 as illustrated in FIG. 3 but numerous (for example, 100 or 1000), increase in processing load due to generation and insertion of FEC packets with different ratios according to child nodes may not be ignored. Accordingly, suppressing increase in the processing load may be achieved.

According to the embodiment, suppressing the processing load may be achieved. In other words, even if the node 101 has numerous child nodes, the processing load may not be extremely increased. The reason why the processing load at a root node having many child nodes may be suppressed will be described in detail later, however this is because FEC packets have a hierarchical structure as described by referring to FIGS. 1 to 2.

For example, an error rate of a link between the node 102 and the node 104 may be much higher than an error rate between a link between the node 101 and the node 102. As a result, it may be inappropriate that the node 102 transfers the data packets and the FEC packets received from the node 101 to the node 104 as they are. This is because even if FEC packets are inserted with a sufficient ratio for the node 102 to recover a data packet which may not be received from the node 101, the ratio may be insufficient for the node 104. Accordingly, it may be appropriate for the node 102 to increase a ratio to insert FEC packets.

Conversely, an error rate of a link between the node 101 and the node 103 may be much higher than that between the node 103 and the node 106. In this case, too many unnecessary FEC packets may be transmitted to the node 106 if the node 103 transfers the data packets and the FEC packets received from the node 101 to the node 106 as they are. As a result, some of the FEC packets may be wasteful traffic. Accordingly, it may be appropriate for the node 103 to decrease a ratio to insert FEC packets.

When a relay node has a plurality of child nodes, the relay node increase or decrease a ratio to insert FEC packets according to each child node. If the number of child nodes is numerous, increase in processing load may not be ignored. Accordingly, suppressing increase in the processing load may be achieved.

According to the embodiment, suppressing the processing load may be achieved. In other words, even if the relay node has numerous child nodes, the processing load may not be extremely increased. The reason why suppressing the processing load at a relay node having numerous child nodes is possible will be described in detail later. However this is because FEC packets have a hierarchical structure as described by referring to FIGS. 1 to 2.

In the network 120, each link may have different error rates. Thus, in the network 120 as in the above-described network 100, a state may be caused in which increasing and decreasing a ratio to insert FEC packets by a relay node is preferable.

An error rate of any link may be changed with time in either the network 100 or the network 120. Therefore, inserting FEC packets between data packets with an appropriate ratio that may be dynamically changed and that is not based on the network topology but based on an error rate of each link may be achieved. The details will be described later. However using hierarchical FEC packets described by referring to FIGS. 1 to 2 may achieve insertion of FEC packets with an appropriate ratio based on an error rate, and moreover, may suppress processing load of each node.

The nodes 101 to 111 and 121 to 124 illustrated in FIG. 3 are, for example, transfer devices that will be described later. The transfer device according to the embodiment may operate as a root node, a relay node, or a leaf node as well.

The nodes 101 to 111 and 121 to 124 may be, for example, a router or a general computer such as a personal computer or a server according to a layer of a protocol to which the embodiment is applied.

For example, the embodiment may be used to achieve so called "intelligent router" by expanding functions of a router. In this case, nodes 101 to 111 and 121 to 124 are routers and arrows between nodes in FIG. 3 indicate physical connections.

Alternatively, the embodiment may be used for a distribution system of Application Layer Multicast (ALM) that is also referred to as overlay multicast. In this case, the nodes 101 to 111 and 121 to 124 are general computers and arrows between nodes in FIG. 3 indicate a logical connection.

Characteristics that error correction information is hierarchically generated and inserted are substantially the same regardless the nodes 101 to 111 and 121 to 124 are whether routers or general computers. Furthermore, error correction information is hierarchically generated and inserted regardless of whether the topology illustrated in FIG. 3 is a physical topology or a logical topology.

Moreover, the embodiment may be applied, for example, to multicast from the root node 101 to the rest of 10 nodes 102 to 111 in the network 100. Alternatively, the embodiment may be applied, for example, to multicast from the root node 101 to some of nodes in the network 100 (for example, typically five leaf nodes, or five leaf nodes and one or more relay nodes).

Likewise, the embodiment may also be applied, for example, to multicast from the root node 121 to the rest of nodes 122 to 124 in the network 120 (alternatively, two nodes that include either one of the leaf node 124 or a relay node). Furthermore, the embodiment may be applied to unicast from the root node 121 to the node 124.

Characteristics that error correction information is generated and inserted hierarchically are substantially the same regardless of whether the embodiment is applied to the examples of multicast or unicast. An overview of operation of a node in a network will be described together with an advantage that processing load is low by referring to FIGS. 4 to 7.

Figure 4:
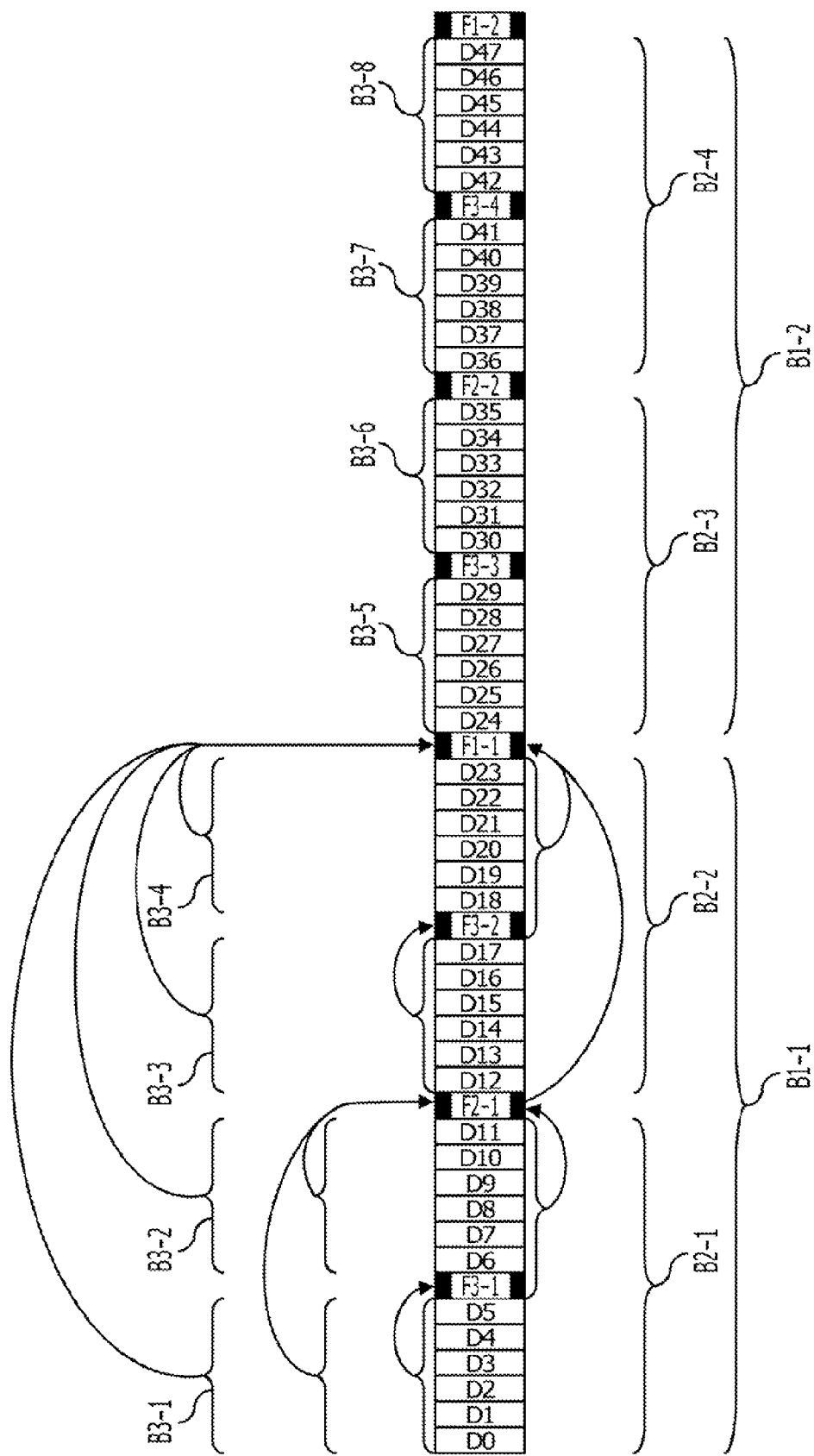
FIG. 4 illustrates hierarchical generation and insertion of FEC packets.

FIG. 4 illustrates hierarchical generation and insertion of FEC packets. As described by referring to FIGS. 1 to 2, according to the embodiment, FEC packets are hierarchically generated and inserted between data packets. As in FIG. 2, FIG. 4 illustrates 48 data packets, D0 to D47, ranges of respective blocks in the first layer to the third layer, and eight FEC packets that are generated and inserted corresponding to each block.

The node 101 in FIG. 3 may generate FEC packets of each layer up to any determined deepest layer N ($1 \leq N$) by processing the series of data packets (for example, data packets D0 to D47) typically once. In other words, the node 101 may generate FEC packets of the "n" th layer for any "n" that is "$1 \leq n \leq N$" by one-pass processing from the series of data packets. FEC packets may be generated by one-pass processing although blocks and FEC packets are hierarchized. This is advantageous to suppress processing load and to reduce consumption of a storage area.

For example, the node 101 may allocate a storage area for FEC packets of the "n" th layer for any "n" that is $1 \leq n \leq N$. The node 101 may process data packets sequentially from the beginning and may perform the following processing for one data packet to be processed.

In other words, the node 101 determines a data packet to be processed is the first data packet or the second packet or later in a block of the n th layer for each "n," when the node 101 processes one data packet. If a data packet to be processed is the first data packet in a block of the "n" th layer, the node 101 stores the data packet in the storage area allocated for the n th layer. Moreover, if a data packet to be processed is the second data packet or later in a block of the "n" th layer, the node 101 overwrites exclusive-OR of data currently stored in the storage area allocated for the n th layer and the data packet to be processed in the storage area.

FEC packets in each layer may be generated with one-pass processing because calculation of exclusive-OR is gradually progressed by the above-described processing. Furthermore, FEC packets in each layer may also be generated by another procedure, which will be described below. The procedure is also an example of one-pass processing.

For example, the following expression (4.1) is formulated from the expressions (1.7) and (1.8).

$$[F2\text{-}1] = [F3\text{-}1]\hat{}[D6]\hat{}[D7]\hat{}[D8]\hat{}[D9]\hat{}[D10]\hat{}[D11] \quad (4.1)$$

For example, the following expression (4.2) is formulated from the expressions, (1.6), (1.7), and (1.9).

$$[F1\text{-}1] = [F2\text{-}1]\hat{}[F3\text{-}2]\hat{}[D18]\hat{}[D19]\hat{}[D20]\hat{}[D21]\hat{}[D22]\hat{}[D23] \quad (4.2)$$

The above expressions (4.1) and (4.2) indicate the followings. In other words, in order to generate FEC packets for blocks of the "n" th layer, when the node 101 processes data packets sequentially from the beginning, all data packets that belong to blocks in the "n" th layer are not necessarily needed. Instead, the node 101 may generate FEC packets corresponding to blocks in the "n" th layer even typically from FEC packets that are already generated for blocks in a deeper layer and data packets that belong to a preceding block in the N th layer.

The following is generalized description of the above expressions, (4.1) and (4.2). In other words, the node 101 retains FEC packets that are generated last for a block in each layer of the second layer or deeper. The "last" indicates that "the last block among currently processed blocks in the first layer for which FEC packets are already generated in the hierarchy."

Hereinafter, an FEC packet that is generated last for a block in the n th layer (when $n \geq 2$) is indicated as "FEC_Last(n)." The node 101 may not continue to retain data packets used for generating FEC packets as long as the node 101 retains FEC packet "FEC_Last(n)" for all "n" that satisfy "$2 \leq n \leq N$."

Moreover, exclusive-OR of data packets that belong to the last block in the lowest layer (in other words, the "N" th layer) is indicated as "FEC_New( )" The "last" indicates that "the last block among blocks in the N th layer that are included in currently processed blocks in the first layer and that are present before an insertion position of an FEC packet to be generated."

For example, when N=3, as illustrated in FIG. 4, block sizes of the first layer to the third layer are assumed to be 24, 12, and 6 respectively. At this time, the node 101 as illustrated in FIG. 4, inserts an FEC packet immediately after the data packets D5, D11, D17, D23, D29, D35, D41, and D47 respectively. Here, generation and insertion target is an FEC packet in the "n" th layer, the FEC packet is represented by "FEC(n)." The FEC (n) is defined by the expressions (4.3) and (4.4). As will be described in detail below, the expression (4.3) is formulated by generalizing the expressions (4.1) and (4.2).

$$FEC(n)=FEC\_Last(n+1)\char`\^FEC\_Last(n+2)\char`\^FEC\_Last(n+3)\char`\^ \ldots \char`\^FEC\_Last(N)\char`\^FEC\_New(\ )$$
(when $1 \leq n \leq N-1$) (4.3)

$$FEC(n)=FEC\_New(\ ) \text{ (when } n=N) \quad (4.4)$$

For example, N=3 in FIG. 4. Accordingly, generation of FEC packets, F3-1, F2-1, F3-2, and F1-1, for example, when a block in the first layer that is currently processed is a block B1-1 will be described below by referring to the above expressions (4.3) and (4.4).

A hierarchy of the FEC packet F3-1 that is inserted immediately after the data packet D5 is 3. In this case, n=N=3, thus, the expression (4.4) is applied. Furthermore, in this case, the last block in the lowest layer (in other words, the third layer) is the block B3-1. Thus, FEC_New( ) is, for example, exclusive-OR of all data packets D0 to D5 that belong to the block B3-1. Accordingly, for the FEC packet F3-1, the expression (4.5) is obtained from the expression (4.4) and the result of the expression (4.5) corresponds to the result of the expression (1.8).

$$[F3-1] = FEC(n) \quad (4.5)$$
$$= FEC(3)$$
$$= FEC\_New()$$
$$= [D0]\char`\^[D1]\char`\^[D2]\char`\^[D3]\char`\^[D4]\char`\^[D5]$$

Moreover, a hierarchy of the FEC packet F2-1 that is inserted immediately after the data packet D11 is 2. In this case, n=2≤N−1, thus, the expression (4.3) is applied. Furthermore, in this case, the FEC packet that is generated last for blocks in the (n+1) th layer (in other words, the third layer) is the FEC packet F3-1. In this case, the last block in the lowest layer is the block B3-2, thus FEC_New( ) is exclusive-OR of all data packets D6 to D11 that belong to the block B3-2. Accordingly, for the FEC packet F2-1, the expression (4.6) is obtained from the expression (4.3), and the result of the expression (4.6) corresponds to the result of the expression (4.1).

$$[F2-1] = FEC(n) \quad (4.6)$$
$$= FEC(2)$$
$$= FEC\_Last(3)\char`\^FEC\_New()$$
$$= [F3-1]\char`\^[D6]\char`\^[D7]\char`\^[D8]\char`\^[D9]\char`\^[D10]\char`\^[D11]$$

A hierarchy of the FEC packet F3-2 that is inserted immediately after the data packet D17 is 3. Accordingly, in this case, the expression (4.4) is applied. The last block in the lowest layer is the block B3-3. Thus, FEC_New( ) is, for example, exclusive-OR of all data packets D12 to D17 that belong to the block B3-3. Accordingly, for the FEC packet F3-2, the expression (4.7) is obtained from the expression (4.4) and the result of the expression (4.7) corresponds to the result of the expression (1.9).

$$[F3-2] = FEC(n) \quad (4.7)$$
$$= FEC(3)$$
$$= FEC\_New()$$
$$= [D12]\char`\^[D13]\char`\^[D14]\char`\^[D15]\char`\^[D16]\char`\^[D17]$$

A hierarchy of the FEC packet F1-1 that is inserted immediately after the data packet D23 is 1. Thus, in this case, the expression (4.3) is applied. In this case, the last generated FEC packet for blocks in the (n+1) layer (in other words, the second layer) is the FEC packet F2-1, while the last generated FEC packet for blocks in the (n+2) layer (in other words, the third layer) is the FEC packet F3-2. In this case, the last block in the lowest layer (in other words, the third layer) is the block B3-4. Thus, FEC_New( ) is, for example, exclusive-OR of all data packets D18 to D23 that belong to the block B3-4. Accordingly, for the FEC packet F1-1, the expression (4.8) is obtained from the expression (4.8) and the result of the expression (4.8) corresponds to the result of the expression (4.2).

As described above, in order to generate an FEC packet, typically data packets may be used, or FEC packets that are already generated may be used. FIG. 4 illustrates arrows that indicate an FEC packet corresponding to a block is directly generated from all data packets that belong to the block. Moreover, FIG. 4 also illustrates arrows that indicate a case when an FEC packet corresponding to a block in the "n" th layer is generated from FEC packets that are already generated in deeper layers and data packets in a preceding block in the lowest layer. The FEC packet is still based on the data packets even in the latter case in which an FEC packet is generated from an FEC packet that is already generated because the FEC packet is indirectly generated from the data packets.

The expressions (4.3) and (4.4) are described above by referring to an example in which "a currently processed block in the first layer" is the block B1-1 and N=3. The expressions (4.3) and (4.4) are satisfied in other cases as well. In other words, the expressions (4.3) and (4.4) are satisfied regardless of "a currently processed block in the first layer" is which block and regardless of a value of N.

When a block in each hierarchy includes two blocks each in a hierarchy immediately below the hierarchy and the lowest layer is the N th layer, a hierarchy "n" of an FEC packet that is inserted at the "X" th order in a block of "a currently processed block in the first layer" is represented by "n=N−a" using a (0≤a≤N−1) that satisfies the expression (4.9).

$$X=2(a+1)i+2a-1 \quad (4.9)$$

In the expression 4.9, 0≤X<2 (N−1) and "i" is an integer 0 or more. The expression (4.9) will be specifically described below.

For example, when N=1, 0≤X<20=1, typically, X=0. As may be understood from FIG. 1, n=1 when X=0, thus, n=N−0 (in other words, a=0).

It may be understood that "when N=1, the expression (4.9) is correct" by applying i=0. In other words, according to the assumption regarding the above-described "a," when N=1, 0≤a 1−1=0 (in other words, typically a=0). Applying "a=0" to the expression (4.9) results in the expression (4.10). In the expression (4.10), applying "i=0" results in X=0, therefore, X=0 satisfies the expression (4.9). In other words, when N=1, the expression (4.9) is correct.

$$X=2 1 i+20-1=2i \quad (4.10)$$

When N=2, 0≤X<2¹=2. Thus, X=0 or X=1. Meanwhile, according to the assumption regarding the above-described "a," 0≤a≤N−1=1 when N=2. As described below, the expression (4.9) is correct when N=2 as well.

For example, when X=0, n=2=N−0 (in other words, a=0) as may be understood from when N=2, the FEC packet F2-1 is inserted at the 0 th order and the FEC packet F1-1 is inserted at the first order in FIG. 1. Here, as described above, when "a=0," the expression (4.9) is deformed into the expression (4.10), applying "i=0" in the expression (4.10) makes "X=0" satisfy the expression (4.9).

Moreover, as may be understood from FIG. 1, when X=1, n=1=N−1, thus "a=1." Applying "a=1" to the expression (4.9) results in the expression (4.11). In the expression (4.11), applying "i=0" results in X=1. Thus, X=1 satisfies the expression (4.9) as well.

$$X=2^2 i+2^1-1=4i+1 \quad (4.11)$$

Moreover, when N=3, 0 X<2²=4. Meanwhile, according to the assumption regarding the above-described "a," 0≤a≤3−1=2 when N=3.

In FIG. 1, when N=3, the FEC packet F3-1 is inserted at the 0 th order, the FEC packet F2-1 is inserted at the first order, the FEC packet F3-2 is inserted at the second order, and the FEC packet F1-1 is inserted at the third order. As may be understood from the above description, when X=0 or X=2, n=3=N−0, thus "a=0," and when X=1, n=2=N−1, thus "a=1," and when X=3, n=1=N−2, thus "a=2."

Here, as described above, the expression (4.9) is deformed into the expression (4.10) when "a=0." In the expression (4.10), applying "i=0" results in X=0, thus X=0 satisfies the expression (4.9). Moreover, in the expression (4.10), applying "i=1" results in X=2, thus X=2 satisfies the expression (4.9).

As described above, when "a=1," the expression (4.9) is deformed into the expression (4.11). In the expression (4.11), applying "i=0" results in X=1, thus X=1 satisfies the expression (4.9) as well.

Moreover, when "a=2," the expression (4.9) is deformed into the expression (4.12). In the expression (4.12), applying "i=0" results in X=3, thus X=3 satisfies the expression (4.9) as well.

$$X=2^3 i+2^2-1=8i+3 \quad (4.12)$$

As may be understood from the above descriptions, a (0≤a≤N−1) that satisfies the expression (4.9) is uniquely defined for an X where 0≤X<2 (N−1). Thus, for example, the node 101 may recognize a hierarchy of the X th order FEC packet (n=N−a) that is subsequently generated and inserted. The node 101 may generate the X th order FEC packet by the expression (4.3) or the expression (4.4) according to the recognized hierarchy "n." A node that generates an FEC packet (for example, the node 101) may recognize a hierarchy of the X th order FEC packet that is subsequently generated and inserted by using information such as a block management table 500 which will be described later by referring to FIG. 14 without using the expression (4.9).

Figure 5:
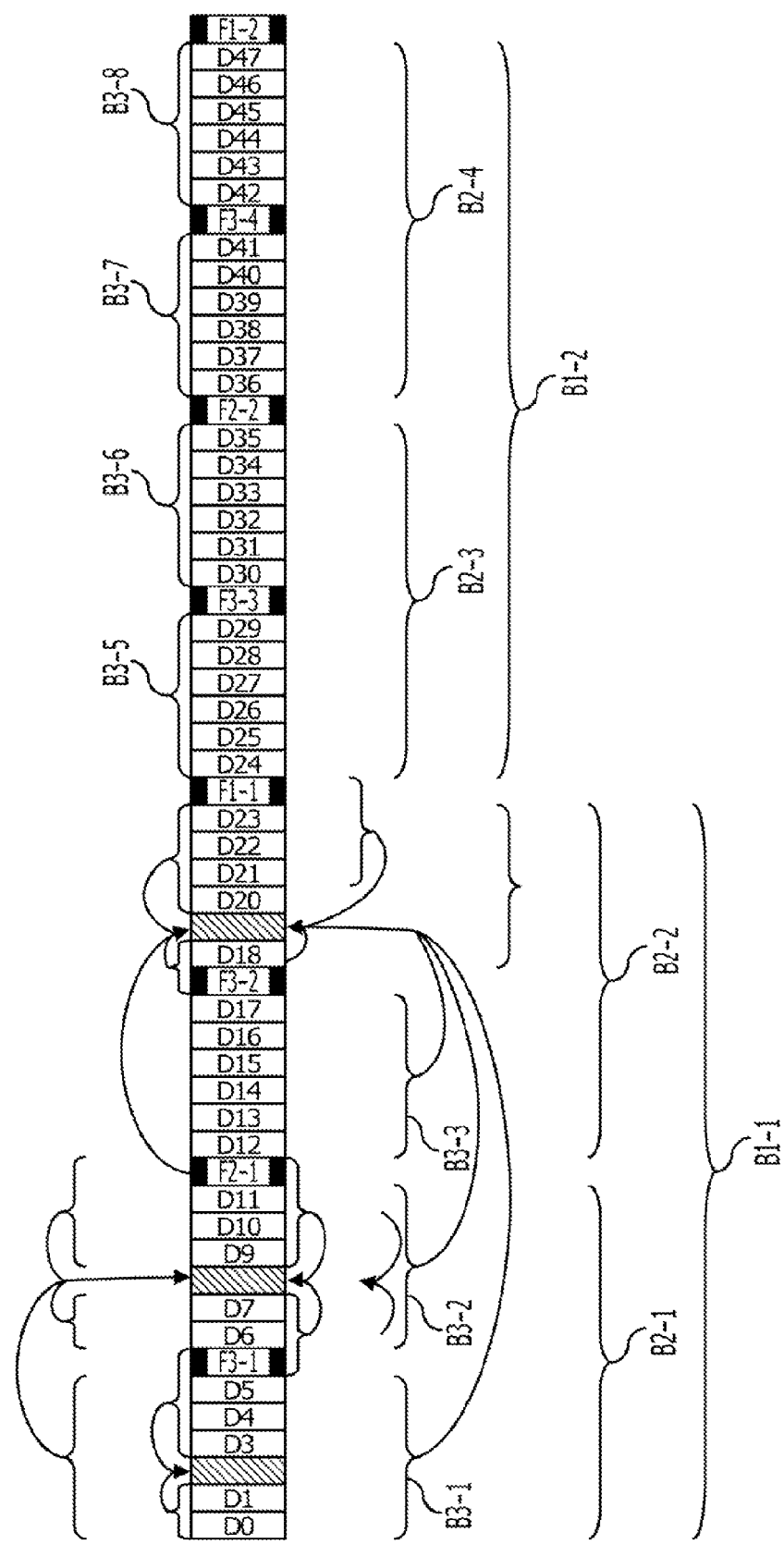
FIG. 5 illustrates an example to recover lost data packets by using FEC packets.

FIG. 5 illustrates an example to recover lost data packets by using FEC packets. In FIG. 5, lost data packets are illustrated by hatching.

When a bit string that is substantially the same length as a bit string "y" and all of the bits are 0 is represented as "zero (y)," the expression (5.1) and (5.2) are satisfied for any bit string "y" based on characteristics of exclusive-OR.

For example, when the data packet D2 that belongs to the block B3-1 is lost at a link between the node 101 and the node 102, the node 102 may recover the data packet D2 by the following procedure. In other words, the node 102 recovers the data packet D2 by calculating exclusive-OR of the remaining five packets that belong to the same block B3-1, that are D0, D1, and D3 to D5, and the FEC packet F3-1 that is generated corresponding to the block B3-1 and transmitted.

It is obvious that the data packet D2 may be recovered by the above calculation based on the following expression (5.3) that is derived from the expressions, (1.8), (5.1), and (5.2)

$$[D0]^\wedge[D1]^\wedge[D3]^\wedge[D4]^\wedge[D5]^\wedge[F3-1] = [D0]^\wedge \quad (5.3)$$
$$[D1]^\wedge[D3]^\wedge[D4]^\wedge[D5]^\wedge([D0]^\wedge[D1]^\wedge[D2]^\wedge[D3]^\wedge[D4]^\wedge[D5]) =$$
$$([D0]^\wedge[D0])^\wedge([D1]^\wedge[D1])^\wedge[D2]^\wedge$$
$$([D3]^\wedge[D3])^\wedge([D4]^\wedge[D4])^\wedge([D5]^\wedge[D5]) = [D2]$$

For example, a data packet D8 that belongs to the block B3-2 is lost at a link between the node 101 and the node 102, the node 102 may recover the data packet D2 by using whichever the following two kinds of processing. The first processing focuses on the following facts, (A-1) and (A-2).

(A-1) The block B3-2 is the last block in the block B2-1 of the second layer that is one hierarchy above as illustrated in FIG. 1. Thus, no FEC packet corresponding to the block B3-2 is generated in the third layer.

(A-2) Instead, the FEC packet F2-1 that is generated corresponding to the block B2-1 is inserted at the end of the block B3-2.

According to the (A-1) and (A-2), the node 102 may recover the lost data packet D8 by calculating exclusive-OR of the remaining 11 data packets that belong to the block B2-1 and the FEC packet F2-1. When one of the data packets D0 to D5 in the block B3-1 is lost in addition to the data packet D8, the node 102 first recovers the data packet in the block B3-1 as in the example of the above-described data packet D2. Then, six data packets, D0 to D5 that belong to the block B3-1 are completed. Accordingly, the node 102 may recover the lost data packet D8.

The above-described first processing is shown in the expression (5.4) below. The expression (5.4) is derived from the expressions (1.7), (5.1), and (5.2) in substantially the same manner as deriving the expression (5.3).

$$[D0]^\wedge[D1]^\wedge[D2]^\wedge[D3]^\wedge[D4]^\wedge[D5]^\wedge[D6]^\wedge[D7]^\wedge[D9]^\wedge$$
$$[D10]^\wedge[D11]^\wedge[F2-1]=[D8] \quad (5.4)$$

However, according to the above-described first processing, the node 102 retains all data packets that belong to the block B3-1 in case of loss of any data packet in the block B3-2. In other words, according to the first processing, the node 102 consumes a large buffer area.

Accordingly, in the above-described example that the data packet D8 is lost, the node 102 may recover the data packet D8 by second processing, which will be described below in order to substantially suppress consumption of the buffer area. In other words, the node 102 may recover the data packet D8 by calculating exclusive-OR of packets of (B-1) to (B-3), which will be described below.

(B-1) The remaining five data packets, D6, D7, and D9 to D11 that belong to the same block B3-2 as the lost data packet D8 in the lowest layer (the third layer in the example of FIG. 5).

(B-2) The first FEC packet that is inserted after the lost data packet D8 (in other words, the FEC packet F2-1)

(B-3) The last FEC packet in a hierarchy among all hierarchies that are deeper than the second layer (typically the third layer in the example of FIG. 5) corresponding to the FEC packet F2-1 of the above-described (B-2). In other words, the last FEC packet is typically the FEC packet F3-1 in the example of FIG. 5. The "last" here indicates an FEC packet corresponding to the last block among blocks in the same hierarchy included in the block B2-1 corresponding to the first FEC packet 2-1 that is inserted after the lost data packet D8.

In other words, the last in the (B-3) indicates an FEC packet corresponding to the last block among blocks in the lowest layer for which an FEC packet is generated and to which a data packet to be recovered belongs.

For example, the data packet D8 belongs to the block B3-2 in the third layer, but no FEC packet corresponding to the block B3-2 is generated. Meanwhile, the data packet D8 belongs to the block B2-1 in the second layer and to the block B1-1 in the first layer. The block B2-1 includes the FEC packet F2-1 generated for the block B2-1 and the block B1-1 includes the FEC packet F1-1 generated for the block B1-1. Accordingly, the last FEC packet in the context of the (B-3) is an FEC packet corresponding to the last block among blocks in the same hierarchy in a range of the block B2-1 of the second layer which is lower between the second layer and the first layer. In other words, the last FEC packet in the third layer is the FEC packet F3-1.

As described above, it is obvious that the data packet D8 may be recovered by the second processing that calculates exclusive-OR of the (B-1) to (B-3) based on the expression (5.5) below. The expression (5.5) is derived from the expressions (5.4) and (1.8).

$$[F3\text{-}1]\char`\^[D6]\char`\^[D7]\char`\^[D9]\char`\^[D10]\char`\^[D11]\char`\^[F2\text{-}1]=[D8] \quad (5.5)$$

The node 102 may recover a data packet D19 by the first processing and the second processing when the data packet D19 is lost in substantially the same manner as when the data packet D8 is lost at the link between the node 101 and the node 102. In other words, the first processing focuses on the facts (C-1) and (C-2) below.

(C-1) The data packet D19 belongs to a block B3-4 in the third layer which is the lowest layer. However, the block B3-4 is the last block in the block B2-1 in the second layer which is one hierarchy above. Thus, no FEC packet corresponding to the block B3-4 is generated in the third layer.

(C-2) Instead, the FEC packet F1-1 that is generated corresponding to the block B1-1 is inserted at the end of the block B3-4.

Based on the (C-1) and (C-2), the node 102 may recover the lost data packet D19 by calculating exclusive-OR of the remaining 23 data packets that belong to the block B1-1 and the FEC packet F1-1. The node 102 may recover the data packet D19 by the first processing even when up to one data packet is lost for each of the blocks B3-1 to B3-3.

This is because the node 102 may recover the data packet in the block B3-1 as in the example of the above-described data packet D2, and may recover the data packet in the block B3-2 as in the example of the above-described data packet D8. Moreover, the node 102 may recover the lost data packet from the remaining five data packets in the block B3-3 and the FEC packet F3-2 even when one of the data packets in the block B3-3 is lost.

Therefore, the node 102 recovers lost data packets first when data packets that belong to the blocks B3-1 to B3-3 are lost. Accordingly, 23 data packets that belong to the block B1-1 are completed other than the data packet D19. Thus, the node 102 may recover the data packet D19 by the first processing when not only the data packet D19 but also data packets in the block B3-1 to B3-3 are lost.

Recovering the data packet D19 by the first processing is obvious from the expression (5.6) below. The expression (5.6) is derived from the expressions (1.6), (5.1), and (5.2) as in the expression (5.3).

$$[D0]\char`\^[D1]\char`\^[D2]\char`\^[D3]\char`\^[D4]\char`\^[D5]\char`\^[D6]\char`\^[D7]\char`\^[D8]\char`\^$$
$$[D9]\char`\^[D10]\char`\^[D11]\char`\^[D12]\char`\^[D13]\char`\^[D14]\char`\^[D15]\char`\^$$
$$[D16]\char`\^[D17]\char`\^[D18]\char`\^[D20]\char`\^[D21]\char`\^[D22]\char`\^[D23]\char`\^$$
$$[F1\text{-}1]=[D19] \quad (5.6)$$

According to the first processing, the node 102 needs to retain all data packets that belong to the blocks B3-1 to B3-3 in case of loss of data packets in the block B3-4. In other words, according to the first processing, the node 102 consumes a large buffer area.

Accordingly, in the above-described example that the data packet D19 is lost, the node 102 may recover the data packet D19 by the second processing, which will be described below, in order to suppress consumption of the buffer area. In other words, the node 102 may recover the data packet D19 by calculating exclusive-OR of packets in the (D-1) to (D-3), which will be described below.

(D-1) The remaining five data packets, D18 and D20 to D23 that belong to the same block B3-4 as the lost data packet D19 in the lowest layer (the third layer in the example of FIG. 5).

(D-2) The first FEC packet that is inserted after the lost data packet D19 (in other words, the FEC packet F1-1)

(D-3) In all hierarchies that are deeper than the first layer corresponding to the FEC packet F1-1 of the above-described (D-2) (the second layer and the third layer in the example of FIG. 5), the last FEC packet among FEC packets in the layer. In other words, in the example of FIG. 5, the last packet is the FEC packet F2-1 for the second layer, and the FEC packet F3-2 for the third layer. The "last" here indicates substantially the same as that described for the (B-3) and in the example that the data packet D19 is lost, the "last" indicates the last among blocks in the same hierarchy in a range of the block B1-1.

The data packet D19 may be recovered by the second processing is illustrated in the expression (5.7) below. The expression (5.7) is derived from the expressions (5.6), (1.7), and (1.9).

$$[F2\text{-}1]\char`\^[F3\text{-}2]\char`\^[D18]\char`\^[D20]\char`\^[D21]\char`\^[D22]\char`\^[D23]\char`\^$$
$$[F1\text{-}1]=[D19] \quad (5.7)$$

The example described above is recovering a data packet by the node 102 when the data packet is lost while being transmitted from the node 101 to the node 102. However, another node may recover the data packet as well when the data packet is lost at a link other than the link between the node 101 to the node 102.

Moreover, in the example of FIG. 5, the lowest layer is the third layer; however, the substantially deepest N may be any hierarchy. Thus, the above-description of the second processing that recovers the data packets D8 and D19 will be generalized and described below.

According to the definitions described for the expressions (4.3) and (4.4), "FEC_New( )" is exclusive-OR of data packets that belong to the last block in the lowest layer (in other words, the N th layer). Therefore, when a data packet that belongs to a block in the N th layer is lost, the lost data packet may be recovered by calculating exclusive-OR of the remaining data packets that belong to the block and the "FEC_New( )."

In the example of FIG. 5 where N=3, when the data packet D19 is lost, the data packet D19 belongs to the block B3-4 in the third layer. Thus, "the last block in the lowest layer" is the block B3-4. Accordingly, based on the definitions, the "FEC_New( )" is exclusive-OR of data packets D18 to D23 that belong to the block B3-4. Thus, the lost data packet D19 may be recovered by calculating exclusive-OR of the remaining five data packets D18, and D20 to D23 that belong to the block B3-4 and the "FEC_New( )" The "FEC_New( )" is represented as below.

The following expression (5.8) is derived by adding "^FEC(n)^FEC_New( )" to both sides of the expression (4.3) when 1≤n≤N−1.

$$FEC(n)\hat{\ }FEC(n)\hat{\ }FEC\_New(\ )=FEC\_Last(n+1)\hat{\ }\\ FEC\_Last(n+2)\hat{\ }FEC\_Last(n+3)\hat{\ }\ldots\hat{\ }FEC\_\\ Last(N)\hat{\ }FEC\_New(\ )\hat{\ }FEC(n)\hat{\ }FEC\_New(\ ) \quad (5.8)$$

The expression (5.9) when 1≤n≤N−1 is obtained by deforming the left side and the right side of the expression (5.8) by using the expressions (5.1) and (5.2).

$$FEC\_New(\ )=FEC\_Last(n+1)\hat{\ }FEC\_Last(n+2)\hat{\ }\\ FEC\_Last(n+3)\hat{\ }\ldots\hat{\ }FEC\_Last(N)\hat{\ }FEC(n) \quad (5.9)$$

Moreover, when n=N, the expression (5.10) as below is obtained from the expression (4.4).

$$FEC\_New(\ )FEC(n) \quad (5.10)$$

The FEC(n) in the expressions (5.9) and (5.10) is, as described with respect to FIG. 4 and FIG. 5, the first FEC packet that is inserted after the lost data packet and the "n" is the hierarchy of the FEC packet.

In the example of FIG. 5, when the data packet D2 is lost, FEC(n)=[F3-1] and n=3. When the data packet D8 is lost, FEC(n)=[F2-1] and n=2. When the data packet D19 is lost, FEC(n)=[F1-1] and n=1. Although not illustrated in FIG. 5, for example, when the data packet D14 is lost, FEC(n)=[F3-2] and n=3.

For example, the node 102 that receives packets from the node 101 may recover a lost data packet as long as the node 102 retains data packets that belong to the last block in the N th layer that is the lowest layer and FEC packets that are received last for respective layers that equal to or lower than the second layer. For example, the node 102 recovers a data packet by the following manner.

When the node 102 detects a data packet loss, the node 102 may recognize a value of the "n" based on the order of the lost data packet in the block in the first layer. Accordingly, the node 102 either calculates the FEC_New( ) by the expression (5.9) according to the recognized value of the n, or obtains the retained FEC(n) as FEC_New( ) by the expression (5.10).

The node 102 recovers the lost data packet by calculating exclusive-OR of the remaining data packets that belong to the same block as the lost data packet in the N th layer and the FEC_New( ).

For example, when the data packet D2 is lost, the FEC packet F3-1 that is the first FEC packet after the data packet D2 corresponds to the block B3-1 in the third layer, thus n=3. Accordingly, the node 102 obtains the FEC_New( ) of the expression (5.11) according to the expression (5.10).

$$FEC\_New(\ )=FEC(3)=[FEC3-1] \quad (5.11)$$

The remaining data packets that belong to the block B3-1 to which the lost data packet D2 belongs in the lowest layer are the data packets D0, D1, and D3 to D5. Thus, the node 102 recovers the data packet D2 by calculating exclusive-OR of the FEC_New( ) obtained by the expression (5.11) and the five data packets D0, D1, and D3 to D5. The recovery is as described by referring to the expression 5.3.

When the data packet D8 is lost, the first FEC packet F2-1 after the data packet D8 corresponds to the block B2-1 in the second layer, thus n=2. Therefore, the node 102 obtains FEC_New( ) of the expression (5.12) according to the expression (5.9).

$$FEC\_New(\ )=FEC\_Last(3)\hat{\ }FEC(2)=[FEC3-1]\hat{\ }\\ [FEC2-1] \quad (5.12)$$

The remaining data packets of the block B3-2 to which the lost data packet D8 belongs in the lowest layer are data packets, D6, D7, and D9 to D11. Accordingly, the node 102 recovers the data packet D8 by calculating exclusive-OR of FEC_New( ) obtained by the expression (5.12) and the five data packets D6, D7, and D9 to D11. The recovery is as described by referring to the expression (5.5).

When the data packet D19 is lost, the first FEC packet F1-1 after the data packet D19 corresponds to the block B1-1 in the first layer, thus n=1. Therefore, the node 102 obtains FEC_New( ) of the expression (5.13) according to the expression (5.9).

$$FEC\_New(\ )=FEC\_Last(2)\hat{\ }FEC\_Last(3)\hat{\ }FEC(1)=\\ [FEC2-1]\hat{\ }[FEC3-2]\hat{\ }[FEC1-1] \quad (5.13)$$

The remaining data packets that belong to the block B3-4 to which the lost data packet D19 belongs in the lowest layer are the data packets D18 and D20 to D23. Thus, the node 102 recovers the data packet D19 by calculating exclusive-OR of the FEC_New( ) obtained from the expression (5.13) and the five data packets D18, and D20 to D23. The recovery is as described by referring to the expression (5.7).

As described above, recovery by the expression (5.10) is performed when an FEC packet is defined that corresponds to a block to which the lost data packet belongs in the lowest layer, the N th layer. This is because the hierarchy of a block corresponding to the first FEC packet after the lost data packet is the n th layer.

Conversely, the recovery by the expression (5.9) is performed when a block to which the lost data packet belongs in the lowest layer, the N th layer is the last block (for example, the block B3-4 in FIG. 5) in the same block in one hierarchy above (in other words, the (N−1) th layer). This is because a block corresponding to the first FEC packet after the lost data packet is a block in the hierarchy shallower than the N th layer.

For example, in FIG. 3, an error rate of a link between the node 101 and the node 103 may be higher than that of the node 103 and the node 106. In this case, FEC packets up to the third layer may be transmitted together with data packets when the node 101 transmits the data packets to the node 103. However, sufficient error correction capability for the node 106 may be obtained by the FEC packets up to the second layer.

Figure 6:
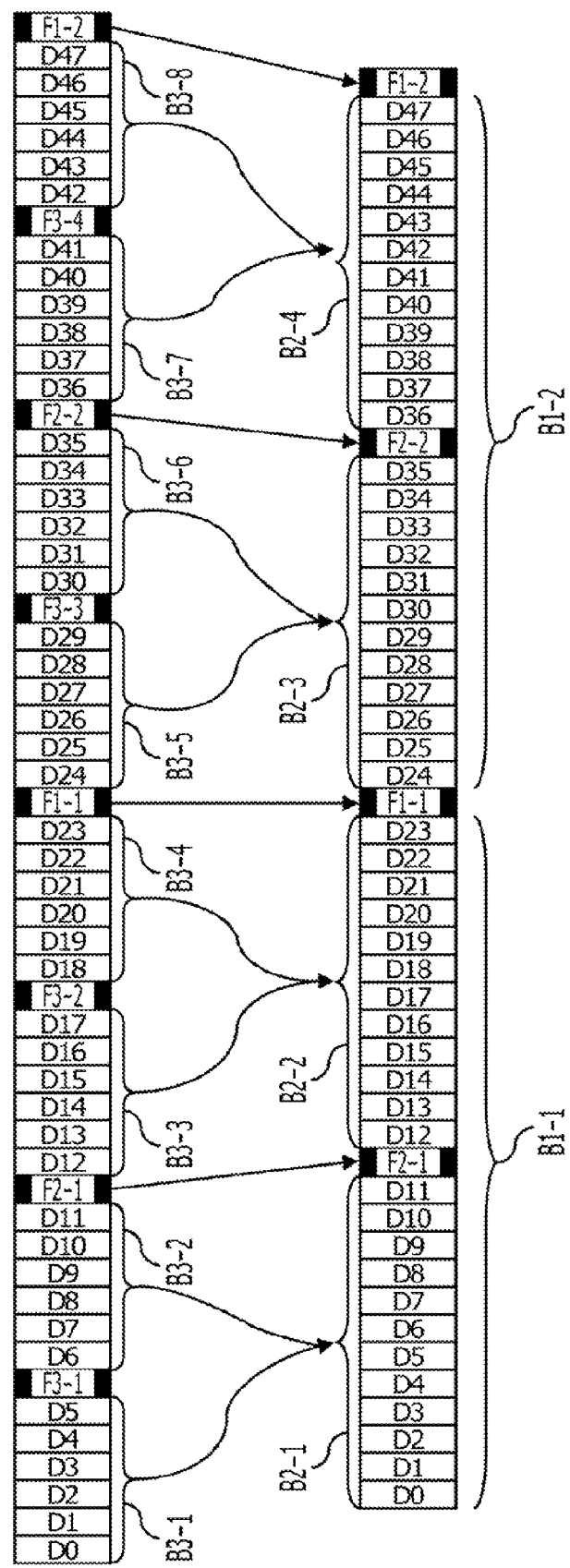
FIG. 6 illustrates an example to make a hierarchy shallower by deleting some of FEC packets.

When the node 103 transfers the FEC packets in the third layer received from the node 101 to the node 106, the node 106 receives many packets more than necessary. Accordingly, in order to reduce wasteful traffic, the node 103 does not transfer the FEC packets in the third layer to the node 106. FIG. 6 illustrates, for example, suppressing the above-described FEC packet transfer.

In other words, FIG. 6 illustrates making a hierarchy shallower by deleting some of the FEC packets. In the above described example, the node 103 receives FEC packets in the first layer to the third layer from the node 101 together with the data packets. The upper part of FIG. 6 illustrates the following (E-1) to (E4) as packets that are transmitted from the node 101 to the node 103.

(E-1) Data packets D0 to D47
(E-2) FEC packets F1-1 and F1-2 in the first layer
(E-3) FEC packets F2-1 and F2-2 in the second layer
(E-4) FEC packets F3-1, F3-2, F3-3, and F3-4 in the third layer If there is any lost data packet, the node 103 recovers the lost data packet accordingly. The method to recover the lost data packet is as described by referring to FIG. 5. The node 103 transfers the received or the recovered data packets to the node 106.

Moreover, the node 103 transfers FEC packets in the first layer up to those in the second layer to the node 106. However, the node 103 does not transfer the FEC packet in the third layer to the node 106 that is unnecessary for the transfer destination node 106. The lower part of FIG. 6 illustrates the above-described (E-1) to (E-3) as packets transmitted from the node 103 to the node 106.

According to the embodiment, any relay node other than the node 103 may make the hierarchy of the FEC packet shallower in the same manner as described above by deleting some of FEC packets from the transfer targets.

In the above-described example, FEC packets in the third layer that is the lowest layer are deleted from the transfer targets among FEC packets received by the node 103. However, the relay node may delete FEC packets in the second layer or higher including the lowest layer from the transfer targets. For example, if an error rate of the link between the node 103 and the node 106 is very low, sufficient error correction capability for the node 106 may be achieved typically by the FEC packets in the first layer. In this case, node 103 does not transfer the FEC packets in the third layer and the second layer to the node 106.

According to the embodiment, processing to reduce a ratio to insert FEC packets according to a difference in error rates is to simply control so that some of the received FEC packets are not transferred. Thus, according to the embodiment, excessive FEC packets transmission may be suppressed without substantially increasing processing load of relay nodes.

Conversely to the example of FIG. 6, when an error rate of a link between the nodes 102 and 104 is higher than that between the node 101 and the node 102 in FIG. 3, the relay node 102 newly adds an FEC packet of the deeper hierarchy as necessary. For example, there is a case that "sufficient error correction capability for the node 102 may be achieved by the FEC packets up to the third layer, however, the FEC packets up to the fourth layer are needed in order to achieve sufficient error correction capability for the node 104."

Figure 7:
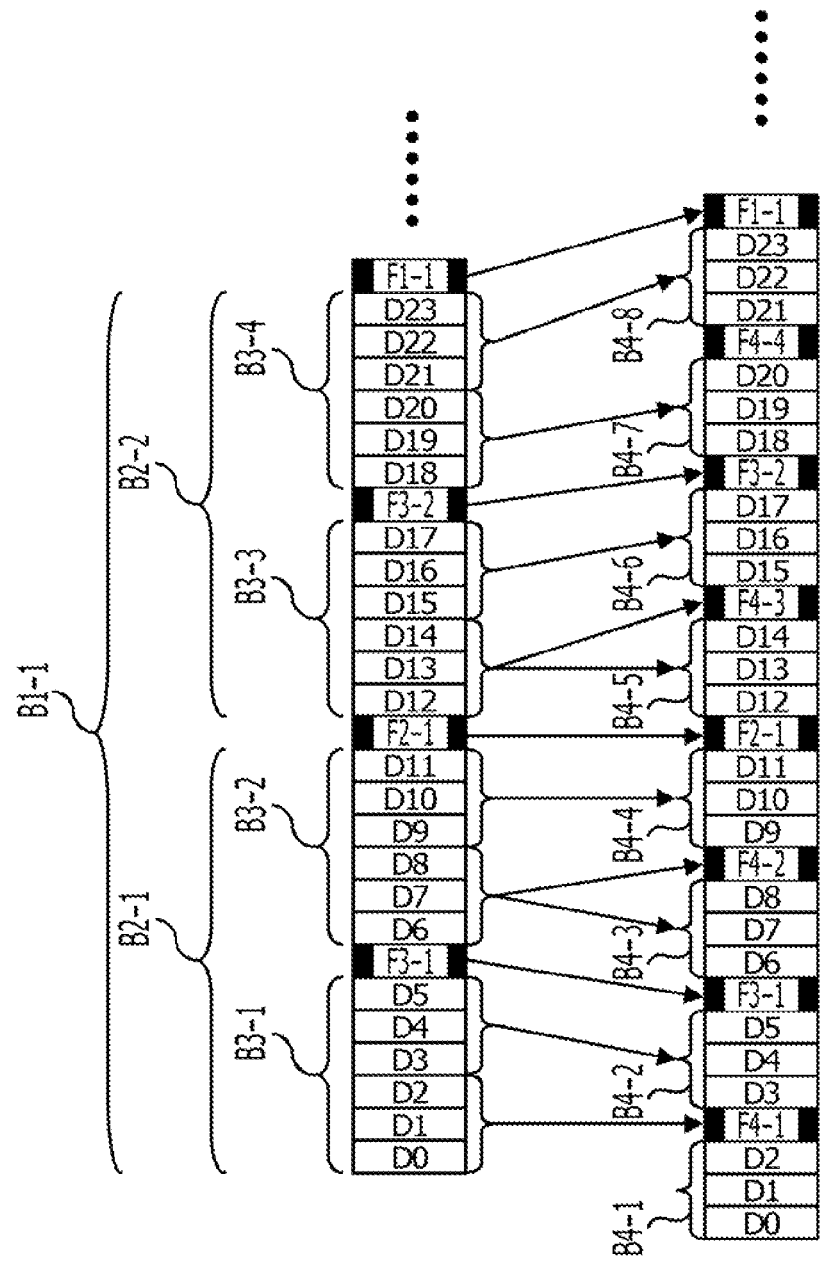
FIG. 7 illustrates an example to make a hierarchy deeper by inserting FEC packets.

When the node 102 transfers typically the data packets received from the node 101 and the FEC packets up to the third layer to the node 104, the node 104 may not recover a data packet if any data packet is lost. Thus, in order to obtain sufficient error correction capability for the node 104, node 102 additionally generates FEC packets in the fourth layer and transfers packets while inserting the generated FEC packets to the data packets. FIG. 7 illustrates adding FEC packets, for example, as described above.

In other words, FIG. 7 illustrates an example to make the hierarchy deeper by adding FEC packets. In the above-described example, the node 102 receives FEC packets in the first layer to the third layer from the node 101 together with the data packets. The upper part of FIG. 7 illustrates the following (F-1) to (F-4) as packets transmitted from the node 101 to the node 102.

(F-1) Data packets D0 to D23 in the first layer
(F-2) FEC packet F1-1 in the first layer
(F-3) FEC packet F2-1 in the second layer
(F-4) FEC packets F3-1 and F3-2 in the third layer If there is any lost data packet, the node 102 recovers the lost data packet as appropriate. The method to recover the lost data packet is as described by referring to FIG. 5. The node 102 transfers the received or recovered data packets to the node 104. The node 102 transfers all the received FEC packets up to the third layer to the node 104.

Moreover, the node 102 generates FEC packets in the fourth layer and transmits the FEC packets to the node 104. Accordingly, the lower part of FIG. 7 illustrates the above-described (F-1) to (F-4) and the below-described (F-5) as packets that are transmitted from the node 102 to the node 104.

(F-5) FEC packets in the fourth layer, F4-1, F4-2, F4-3, and F4-4.

For example, the block B3-1 in the third layer includes two blocks B4-1 and B4-2 in the fourth layer, and the block B3-2 in the third layer includes two blocks B4-3 and B4-4 in the fourth layer. Moreover, the block B3-3 in the third layer includes two blocks B4-5 and B4-6 in the fourth layer, and the block B3-4 in the third layer includes two blocks, B4-7 and B4-8 in the fourth layer. Accordingly, the node 102 adds FEC packets as in the following (G-1) to (G-16), and makes the hierarchy deeper. The "data packets" in description of the (G-1) to (G-16) are data packets that are received by the node 102 from the node 101 or data packets recovered by the node 102.

(G-1) The node 102 transmits data packets D0 to D2 that belong to the block B4-1 to the node 104.

(G-2) The node 102 generates an FEC packet F4-1 in the fourth layer corresponding to the block B4-1 by calculating exclusive-OR of the data packets D0 to D2. The node 102 inserts the FEC packet F4-1 after the data packet D2. In other words, the node 102 transmits the FEC packet F4-1 subsequent to the data packet D2 to the node 104.

(G-3) The node 102 transmits the data packets D3 to D5 that belong to the block B4-2 to the node 104. The block B4-2 is the last block of the block B3-1 in the third layer which is one hierarchy above. Thus, no FEC packet corresponding to the block B4-2 is present in the fourth layer.

(G-4) The node 102 transmits the FEC packet F3-1 that is immediately after the data packet D5 to the node 104. The FEC packet F3-1 is transmitted from the node 101 to the node 102, and therefore the node 102 does not need to generate the FEC packet F3-1 unless the FEC packet F3-1 is lost.

(G-5) The node 102 transmits the data packets D6 to D8 that belong to the block B4-3 to the node 104.

(G-6) The node 102 generates an FEC packet F4-2 corresponding to the block B4-3 in the fourth layer by calculating exclusive-OR of the data packets D6 to D8. The node 102 transmits the FEC packet F4-2 subsequent to the data packet D8.

(G-7) The node 102 transmits data packets D9 to D11 that belong to the block B4-4 to the node 104. No FEC packet corresponding to the block B4-4 is present in the fourth layer.

(G-8) The node 102 transmits the FEC packet F2-1 that is immediately after the data packet D11 to the node 104. The FEC packet F2-1 is transmitted from the node 101 to the node 102, and therefore the node 102 does not need to generate the FEC packet F2-1 unless the FEC packet F2-1 is lost.

(G-9) The node 102 transmits the data packets D12 to D14 that belong to the block B4-5 to the node 104.

(G-10) The node 102 generates an FEC packet F4-3 corresponding to the block B4-5 in the fourth layer by calculating exclusive-OR of the data packets D12 to D14. The node 102 transmits the FEC packet F4-3 subsequent to the data packet D14 to the node 104.

(G-11) The node 102 transmits data packets D15 to D17 that belong to the block B4-6 to the node 104. No FEC packet corresponding to the block B4-6 is present in the fourth layer.

(G-12) The node 102 transmits the FEC packet F3-2 immediately after the data packet D17 to the node 104. The FEC packet F3-2 is transmitted from the node 101 to the node 102, and therefore the node 102 does not need to generate the FEC packet F3-2 unless the FEC packet F3-2 is lost.

(G-13) The node 102 transmits the data packets D18 to D20 that belong to the block B4-7 to the node 104.

(G-14) The node 102 generates an FEC picket F4-4 corresponding to the block B4-7 in the fourth layer by calculating exclusive-OR of the data packets D18 to D20. The node 102 transmits the FEC packet F4-4 subsequent to the data packet D20 to the node 104.

(G-15) The node 102 transmits data packets D21 to D23 that belong to the block B4-8 to the node 104. No FEC packet corresponding to the block B4-8 is present in the fourth layer.

(G-16) The node 102 transmits the FEC packet F1-1 immediately after the data packet D23 to the node 104. The FEC packet F1-1 is transmitted from the node 101 to the node 102, and therefore the node 102 does not need to generate the FEC packet F1-1 unless the FEC packet F1-1 is lost.

As may be obvious from the above-described (G-1) to (G-16), the node 102 does not need to generate FEC packets in the first layer to the third layer unless the FEC packets are lost. In other words, the node 102 may additionally generate typically an FEC packet in the newly deepened hierarchy (in other words, the fourth layer in FIG. 7).

Thus, according to the embodiment, processing to increase a ratio to insert FEC packets according to a difference in error rates of links is typically to generate and transmit FEC packets in the increased layer. Thus, a relay node does not need to regenerate FEC packets from the first layer to all layers.

According to the embodiment, a ratio to insert FEC packets may be appropriately increased according to an error rate while suppressing increase in processing load of the relay node. For example, the node 102 in FIG. 7 may increase a ratio to insert FEC packets from 1/6 (in other words, one FEC packet for six data packets) to 1/3 typically by newly generating and transmitting FEC packets in the fourth layer.

According to the embodiment, any relay node other than the node 102 may deepen a hierarchy of the FEC packet by adding an FEC packet as described above. In the above example, the node 102 deepens a hierarchy for one, however the relay node may newly add FEC packets for two layers or more. For example, if an error rate of the link between the node 102 and the node 104 is very high, sufficient error correction capability for the node 104 may not be achieved by FEC packets up to the fourth layer. In this case, node 102 further generate FEC packets in the fifth layer, which is not illustrated, and transmits the FEC packets to the node 104.

In this case, one or two data packets belong to each block in the fifth layer. In other words, sizes of blocks in the same layer may be different.

The embodiment is described by referring to FIGS. 1 to 7. However, the above-described node may be a transfer device that has configurations, for example, as illustrated in FIG. 8 and FIG. 9.

Figure 8:
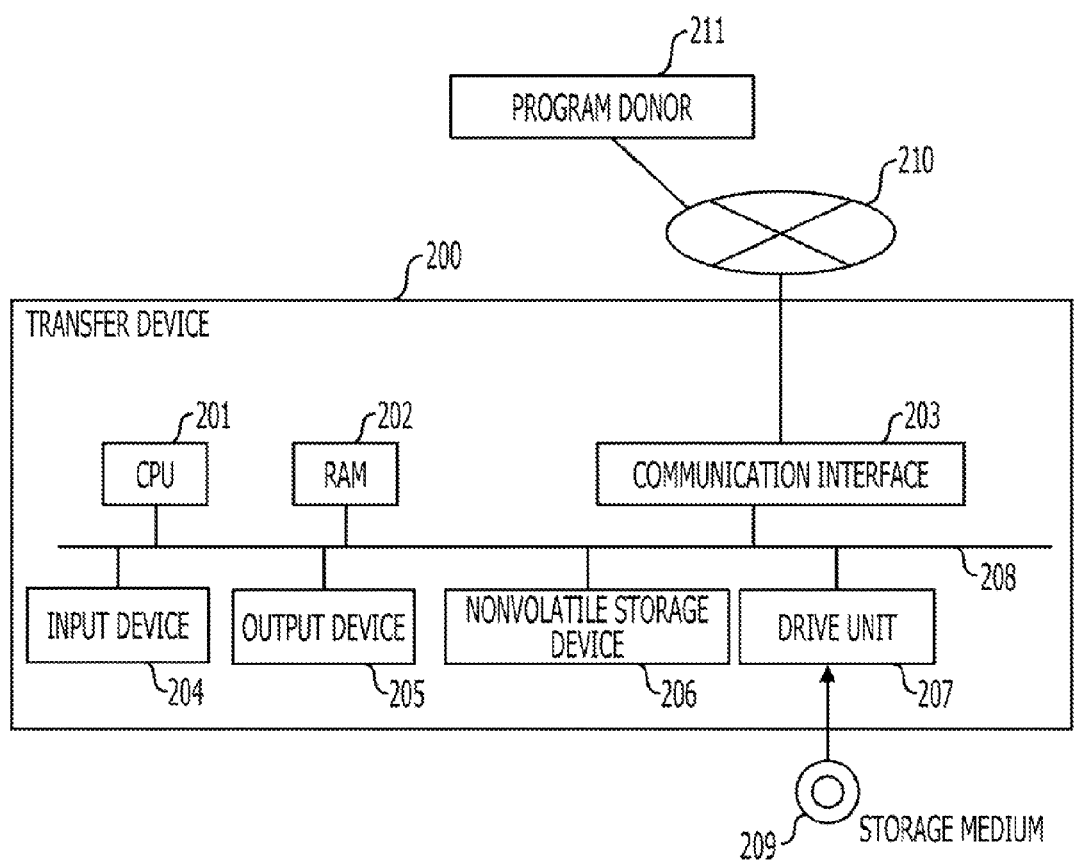
FIG. 8 illustrates a hardware configuration of a transfer device.
Figure 9:
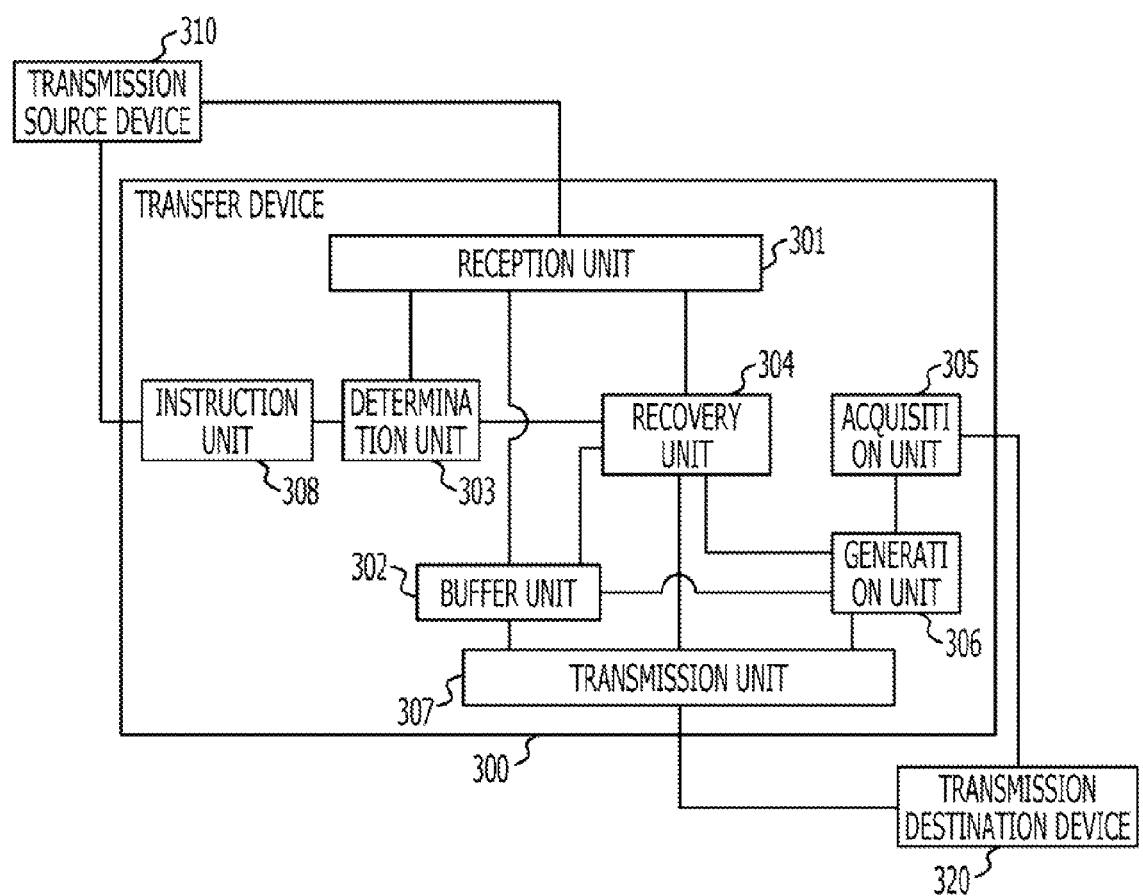
FIG. 9 illustrates a functional configuration of the transfer device.

FIG. 8 is a hardware configuration of a transfer device. A transfer device 200 in FIG. 8 is a router or a general computer that operates as each node in FIG. 3. The transfer device 200 includes a Central Processing Unit (CPU) 201 that executes programs and a Random Access Memory (RAM) 202 for a work area. In other words, a router as the transfer device 200 according to the embodiment is a type of computers that includes the CPU 201.

When the transfer device 200 is a router, the RAM 202 may store a routing table. When the transfer device 200 is a general computer that is included as a node in a distribution tree of ALM, the RAM 202 may store an address of a node that is a child node of the transfer device 200 in the distribution tree.

Moreover, the transfer device 200 includes a communication interface 203 to communicate with another device through a network 210 and a cable that is not illustrated. The communication interface 203 is a wired interface or a wireless interface, or combinations of the wired and wireless interfaces.

A network 210 may be, for example, a Local Area Network (LAN), a Wide Area Network (WAN), the Internet, or combinations of these. For example, when the transfer device 200 is the node 102 in FIG. 3, the transfer device 200 is coupled at least to the nodes, 101, 104, and 105 by the network 210 or through a cable, which is not illustrated.

The transfer device 200 may further include an input device 204 such as a keyboard or a pointing device, and an output device 205 such as a display or a speaker. Moreover, the transfer device 200 includes a nonvolatile storage device 206 such as a Read Only Memory (ROM), a Hard Disk Drive (HDD), and a flush memory.

The transfer device 200 may further include a drive unit 207 of a computer readable storage medium 209. The storage medium 209 may be, for example, an optical disk such as a Compact Disc (CD) and a Digital Versatile Disc (DVD), a magneto-optical disk, a magnetic disk, and a semiconductor memory card. The storage medium 209 is a tangible medium and not a transitory medium such as a signal carrier.

In the example of FIG. 8, the CPU 201, the RAM 202, the communication interface 203, the input device 204, the output device 205, the nonvolatile storage device 206, and the drive unit 207 are coupled each other through a bus 208. However, an embodiment is possible in which a computer with a configuration different from that in FIG. 8 may be used as the transfer device 200.

A program that is executed by the CPU 201 may be stored, for example, in the nonvolatile storage device 206. Alternatively, the program may be downloaded from a program provider 211 to the nonvolatile storage device 206 through the network 210 and the communication interface 203. The program may be stored in the storage medium 209. In this case, the storage medium 209 is set in the drive unit 207 and the program may be read from the storage medium 209 through the drive unit 207 and be copied to the nonvolatile storage device 206.

Either way, the CPU 201 may load the program to the RAM 202 and execute the loaded program.

FIG. 9 illustrates a functional configuration of a transfer device. A transfer device 300 in FIG. 9 may be achieved, for example, by the transfer device 200 that includes various hardware components illustrated in FIG. 8. Moreover, the transfer device 300 is indirectly coupled through a network or directly connected to a transmission source device 310 and a transmission destination device 320 through a transmission medium such as an optical fiber.

For example, when the transmission source device 310 and the transmission destination device 320 are routers, the transfer device 300 is coupled to the transmission source device 310 and the transmission destination device 320 through a transmission medium such as an optical fiber. Conversely, when the transmission source device 310, the transfer device 300, and the transmission destination device 320 are general computers included in the ALM distribution tree as nodes, the transfer device 300 is coupled to the transmission source device 310 and the transmission destination device 320 through a network.

According to the embodiment, the transmission source device 310 and the transmission destination device 320 also include similar hardware components as in the transfer device 200 in FIG. 8 and provide substantially the same functions as those of the transfer device 300. FIG. 9 illustrates the transfer device 300 that functions as a relay node. Cases in which the transfer device 300 functions as a root node or a leaf node will be described later.

The transfer device 300 includes a reception unit 301, a buffer unit 302, a determination unit 303, a recovery unit 304, an acquisition unit 305, a generation unit 306, a transmission unit 307, and an instruction unit 308. The reception unit 301 receives data packets and FEC packets from the transmission source device 310 and outputs the received packets to the buffer unit 302. The reception unit 301 may be achieved by the communication interface 203 and the CPU 201 in FIG. 8.

Furthermore, the reception unit 301 extracts information to detect a packet loss from the received packet and outputs the extracted information for detection (hereinafter, referred to as information for detection) to the determination unit 303. Although, a specific example of information for detection will be described later, the information for detection may be, for example, a sequence number included in a header of a packet. Moreover, the reception unit 301 notifies the recovery unit 304 of reception of the packet.

The buffer unit 302 includes a memory, which is not illustrated, to retain packets and a control unit, which is not illustrated, to manage the memory. The memory that retains the packets may be, for example, the RAM 202 in FIG. 8. The control unit is achieved, for example, by the CPU 201.

For example, the control unit in the buffer unit 302 creates a memory management table on the RAM 202 to control information that indicates a usage status of the memory and performs allocation or release of the memory by referring to the memory management table. The memory management table includes a field that indicates a starting address of a packet in the memory and may further include a field that indicates information such as a packet size and packet identification information. For example, information to identify a data packet and an FEC packet, a sequence number in data packets, and a hierarchy of an FEC packet may be used as the packet identification information.

Thus, the buffer unit 302 may recognize a place where an FEC packet in a hierarchy specified by other components (for example, the recovery unit 304 and the generation unit 306) is stored in the memory. Furthermore, the buffer unit 302 may recognize a place where a data packet of a sequential order specified by other components is stored in the memory.

For example, the buffer unit 302 may recognize a starting address of a packet specified by the recovery unit 304 as described above and may notify the recovery unit 304 of the recognized starting address. The recovery unit 304 may read data of the specified packet by the notification. For example, the recovery unit 304, the generation unit 306, and the transmission unit 307 may read packets by accessing the buffer unit 302 and may generate a new packet on the buffer unit 302.

The determination unit 303 determines whether a packet loss is caused by using information for detection that is output by the reception unit 301. The determination unit 303 notifies the recovery unit 304 and the instruction unit 308 of the determination result of whether a packet loss is caused (in other words, if any packet is lost). When a packet loss is caused, the determination unit 303 notifies the recovery unit 304 of packet identification information to identify a lost packet as a part of the determination result. The determination unit 303 may be achieved, for example, by the CPU 201.

The recovery unit 304 is achieved, for example, by the CPU 201. The recovery unit 304 determines whether processing to recover the packet is performed based on notifications from the reception unit 301 and the determination unit 303. If there is any lost packet, the recovery unit 304 recognizes a recovery target packet from the packet identification information notified by the determination unit 303.

If there is any lost packet, the recovery unit 304 performs the following processing. In other words, the recovery unit 304 reads a packet to be used for recovery from the buffer unit 302 and recovers the lost packet from the read packet and outputs the recovered packet to the buffer unit 302. The recovery of a packet by the recovery unit 304 is as described by referring to FIG. 5.

When a packet is lost, the recovery unit 304 may recognize which of other packets to be used to recover the lost packet based on packet identification information of the lost packet. For example, the recovery unit 304 may refer to a block management table 500, which will be described later together with FIG. 14, in order to recognize the packets to be used for recovery.

Moreover, the recovery unit 304 may notify information that indicates progress of recovery and reception of packets (hereinafter, referred to as "progress information") to the generation unit 306 and the transmission unit 307. In the example of FIG. 5, when the reception unit 301 receives the data packet D3 without receiving the data packet D2 after the data packet D1 is received, the determination unit 303 detects a loss of the data packet D2. However, the recovery unit 304 starts recovery processing of the data packet D2 after the FEC packet F3-1 is received. Accordingly, the recovery unit 304 may output progress information, for example, "reception up to the data packet D3 is completed, however the data packet D2 is lost and recovery of the data packet D2 is not started yet."

The acquisition unit 305 acquires information from the transmission destination device 320 that indicates up to which hierarchy of FEC packets are desired to be inserted (hereinafter referred to as "the first hierarchy information") in transmitting data packets from the transfer device 300 to the transmission destination device 320. Moreover, the acquisition unit 305 notifies the acquired first hierarchy information to the generation unit 306. The acquisition unit 305 is achieved, for example, by the CPU 201 and the communication interface 203.

For example, at one point of time, appropriate error correction capability for the transmission destination device 320 for an error rate of a communication route between the transfer device 300 and the transmission destination device 320 may be achieved typically by FEC packets up to the third layer. In this case, the transmission destination device 320 transmits the first hierarchy information that indicates the third layer to the transfer device 300. Accordingly, the acquisition unit 305 acquires the first hierarchy information that indicates the third layer.

The generation unit 306 generates FEC packets in a hierarchy deeper than the lowest layer of FEC packets that are received by the transfer device 300 from the transmission source device 310. The generation unit 306 outputs the generated FEC packets to the buffer unit 302 and notifies the transmission unit 307 of the generation of the FEC packets. The generation unit 306 is achieved, for example, by the CPU 201.

For example, the generation unit 306 determines whether processing to deepen a hierarchy as in FIG. 7 is performed based on the first hierarchy information that is output from the acquisition unit 305. Moreover, the generation unit 306 may determine timing to generate FEC packets in a deeper hierarchy based on progress information that is output from the recovery unit 304 when the generation unit 306 performs processing to deepen the hierarchy.

For example, if all of the following (H-1) to (H-3) are satisfied, the generation unit 306 may generate the FEC packet F4-1 without waiting for receiving the data packets D3 to D5 as long as after presenting progress information (H-1) that is output from the recovery unit 304.

(H-1) The data packets D0 to D2 are received without being lost as in FIG. 7.

(H-2) The first hierarchy information that is notified from the acquisition unit 305 indicates the fourth layer.

(H-3) FEC packets up to the third layer are transmitted from the transmission source device 310 to the transfer device 300 and no FEC packet in the fourth layer is transmitted.

Furthermore, if the above (H-2) to (H-3) and the following (H-4) are satisfied, the generation unit 306 may generate the FEC packet F4-1 typically after the progress information that is output by the recovery unit 304 indicates that "recovery of the data packet D2 is completed."

(H-4) As illustrated in FIG. 5, the data packet D2 is lost, although the data packets D0 and D1 are received.

Moreover, conversely to the above-described (H-2) to (H-3), for example, if the following (H-5) and (H-6) are satisfied, the generation unit 306 determines that "there is no need to newly generate an FEC packet."

(H-5) The first hierarchy information notified by the acquisition unit 305 indicates the third layer.

(H-6) A substantially maximum depth of an FEC packet transmitted from the transmission source device 310 to the transfer device 300 is the third layer or deeper.

The transmission unit 307 reads a packet from the buffer unit 302 and transmits the read packet to the transmission destination device 320. The transmission unit 307 may recognize a packet to be transmitted to the transmission destination device 320 is already retained or not retained in the buffer 302 by notifications from the recovery unit 304 and the generation unit 306.

The transmission unit 307 requests the buffer unit 302 to delete the transmitted packet from the memory. The buffer unit 302 releases the memory area that stores the transmitted packet according to the request. The transmission unit 307 is achieved, for example, by the CPU 201 and the communication interface 203.

Moreover, the instruction unit 308 calculates an error rate based on the number of received packets and the lost packets. The instruction unit 308 calculates information that indicates up to which hierarchy of FEC packets are desired to be inserted (hereinafter referred to as "second hierarchy information") in transmitting data packets from the transmission source device 310 to the transfer device 300. The instruction unit 308 transmits the second hierarchy information to the transmission source device 310.

Although, a specific calculation method will be described later, the second hierarchy information is calculated from an error rate before correcting the error and certain correction performance. The correction performance may be represented, for example, by an error rate permissible after applying the error correction. The instruction unit 308 is achieved, for example, by the CPU 201 and the communication interface 203.

The above description exemplifies a case in which information that indicates the hierarchy is transmitted between devices as the first hierarchy information and the second hierarchy information. For example, the first hierarchy information and the second hierarchy information may represent "the third layer" by a numerical value "3."

When information that indicates a hierarchy itself is transmitted between devices as the first hierarchy information and the second hierarchy information, the acquisition unit 305 may simply acquire the first hierarchy information from the transmission destination device 320. Meanwhile, the instruction unit 308 performs processing to calculate the second hierarchy information from an error rate (in other words, a packet loss rate).

Information that indicates other than hierarchy itself may be transmitted between devices according to an embodiment (in other words, information may be transmitted from the transmission destination device 320 to the acquisition unit 305, or from the instruction unit 308 to the transmission source device 310). For example, a positive numerical value, "2" indicating a request to make the lowest layer deeper for two layers may be transmitted between devices. Likewise, a negative numerical value, "−1" indicating a request to make the lowest layer shallower for one layer may be transmitted between devices.

As described above, when a difference from the current lowest layer is transmitted between devices, the acquisition unit 305 obtains the first hierarchy information that indicates a depth of a new lowest layer of the transmission destination device 320 by adding a difference value obtained from the transmission destination device 320 to depth of the current lowest layer of the transmission destination device 320. Moreover, the instruction unit 308 calculates a difference value to be transmitted to the transmission source device 310 by calculating an appropriate hierarchy depth from an error rate between the transmission source device 310 and transfer device 300, and subtracting the current lowest layer for the transfer device 300 from the calculated depth.

Alternatively, information that indicates an error rate may be transmitted between devices. For example, a numerical value, "0.02" that indicates "an error rate of a link between the transfer device 300 and the transmission destination device 320 is 2%" may be transmitted from the transmission destination device 320 to the acquisition unit 305.

When information that indicates an error rate is transmitted between devices, contrary to the above example, the acquisition unit 305 calculates the depth of the lowest layer appropriate for the error rate based on the error rate obtained from the transmission destination device 320 as the first hierarchy information. The acquisition unit 305 notifies the calculated first hierarchy information to the generation unit 306. Moreover, the instruction unit 308 may simply notify a recognized error rate of the link between the transmission source device 310 and the transfer device 300 to the transmission source device 310.

As described above, the transfer device 300 may not only operate as a relay node but also operate as a root node or a leaf node. The transfer device 300 that operates as a root node may not include the reception unit 301, the determination unit 303, the recovery unit 304, and the instruction unit 308. Instead, the transfer device 300 that operates as a root node includes a data packet supply unit, which is not illustrated, to generate a data packet and outputs the data packet to the buffer unit 302.

When the transfer device 300 is a router, the data packet supply unit receives a data packet from a computer in a network (for example, a LAN) that is managed by the router itself and supplies (in other words, output) the received data packet to the buffer unit 302. In this case, the data packet supply unit may be achieved, for example, by the communication interface 203 and the CPU 201.

When the transfer device 300 is a general computer included in an ALM distribution tree as a node, the data packet supply unit generates a data packet and supplies (in other words, output) the generated data packet to the buffer unit 302. In this case, the data packet supply unit may be achieved, for example, by the CPU 201, or a combination of the CPU 201 and the input device 204. For example, the input device 204 may include a camera or a microphone and the CPU 201 may generate a data packet by using data that is input from the input device 204.

When the transfer device 300 operates as a root node, the generation unit 306 generates FEC packets for all hierarchies up to the lowest layer that is indicated by the first hierarchy information that is output from the acquisition unit 305 by using data packets retained by the buffer unit 302.

The transfer device 300 that operates as a leaf node may not include the acquisition unit 305, the generation unit 306, and the transmission unit 307. Moreover, the transfer device 300 that operates as a leaf node further includes an upper layer processing unit, which is not illustrated, that performs processing of an upper layer relating to data packets that are received or recovered and stored in the buffer unit 302. The upper layer processing unit may be achieved, for example, by the CPU 201 or a combination of the CPU 201 and the output device 205. For example, when a payload of a data packet is moving image data, the CPU 201 may control the output device 205 that includes a display and a speaker to cause the output device 205 output the moving image. The transfer device 300 that operates as a relay node may also include the upper layer processing unit.

Hardware components to achieve the transfer device 300 in FIG. 9 are not limited to those illustrated in FIG. 8. For example, some of, or all of the determination unit 303, the recovery unit 304, and the generation unit 306 may be achieved by using a hardware circuit instead of the CPU 201 that executes a program. For example, a configurable circuit such as a Field Programmable Gate Array (FPGA) and an Application Specific Integrated Circuit (ASIC) may be used as the hardware circuit.

The FEC packet according to the embodiment is defined by exclusive-OR that is relatively simple calculation. Thus, processing to generate an FEC packet and processing to recover a data packet using an FEC packet are suitable for a hardware circuit. Accordingly, in order to achieve faster processing, the recovery unit 304 and the generation unit 306 may be achieved by a hardware circuit instead of the CPU 201.

Figure 10:
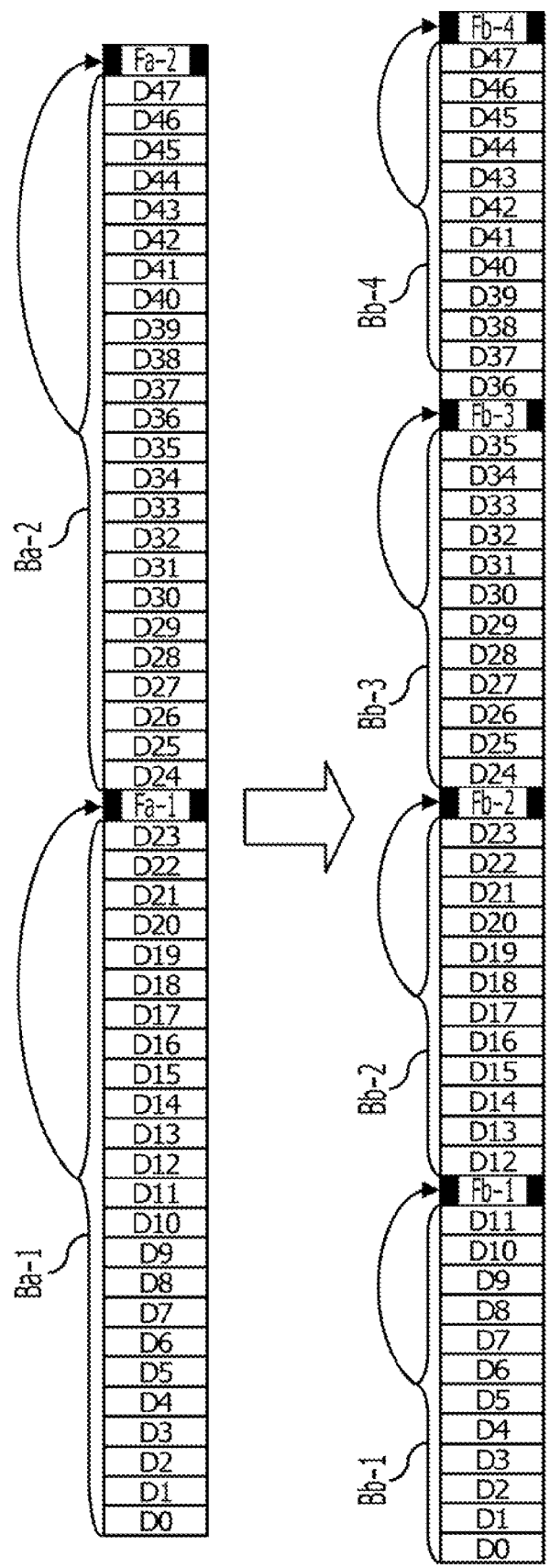
FIG. 10 illustrates a comparison example of using non-hierarchical FEC packets.
Figure 11:
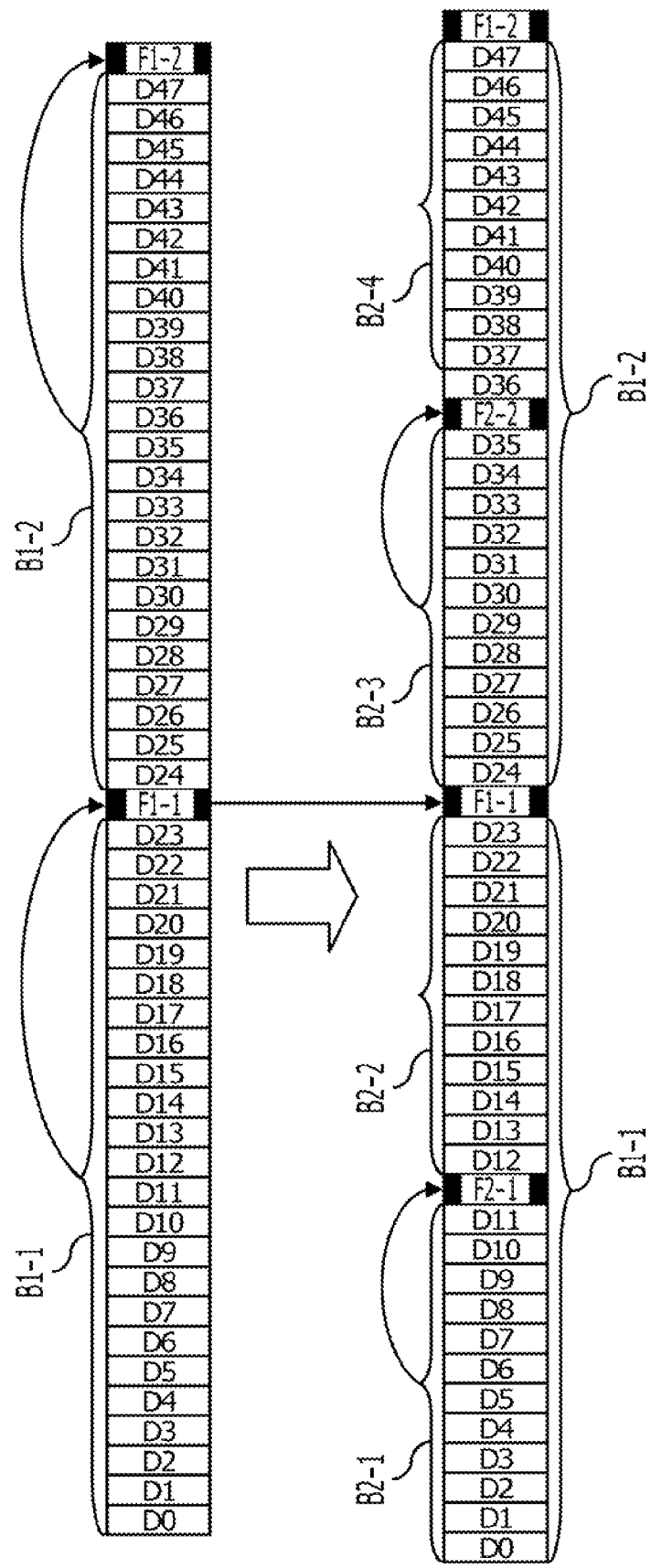
FIG. 11 illustrates increase in a processing amount is small even when a hierarchy is made deeper.
Figure 12:
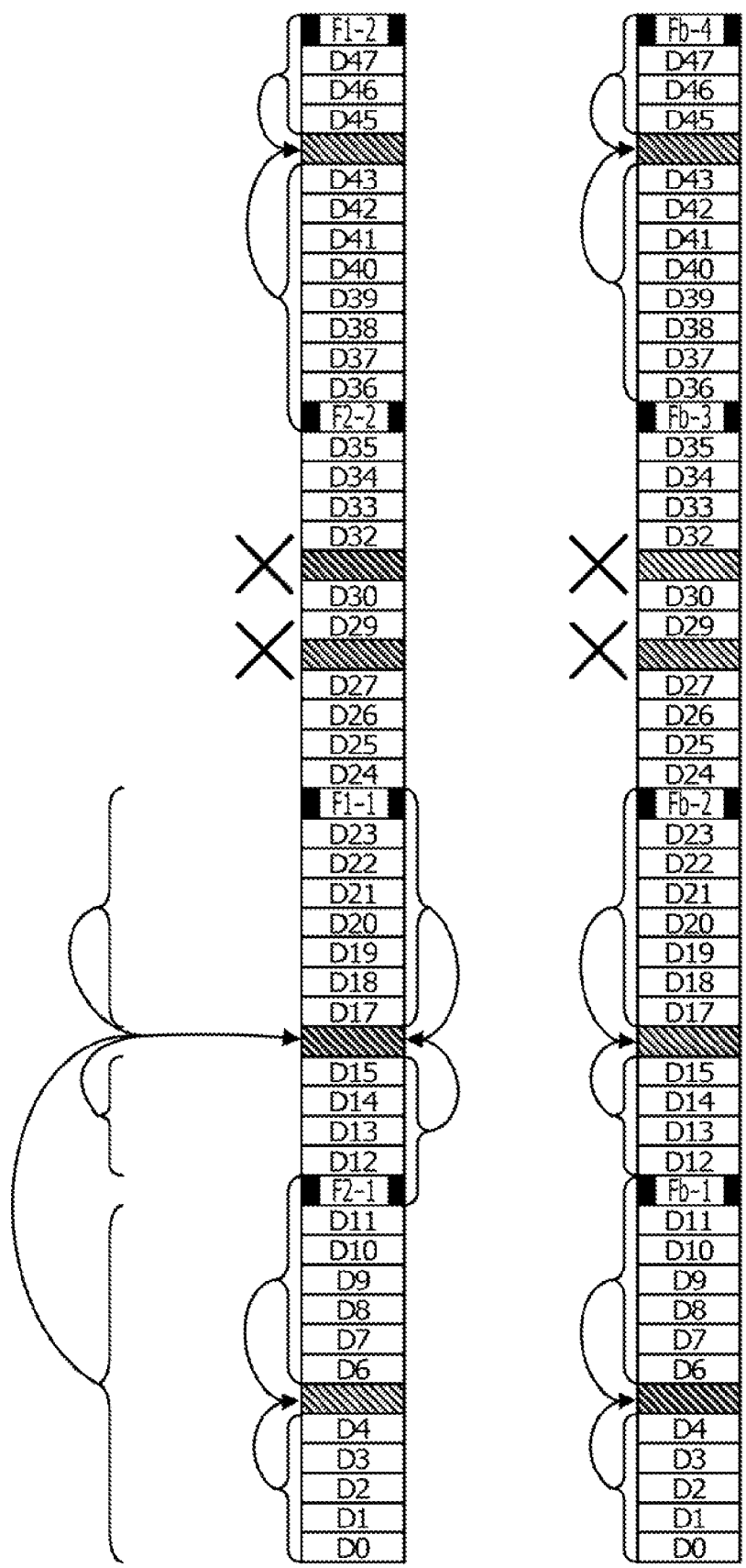
FIG. 12 illustrates that error correction capabilities of the embodiment and the comparison example are substantially the same.

The embodiment and the comparison example will be compared by referring to FIGS. 10 to 12 in order to facilitate understanding of advantages of the embodiment.

FIG. 10 illustrates a comparison example that uses FEC packets that are not hierarchically arranged. In other words, in the comparison example of FIG. 10, one FEC packet that is not hierarchically arranged is inserted for a certain number of data packets. When FEC packets are not hierarchically arranged, the "certain number" needs to be changed in order to change a ratio to insert FEC packets according to an error rate.

In the above-described examples of FIGS. 1, 2, and 4 to 7 according to the embodiment, a block size of the first layer is 24 and that of the second layer is 12. In FIG. 10, a case in which the "certain number" is changed from 24 to 12 in the comparison example is illustrated.

For example, the following (I-1) to (I-3) are assumed for convenience of describing a difference between the comparison example in FIG. 10 and the embodiment.

(I-1) Each node of the network 100 in FIG. 3 operates according to a comparison example.

(I-2) FEC packets are inserted for a series of packets that are transmitted from the node 103 to the node 106 with a ratio that one FEC packet for 24 data packets.

(I-3) FEC packets are inserted for a series of packets that are transmitted from the node 106 to the node 110 with a ratio that one FEC packet for 12 data packets.

The assumptions (I-1) to (I-3) indicate that the node 106 performs processing to change a ratio to insert FEC packets that are not hierarchically arranged to data packets from 1/24 to 1/12. An example in which the data packets D0 to D47 are transmitted from the node 103 to the node 106 under the assumptions (I-1) to (I-3) will be described more detail. In the comparison example of FIG. 10, the following processing is performed.

When data packets are transmitted from the node 103 to the node 106, the data packets D0 to D23 are transmitted that belong to a non-hierarchical block Ba-1 with a block size 24, and an FEC packet Fa-1 generated from the data packets D0 to D23 is subsequently transmitted. The data packets D24 to D27 that belong to a non-hierarchical block Ba-2 with a block size 24 are transmitted, and an FEC packet Fa-2 generated from the data packets D24 to D47 is subsequently transmitted. The FEC packets Fa-1 and the Fa-2 are represented by the expressions (10.1) and (10.2) respectively.

$$[Fa\text{-}1] = [D0]\hat{\ }[D1]\hat{\ }[D2]\hat{\ }[D3]\hat{\ }[D4]\hat{\ }[D5]\hat{\ }[D6]\hat{\ }[D7]\hat{\ }$$
$$[D8]\hat{\ }[D9]\hat{\ }[D10]\hat{\ }[D11]\hat{\ }[D12]\hat{\ }[D13]\hat{\ }[D14]\hat{\ }$$
$$[D15]\hat{\ }[D16]\hat{\ }[D17]\hat{\ }[D18]\hat{\ }[D19]\hat{\ }[D20]\hat{\ }[D21]\hat{\ }$$
$$[D22]\hat{\ }[D23] \quad (10.1)$$

$$[Fa\text{-}2] = [D24]\hat{\ }[D25]\hat{\ }[D26]\hat{\ }[D27]\hat{\ }[D28]\hat{\ }[D29]\hat{\ }$$
$$[D30]\hat{\ }[D31]\hat{\ }[D32]\hat{\ }[D33]\hat{\ }[D34]\hat{\ }[D35]\hat{\ }[D36]\hat{\ }$$
$$[D37]\hat{\ }[D38]\hat{\ }[D39]\hat{\ }[D40]\hat{\ }[D41]\hat{\ }[D42]\hat{\ }[D43]\hat{\ }$$
$$[D44]\hat{\ }[D45]\hat{\ }[D46]\hat{\ }[D47] \quad (10.2)$$

Here, [F1-1]=[Fa-1] by the expressions (1.6) and (10.1). Moreover, [F1-2]=[Fa-2] by the expressions (2.4) and (10.2).

Furthermore, when data packets are transmitted from the node 106 to the node 110, data packets D0 to D11 that belong to a non-hierarchical block Bb-1 with a block size 12 are transmitted, and an FEC packet Fb-1 generated from the data packets D0 to D11 is subsequently transmitted. Data packets D12 to D23 that belong to a non-hierarchical block Bb-2 with a block size 12 are transmitted, and an FEC packet Fb-2 generated from the data packets D12 to D23 is subsequently transmitted.

Moreover, data packets D24 to D35 that belong to a non-hierarchical block Bb-3 with a block size 12 are transmitted, and an FEC packet Fb-3 generated from the data packets D24 to D35 is subsequently transmitted. Data packets D36 to D47 that belong to a non-hierarchical block Bb-4 with a block size 12 are transmitted, and an FEC packet Fb-4 generated from the data packets D36 to D47 is subsequently transmitted.

The FEC packets Fb-1 to Fb-4 are represented by the following expressions (10.3) to (10.6) respectively.

$$[Fb\text{-}1] = [D0]\hat{\ }[D1]\hat{\ }[D2]\hat{\ }[D3]\hat{\ }[D4]\hat{\ }[D5]\hat{\ }[D6]\hat{\ }[D7]\hat{\ }$$
$$[D8]\hat{\ }[D9]\hat{\ }[D10]\hat{\ }[D11] \quad (10.3)$$

$$[Fb\text{-}2] = [D12]\hat{\ }[D13]\hat{\ }[D14]\hat{\ }[D15]\hat{\ }[D16]\hat{\ }[D17]\hat{\ }$$
$$[D18]\hat{\ }[D19]\hat{\ }[D20]\hat{\ }[D21]\hat{\ }[D22]\hat{\ }[D23] \quad (10.4)$$

$$[Fb\text{-}3] = [D24]\hat{\ }[D25]\hat{\ }[D26]\hat{\ }[D27]\hat{\ }[D28]\hat{\ }[D29]\hat{\ }$$
$$[D30]\hat{\ }[D31]\hat{\ }[D32]\hat{\ }[D33]\hat{\ }[D34]\hat{\ }[D35] \quad (10.5)$$

$$[Fb\text{-}4] = [D36]\hat{\ }[D37]\hat{\ }[D38]\hat{\ }[D39]\hat{\ }[D40]\hat{\ }[D41]\hat{\ }$$
$$[D42]\hat{\ }[D43]\hat{\ }[D44]\hat{\ }[D45]\hat{\ }[D46]\hat{\ }[D47] \quad (10.6)$$

Here, [F2-1]=[Fb-1] by the expressions (1.7) and (10.3). However, [F1-1]≉[Fb-2] when the FEC packet F1-1 according to the embodiment and the FEC packet Fb-2 in the comparison example both of which are inserted immediately after the data packet D23 are compared.

In other words, under the assumptions (I-1) to (I-3), the node 106 not only newly generates the FEC packet Fb-1 but also the FEC packet Fb-2. In other words, the node 106 in the comparison example newly generates the FEC packet Fb-2 and transmits the generated FEC packet Fb-2 instead of transferring the FEC packet Fa-1 received from the node 103 as it is.

Likewise, [F2-2]=[Fb-3] by the expressions (2.2) and (10.5). However, [F1-2]≠[Fb-4] according to the expressions (2.4) and (10.6) when the FEC packet F1-2 according to the embodiment and the FEC packet Fb-4 of the comparison example both of which are inserted immediately after the data packet D47 are compared.

In other words, under the assumptions (I-1) to (I-3), the node 106 not only newly generates the FEC packet Fb-2 but also the FEC packet Fb-4. That is the node 106 in the comparison example newly generates the FEC packet Fb-4 and transmits the generated FEC packet Fb-4 instead of transferring the FEC packet Fa-2 received from the node 103 as it is.

Thus, processing load caused at a relay node in order to increase a ratio to insert FEC packets in the comparison example is higher than that of the embodiment.

Moreover, processing load caused at a relay node in order to decrease a ratio to insert FEC packets in the comparison example is higher than that of the embodiment. The reason for this will be described below for a case in which a ratio to insert FEC packets is reduced, for example, from 1/12 to 1/24.

Here, [Fa-1]≠[Fb-2] by the expressions (10.1) and (10.4), while [Fa-2]≠[Fb-4] by the expressions (10.2) and (10.6). Thus, in order to reduce a ratio to insert FEC packets from 1/12 to 1/24, a relay node in the comparison example may not use the received FEC packets, Fb-2 and Fb-4, and needs to newly generate FEC packets Fa-1 and Fa-2. Processing load to generate FEC packets is higher compared with when the FEC packets Fb-1 and Fb-3 among the received FEC packets are not simply transferred.

As described above, the embodiment is more advantageous than the comparison example in terms of processing load. The advantage according to the embodiment is especially significant when a relay node transfers data packets to numerous child nodes.

This is because error rates of respective links among a plurality of child nodes generally differ depending on links. If a relay node in the comparison example tries to generate FEC packets with a ratio tailored to different error rates, processing load increases significantly as the number of child nodes increases. This is because, for example, processing that "using FEC packet Fa-1 commonly for all child nodes" is not possible. In contrast, the relay node according to the embodiment may use an FEC packet in an upper layer (for example, the first layer) commonly to all child nodes. Accordingly, increase in the number of FEC packets generated by the relay node according to the embodiment is smaller compared with that in the comparison example.

FIG. 11 illustrates how an increase in processing load is small even when hierarchy is deepened. As described by referring to FIG. 7, according to the embodiment, the relay node may generate typically FEC packets from the (N+1) th layer to the (N+ΔN) layer in order to change substantially the deepest layer from the N th layer to the (N+ΔN) layer.

For example, when N=1 and ΔN=1, as illustrated in FIG. 11, the relay node according to the embodiment may transfer the received FEC packets, F1-1 and F1-2 of the first layer as they are. The relay node may newly generate FEC packets, F2-1 and F2-2 in the second layer.

Accordingly, when FIG. 10 and FIG. 11 are compared, if a ratio to insert FEC packets is increased from 1/24 to 1/12, the number of FEC packets that is newly generated by the relay node for 48 data packets is four in the comparison example, while that is two according to the embodiment. In other words, processing load to newly generate FEC packets according to the embodiment is a half of that of the comparison example.

As described above, the embodiment is advantageous in that processing load is smaller than that of the comparison example. However, the advantage is not traded-off with error correction capability. In other words, the embodiment may reduce processing load without reducing error correction capability compared with the comparison example.

FIG. 12 illustrates that there is no difference between correction capability of the embodiment and that of the comparison example. For example, FIG. 12 illustrates an example in which one FEC packet is inserted for 12 data packets. Furthermore, the upper part of FIG. 12 illustrates that the embodiment in which the lowest layer is the second layer while the lower part of FIG. 12 illustrates the comparison example. FIG. 12 illustrates error corrections by the embodiment and that by the comparison example under assumptions that the data packets D5, D16, D28, D31, and D44 are lost.

The relay node or the leaf node according to the embodiment (for example, the transfer device 300 in FIG. 9) may recover the data packet D5 by the expression (12.1) if the data packet D5 is lost.

$$[D5]=[D0]^\wedge[D1]^\wedge[D2]^\wedge[D3]^\wedge[D4]^\wedge[D6]^\wedge[D7]^\wedge[D8]^\wedge \\ [D9]^\wedge[D10]^\wedge[D11]^\wedge[F2-1] \quad (12.1)$$

The relay node or the leaf node of the comparison example may recover the data packet D5 by the expression (12.2) if the data packet D5 is lost.

$$[D5]=[D0]^\wedge[D1]^\wedge[D2]^\wedge[D3]^\wedge[D4]^\wedge[D6]^\wedge[D7]^\wedge[D8]^\wedge \\ [D9]^\wedge[D10]^\wedge[D11]^\wedge[Fa-1] \quad (12.2)$$

The relay node or the leaf node according to the embodiment may recover the data packet D16 by the expression (12.3) by using the recovered data packet D5 if the data packet D16 is lost. Moreover, the relay node or the leaf node according to the embodiment may recover the data packet D16 by the expression (12.4) without using the data packet D5. Recovering a data packet is possible by the two methods is as described by referring to FIG. 5.

$$[D16]=[D0]^\wedge[D1]^\wedge[D2]^\wedge[D3]^\wedge[D4]^\wedge[D5]^\wedge[D6]^\wedge[D7]^\wedge \\ [D8]^\wedge[D9]^\wedge[D10]^\wedge[D11]^\wedge[D12]^\wedge[D13]^\wedge[D14]^\wedge \\ [D15]^\wedge[D17]^\wedge[D18]^\wedge[D19]^\wedge[D20]^\wedge[D21]^\wedge[D22]^\wedge \\ [D23]^\wedge[F1-1] \quad (12.3)$$

$$[D16]=[F2-1]^\wedge[D12]^\wedge[D13]^\wedge[D14]^\wedge[D15]^\wedge[D17]^\wedge \\ [D18]^\wedge[D19]^\wedge[D20]^\wedge[D21]^\wedge[D22]^\wedge[D23]^\wedge[F1-1] \quad (12.4)$$

Moreover, the relay node or the leaf node according to the comparison example may recover the data packet D16 by the expression (12.5).

$$[D16]=[D12]^\wedge[D13]^\wedge[D14]^\wedge[D15]^\wedge[D17]^\wedge[D18]^\wedge \\ [D19]^\wedge[D20]^\wedge[D21]^\wedge[D22]^\wedge[D23]^\wedge[Fb-2] \quad (12.5)$$

As described above, when one data packet in a block with a size of 12 (in other words, the block in the second layer according to the embodiment and a non-hierarchical block in the comparison example) is lost, both the embodiment and the comparison example may recover the lost data packet.

Meanwhile, when two or more data packets in a block with a size of 12 are lost, both the embodiment and the comparison example may not recover the lost data packets (in the example of FIG. 12, the data packets, D28 and D31). In other words, when a plurality of data packets is lost within a range covered by one FEC packet, the data packets may not be recovered. This is because an FEC packet is generated by exclusive-OR in both the embodiment and the comparison example.

Moreover, when the data packet D44 is lost in a block that is positioned later than the block that includes the irrecoverable data packets D28 and D31 as described above, there is no difference of error correction capability between the embodiment and the comparison example. This is because the relay node and the leaf node according to the embodiment may recover the data packet D44 by the expression (12.6) and the relay node and the leaf node according to the comparison example may recover the data packet D44 by the expression (12.7).

$$[D44]=[F2\text{-}2]\hat{\ }[D36]\hat{\ }[D37]\hat{\ }[D38]\hat{\ }[D39]\hat{\ }[D40]\hat{\ } \\ [D41]\hat{\ }[D42]\hat{\ }[D43]\hat{\ }[D45]\hat{\ }[D46]\hat{\ }[D47]\hat{\ }[F1\text{-}2] \quad (12.6)$$

$$[D44]=[D36]\hat{\ }[D37]\hat{\ }[D38]\hat{\ }[D39]\hat{\ }[D40]\hat{\ }[D41]\hat{\ } \\ [D42]\hat{\ }[D43]\hat{\ }[D45]\hat{\ }[D46]\hat{\ }[D47]\hat{\ }[Fb\text{-}4] \quad (12.7)$$

As described above, the embodiment may reduce processing load more than the comparison example without deteriorating error correction capability.

The embodiment will be described in detail by exemplifying a case in which the embodiment is used for an Application Layer Multicast (ALM). For convenience of description, a data distribution tree in ALM is assumed to be configured as a network 100 in FIG. 3.

FIG. 13 illustrates an example of a distribution target management table stored in the transfer device 300. FIG. 9 illustrates typically one transfer device 300, however, the transfer device 300 may transmit data packets to a plurality of the transmission destination devices 320. For example, when the transfer device 300 is the node 104 in FIG. 3, two nodes 107 and 108 are the transmission destination devices 320 respectively.

The transfer device 300 manages a distribution destination management table 400 as in FIG. 13 in order to manage one or a plurality of the transmission destination devices 320. The distribution destination management table 400 may be stored, for example, on the RAM 202. Moreover, the distribution destination management table 400 may be accessed by each of the components in the transfer device 300 in FIG. 9.

When the transfer device 300 transmits data packets to the number of Z (Z≥1) transmission destination devices 320, the distribution destination management table 400 includes the number of Z entries. Furthermore, in the example of FIG. 13, each entry includes fields of (J-1) to (J-5) described below.

(J-1) Identification number to identify an entry (referred to as "No." in FIG. 13)

(J-2) Internet Protocol (IP) address of the transmission destination device 320

(J-3) Hierarchy indicated by the first hierarchy information acquired by the acquisition unit 305

(J-4) A block size of the hierarchy of (J-3)

(J-5) An error rate between the transfer device 300 and the transmission destination device 320 that is notified by the transmission destination device 320.

In the example of FIG. 13, the first entry identified by the identification number "1" is an entry for a transmission destination device 320 identified by the IP address "195.173.1.200." An error rate that the transmission destination device 320 for the first entry notifies to the transfer device 300 is "0.02" (in other words, 2%). The first entry indicates that "FEC packets for a block with a size of 24 in the first layer are sufficient to supply sufficient error correction capability for an error rate 2%."

Each of the transmission destination devices 320 may be identified by an IP address of (J-2), thus the identification number field of (J-1) may be omitted. Moreover, according to the embodiment, the block size of each hierarchy is defined as a constant common to all nodes in the network (for example, the nodes 101 to 111 in FIG. 3) and the block size field of (J-3) may be omitted as well. In FIG. 13, in order to facilitate understanding of the embodiment, a value corresponding to a value indicated in the hierarchy field of (J-3) is indicated in the block size field of (J-4).

The error rate field of (J-5) may be omitted as well. For example, when information that the acquisition unit 305 receives from the transmission destination device 320 is a value indicating a hierarchy itself, the acquisition unit 305 may typically overwrite the hierarchy field of the (J-3) in an entry corresponding to the transmission destination device 320 with a valued received from the transmission destination device 320. Accordingly, an error rate field in (J-5) may be omitted.

Moreover, when information that the acquisition unit 305 receives from the transmission destination device 320 is a value indicating a difference from a depth of the current lowest layer, the acquisition unit 305 adds the difference value received from the transmission destination device 320 to the current value of the hierarchy field of (J-3) in an entry corresponding to the transmission destination device 320. The acquisition unit 305 overwrites the addition result to the hierarchy field of (J-3). Accordingly, the error rate field of (J-5) may be omitted as well when the difference value is transmitted from the transmission destination device 320.

When information that the acquisition unit 305 receives from the transmission destination device 320 indicates an error rate, the acquisition unit 305 calculates a depth of hierarchy appropriate for the error rate based on the information received from the transmission destination device 320. The calculated value is overwritten to the layer field of (J-3) in an entry corresponding to the transmission destination device 320. Thus, when information that indicates an error rate is transmitted from the transmission destination device 320, the error rate field of (J-5) is not necessarily needed.

However, as illustrated in FIG. 13, the distribution destination management table 400 may include the error rate field of (J-5). In this case, the acquisition unit 305 overwrites the error rate field of (J-5) with a value of an error rate notified by the transmission destination device 320.

A notification from the transmission destination device 320 to the acquisition unit 305 and that from the instruction unit 308 to the transmission source device 310 may be transmitted in a form of an IP packet. Accordingly, when the acquisition unit 305 receives a notification from one of the plurality of transmission destination devices 320, the acquisition unit 305 may identify an entry in the distribution destination management table 400 corresponding to the transmission destination device 320 that transmits the notification based on a transmission source IP address of the notification. In other words, the acquisition unit 305 may recognize which of entries in the distribution destination management table 400 may be updated based on a transmission source IP address in the IP packet.

According to the embodiment, a port number (for example, a port number of User Datagram Protocol (UDP)) used in the ALM is defined. However, depending on embodiments, port numbers may be different for each node. In this case, the distribution destination management table 400 further includes a field for the port number. The distribution destination management table 400 may be initialized, for example, as below from a state with no entry.

Although, there are various types of ALM, typically communication that causes a parent node to recognize a child node is performed between the child node and the parent node during a building phase of a distribution tree prior to data packet distribution. Similar communication is performed during a dynamic re-building phase of distribution tree during data packet distribution.

In other words, in phases of building or re-building a distribution tree, the transfer device 300 requests the transmission source device 310 to register the transfer device 300 as a child node of the transmission source device 310. Likewise, the transmission destination device 320 requests the transfer device 300 to register the transmission destination device 320 as a child node of the transfer device 300.

For example, the acquisition unit 305 may receive the above request from the transmission destination device 320. The acquisition unit 305 adds a new entry to the distribution destination management table 400, assigns a new identification number to the new entry, and sets an IP address of the transmission destination device 320 in an IP address field of the new entry. Moreover, the acquisition unit 305 sets appropriate default values in the hierarchy field and the block size field respectively. For example, when a default hierarchy is the second layer, the default value of the block size is 12 that corresponds to the second layer. The acquisition unit 305 may not set a value in the error rate field.

As described above, an entry is created in the distribution destination management table 400 triggered by a request from a new transmission destination device 320 in a building or a rebuilding phases of a distribution tree. Values of respective fields of hierarchy, block size, and error rate of the created entry are dynamically and appropriately rewritten according to a state of a link once actual data packet distribution starts.

FIG. 14 illustrates an example of a block management table stored in the transfer device 300. The transfer device 300 in FIG. 9 recognizes a hierarchy structure of blocks and FEC packets by referring to a block management table 500 as illustrated in FIG. 14. The block management table 500 may be stored, for example, on the RAM 202. The block management table 500 may be accessed from respective components in the transfer device 300.

Each entry in the block management table 500 includes three fields that are "hierarchy," "start number of block," and "end number of block." Each entry corresponds to one block. More precisely, an entry that indicates a block for which an FEC packet is generated is included in the block management table 500 and no block is present in the block management table 500 for which an FEC packet is not defined (for example, the block B2-2). In FIG. 14, eight entries are sorted by the ascending order of end numbers of blocks.

A block size of the first layer may be defined depending on an embodiment, however, according to the embodiment, the block size is 24. Furthermore, according to the embodiment, each block includes two blocks of the hierarchy immediately below and the block sizes of the two blocks are substantially equal. Thus, according to the embodiment, a block size of the second layer is 12 (=24/2), while that of the third layer is 6 (=12/2), and that of the fourth layer is 3 (=6/2).

According to the embodiment, it is assumed that "hierarchy as deep as the fifth layer or more is not used." Thus, a substantially maximum value of a hierarchy in eight entries of the block management table 500 is 4. If there is any data packet that may not be recovered by FEC packets up to the fourth layer, the transfer device 300 may request the transmission source device 310 to retransmit the data packet.

Even if it is assumed that "hierarchy as deep as the fifth layer or more is not used" as described above, retransmission is rarely requested as long as a block size of the first layer is appropriately defined based on a practical error rate. Accordingly, the above-described assumption does not substantially limit error correction capability.

Hereinafter, an order of data packets in a block of the first layer is assigned sequentially from 0. As may be seen, for example, from a hierarchical structure of blocks illustrated in FIG. 7, the block management table 500 includes the entries (K-1) to (K-8) described below.

(K-1) An entry that indicates a block in the fourth layer to which the 0 th to the second data packets belong (corresponds to a block B4-1 for which an FEC packet F4-1 is generated in the example of FIG. 7).

(K-2) An entry that indicates a block in the third layer to which the 0 th to the fifth data packets belong (corresponds to a block B3-1 for which an FEC packet F3-1 is generated in the example of FIG. 7).

(K-3) An entry that indicates a block in the fourth layer to which the sixth to the eighth data packets belong (corresponds to a block B4-3 for which an FEC packet F4-2 is generated in the example of FIG. 7).

(K-4) An entry that indicates a block in the second layer to which the 0 th to the 11th data packets belong (corresponds to a block B2-1 for which an FEC packet F2-1 is generated in the example of FIG. 7).

(K-5) An entry that indicates a block in the fourth layer to which the 12th to the 14th data packets belong (corresponds to a block B4-5 for which an FEC packet F4-3 is generated in the example of FIG. 7).

(K-6) An entry that indicates a block in the third layer to which the 12th to the 17th data packets belong (corresponds to a block B3-3 for which an FEC packet F3-2 is generated in the example of FIG. 7).

(K-7) An entry that indicates a block in the fourth layer to which the 18th to the 20th data packets belong (corresponds to a block B4-7 for which an FEC packet F4-4 is generated in the example of FIG. 7).

(K-8) An entry that indicates a block in the first layer to which 0 th to the 23 th data packets belong (corresponds to a block B1-1 for which an FEC packet F1-1 is generated in the example of FIG. 7).

A content of the block management table 500 is statically defined based on a block size of the first layer and the above-described assumption, for example, that "a hierarchy deeper than the fifth layer or more is not used." Accordingly, the block management table 500 may be generated, for example, by the CPU 201 and stored in the RAM 202.

Figure 15:
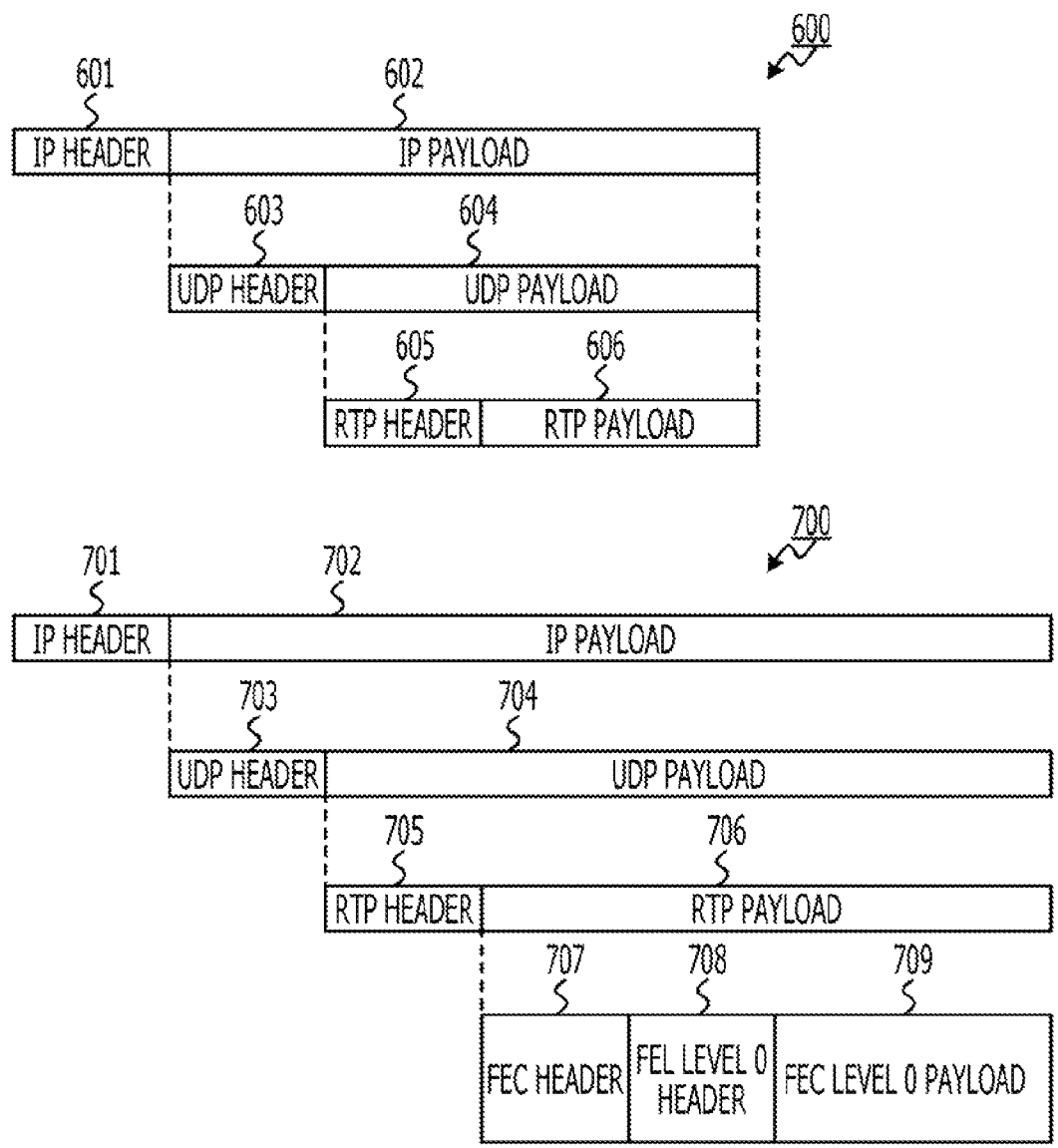
FIG. 15 illustrates packet formats.

FIG. 15 illustrates packet formats. Specific examples of data packets and FEC packets illustrated in FIGS. 1, 2, 4 to 7, and 11 to 12 are, for example, a data packet 600 and an FEC packet 700 in FIG. 15.

The data packet 600 is an IP packet and includes an IP header 601 and an IP payload 602. The IP payload 602 is a UDP packet and includes a UDP header 603 and a UDP payload 604. Moreover, the UDP payload 604 is a Real-time Transport Protocol (RTP) packet and includes a RTP header 605 and a RTP payload 606.

As defined in a Request For Comments (RFC) 791, an IP header 601 includes a transmission source IP address field and a transmission destination IP address field. An IP address of a transfer device 300 that transmits the data packet 600 is set in the transmission source IP address field. An IP address of a transmission destination device 320 stored in the distribution destination management table 400 is set in the transmission destination IP address field.

Moreover, as defined in RFC 768, the UDP header 603 includes a transmission source port field and a transmission destination port field. According to the embodiment, a transmission source port number and a transmission destination port number are fixed numbers. Details of the RTP header 605 will be described later by referring to FIG. 16.

Moreover, an FEC packet 700 is an IP packet, and includes an IP header 701 and an IP payload 702. The IP payload 702 is a UDP packet and includes a UDP header 703 and a UDP payload 704. The UDP payload 704 is an RTP packet and includes a RTP header 705 and a RTP payload 706. The RTP payload 706 includes an FEC header 707, an FEC level 0 header 708, and an FEC level 0 payload 709.

An IP address of a transfer device 300 that transmits the FEC packet 700 is set in the transmission source IP address field of the IP header 701. Moreover, an IP address of a transmission destination device 320 stored in the distribution destination management table 400 is set in the transmission destination IP address field of the IP header. According to the embodiment, a transmission source port number and a transmission destination port number in the UDP header 703 are fixed numbers.

FEC packets defined in RFC 5109 may include headers and payloads for a plurality of levels respectively. For example, when two levels are used, an FEC packet includes, subsequent to an FEC header, an FEC level 0 header, an FEC level 0 payload, an FEC level 1 header, and an FEC level 1 payload. However, according to the embodiment, typically the level 0 is used, thereby the FEC packet 700 is a format illustrated in FIG. 15. An alternative embodiment that uses a plurality of levels will be described later.

FIG. 16 illustrates a RTP header. A RTP header 605 and a RTP header 705 include fields illustrated in FIG. 16. The RTP header in FIG. 16 is defined in RFC 3550 and specifically includes fields of (L-1) to (L-10) below.

(L-1) 2-bit "version" field that indicates a version number of RTP (represented as "V" in FIG. 16). The version number of RFC 3550 is 2.

(L-2) 1-bit "padding" field (represented as "P" in FIG. 16) that indicates whether RTP packet includes a padding.

(L-3) 1-bit "extension" field (represented as "X" in FIG. 16) that indicates whether an extension is applied by adding one field or more to the RTP header subsequent to the field illustrated in FIG. 16.

(L-4) 4-bit "CSRC count" field (represented as "CC" in FIG. 16) that indicates how many "Contributing SouRCe (CSRC) identifier" fields are included in the RTP header. The count value of the CSRC is 0 for the RTP header 705 in the FEC packet 700. Accordingly, the RTP header 705 in the FEC packet 700 does not include any CSRC identifier.

(L-5) 1-bit "marker" field (represented as "M" in FIG. 16) that indicates different meanings depending on profiles.

(L-6) 7-bit "payload type" field (represented as "PT" in FIG. 16) that indicates a format of RTP payload. According to RFC 3551, for example, in a case of Moving Picture Expert Group (MPEG) 2 transport stream, the payload type is represented by a symbol, "MP2T" and the value is 33. According to RFC 5109, a value of the payload type in RTP header 705 in the FEC packet 700 is 127. Thus, the payload type is an example of information to distinguish a data packet and an FEC packet.

(L-7) 16-bit "sequence number" field. A sequence number that is incremented for 1 is assigned to consecutive RTP data packets. A start number of a sequence number is desired to be random; however the start number may not necessarily be random.

(L-8) 32-bit "time stamp" field that indicates time when the first octet of the RTP payload is sampled. For example, when a payload type is MP2T, a counter value that is counted up at 90 kHz is used as a time stamp.

(L-9) 32-bit "Synchronization SouRCe (SSRC) identifier" field to identify a source of a RTP packet stream (For example, a microphone, a video camera, and a mixer). The same SSRC identifier is assigned to RTP data packets from the same synchronization source. A random value obtained by a certain function is used as the SSRC identifier. For example, a Synchronization SouRCe (SSRC) identifier of a series of data packets and FEC packets illustrated in FIG. 1 are substantially the same.

(L-10) "Contributing SouRCe (CSRC) identifier" field to identify each stream when a plurality of streams is mixed and transmitted. The number of the CSRC identifier fields is from 0 to 15 as set in the CSRC count field. Moreover, a length of each CSRC field is 32 bit.

As described above, the RTP headers 605 and 705 in FIG. 15 include the above-described fields of (L-1) to (L-10). For example, data packets according to the embodiment illustrated in FIGS. 1 to 2, 4 to 7, and 11 to 12 may be assigned the same SSRC identifier and may be an RTP data packet that is multicasted to the same group of nodes (for example, the nodes 102 to 111 in FIG. 3). The determination unit 303 of the transfer device 300 may detect a packet loss by referring to a sequence number in the RTP header 605 of the data packet 600, and may recognize which data packet is lost.

FIG. 17 illustrates an FEC header and an FEC level 0 header. The FEC header 707 in FIG. 15 includes fields illustrated in FIG. 17. The FEC header 707 in FIG. 17 is obtained by extending the FEC header defined in RFC 5109 according to the embodiment, and includes, for example, the following fields of (M-1) to (M-11).

(M-1) 1-bit extension flag also referred to as "E bit." RFC 5109 defines to set E bit to 0 for future extension. However, according to the embodiment, the E bit is set to 1 in order to extend the FEC header defined in the RFC 5109.

(M-2) 1-bit "long-mask" flag also referred to as "L bit." When the L bit is 0, a 16 bit short mask is used in an FEC level 0 header 708. When L bit is 1, a 48 bit long mask is used in the FEC level 0 header 708. According to the embodiment, L bit is set to 0 when a block size for an FEC packet is 16 or less, while L bit is set to 1 when a block size for an FEC packet is 17 or more and is 48 or less. Moreover, according to the embodiment in which an FEC packet of the RFC 5109 is extended, it is assumed that a block size of the first layer does not exceed 48.

(M-3) 1-bit "P recovery" field to recover a value of the padding field (represented as "P" in FIG. 16) of the RTP header 605 of the lost data packet 600. The value of the "P recovery" field is exclusive-OR of values of padding fields of all data packets 600 related to the FEC packet 700.

(M-4) 1-bit "X recovery" field (represented as "X" in FIG. 16) to recover a value of an extension field of a RTP header 605 of the lost data packet 600. The value of the X recovery field is exclusive-OR of values of extension fields of all data packets 600 related to the FEC packet 700.

(M-5) 4-bit "CC recovery" field (represented as "CC" in FIG. 16) to recover a value of the CSRC count field of a RTP header 605 of the lost data packet 600. A value of the CC recovery field is exclusive-OR of values of CSRC count fields of all data packets 600 related to the FEC packet 700.

(M-6) 1-bit "M recovery" field (represented as "M" in FIG. 16) to recover a value of the marker field of the RTP header 605 of the lost data packet 600. A value of the M recovery field is exclusive-OR of values of marker fields of all data packets 600 related to the FEC packet 700.

(M-7) 7-bit "PT recovery" field (represented as "PT" in FIG. 16) to recover a value of the payload type field of the RTP header 605 of the lost data packet 600. A value of the PT recovery field is exclusive-OR of values of payload type fields of all data packets 600 related to the FEC packet 700.

(M-8) 16-bit "SN base" field that indicates a substantially minimum value among sequence numbers of RTP headers 605 of all data packets 600 related to the FEC packet 700. For example, a value of SN base field of the FEC packet 700 related to 24 data packets 600 the sequence numbers of which are from 500 to 523 is 500.

(M-9) 32-bit "TS recovery" field to recover a value of a time stamp field of the RTP header 605 of the lost data packet 600. A value of the TS recovery field is exclusive-OR of values of time stamps of all data packets 600 related to the FEC packet 700.

(M-10) 16-bit "length recovery" field to determine a length of a recovered data packet 600. A value of the length recovery field is a value of a sum of lengths in units of bytes of all data packets 600 related to the FEC packet 700. For example, a length to be counted is a sum of lengths of the RTP payload 606, a list of CSRC identifiers, an extended part subsequent to the RTP header 605 (when the RTP packet is extended), and a padding (when the RTP packet includes a padding).

(M-11) 8-bit "hierarchy" field that indicates a hierarchy of an FEC packet. The hierarchy field is a field added by an extension according to the embodiment and is not a field defined in RFC 5109.

A length of the hierarchy field may be shorter than or longer than 8 bit depending on embodiments. However, when a length of the hierarchy field is defined so that a length of the FEC header 707 is multiple of 8 bit, processing is easier because there is no odd bit. Thus, according to the embodiment, a length of the hierarchy field is 8 bit.

Moreover, up to 255 ($=2^8-1$) hierarchies may be represented according to an embodiment in which binary representation of the number of hierarchies itself is set in the hierarchy field. However, according to an embodiment that defines "substantially the deepest hierarchy is the 8 th hierarchy or shallower," the hierarchy field may be a format in which typically 1 bit that indicates a hierarchy among 8 bit is set to 1.

For example, when an MSB of the hierarchy field is assumed to be referred to as "0 th bit," the hierarchy field indicates the "i" th hierarchy when typically the (i−1) th bit is 1 ($1 \le i \le 8$). The Least Significant Bit of the hierarchy field may be referred to as the 0 th bit according to an embodiment.

All of the above-described formats are substantially the same in that the hierarchy field indicates a hierarchy of an FEC packet. For example, the hierarchy field in the FEC header 707 of the FEC packet F2-1 is set to a value that indicates the second layer.

The FEC level 0 header 708 in FIG. 17 will be described. As defined in RFC 5109, the FEC level 0 header 708 includes the following fields of (N-1) and (N-2).

(N-1) 16-bit "protection length" field that indicates a length of a part to be protected by FEC at level 0 (in other words, exclusive-OR calculation target) among RTP packets. According to the embodiment, typically level 0 is used. Thus, a substantially maximum length of exclusive-OR calculation target among all data packets 600 related to the FEC packet 700 is set to the protection length field.

(N-2) A mask field that indicates which of data packets 600 is related to the FEC packet 700 at level 0. The length of the mask field in the FEC header 707 is 16-bit when L bit is 0, while 48-bit when L bit is 1. For convenience of descriptions, a value of the SN base field of the FEC header 707 is assumed to be SN. The "i" th bit of the mask field is set to 1 typically when a data packet 600 with a sequence number (SN+i) in the RTP header 605 is related to the FEC packet 700. This corresponds to when MSB of the mask field is i=0.

As illustrated in the block management table 500 in FIG. 14, when all hierarchies other than the lowest layer is divided into the same number of blocks (for example, 2), and the block size of the same hierarchy is substantially equal, the block size is uniquely determined by the hierarchy. For example, the size of four blocks in the third layer, B3-1 to B3-4 is all 6 (=24/2(3−1)). When a block size is uniquely determined from a hierarchy as described above, each component in the transfer device 300 may recognize which of data packets 600 are related to an FEC packet 700 based on the SN base field and the hierarchy field in the FEC header 707.

For example, when a value of the SN base field is 500 and the hierarchy field indicates the third layer, six data packets from the sequence numbers 500 to 505 are related to the FEC packet 700. As described above, when a block is substantially equally divided, each component in the transfer device 300 may recognize which of data packets 600 are related to the FEC packet 700 without using the mask field of the FEC level 0 header 708.

In other words, the SN base field and the hierarchy field, the SN base field and the mask field, or the SN base field and the mask field may be used as information to identify data packets related to the FEC packet.

Operations of the transfer device 300 will be described. As described above, the transfer device 300 may operate as a root node, a relay node, or a leaf node. For convenience of descriptions, a case in which the transfer device 300 operates as a root node will be described by referring to FIG. 18 and FIG. 19. Common points in cases in which the transfer device 300 operates as a relay node and a leaf node will be described by referring to FIG. 20 and FIG. 21. Different points of cases in which the transfer device 300 operates as a relay node and a leaf node will be described by referring to FIG. 22 and FIG. 23. In describing FIGS. 20 to 23, timing charts in FIG. 24 and FIG. 25 will be referred to as appropriate.

Figure 18:
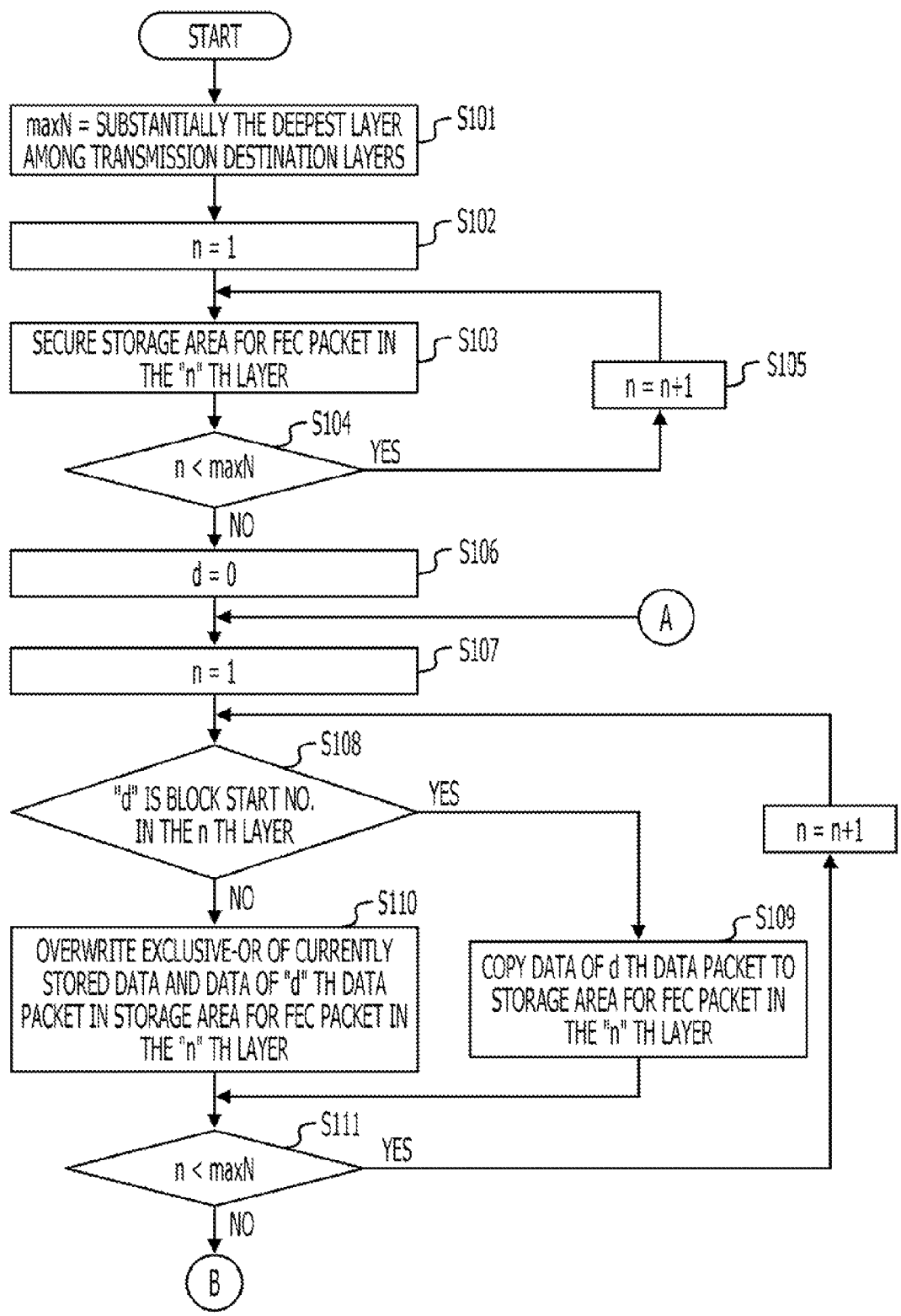
FIG. 18 illustrates an operation flow chart of a root node (1 of 2)
Figure 19:
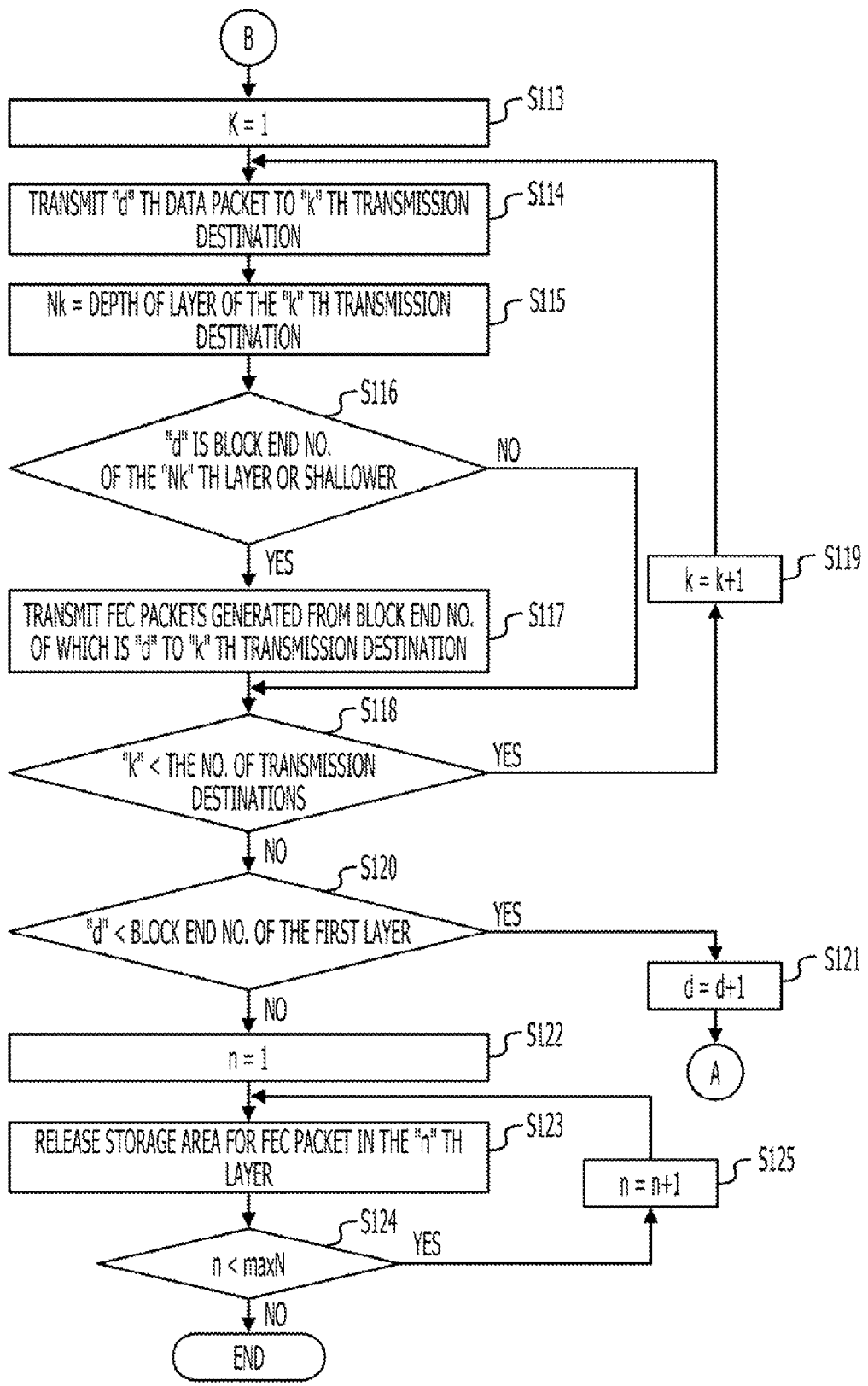
FIG. 19 illustrates an operation flow chart of a root node (2 of 2)

FIGS. 18 and 19 illustrate flow charts of a root node. For example, a transfer device 300 that operates as a root node 101 or a root node 121 in FIG. 3 performs processing of the flow charts in FIGS. 18 and 19.

The transfer device 300 that operates as a root node includes a data packet supply unit, which is not illustrated, as described above. For example, the data packet supply unit generates MPEG-2 data. The data packet supply unit generates a RTP header 605 and generates a RTP packet (in other words, a UDP payload 604) by storing the generated MPEG-2 data in a RTP payload 606. Generation processing of the RTP header 605 includes issuing a new sequence number.

Moreover, the data packet supply unit outputs the generated RTP packet to the buffer unit 302. The data packet supply unit may be, for example, achieved by a microphone and a video camera coupled to the transfer device 200 (or a microphone and a video camera achieved by the input device 204 included in the transfer device 200 in FIG. 8), and the CPU 201.

The data packet supply unit instructs the generation unit 306 to start processing of FIG. 18. Moreover, the data packet supply unit notifies the generation unit 306 of a sequence number of a RTP packet that is generated at the 0 th order.

For example, the data packet supply unit may perform the above-described instruction and notification to the generation unit 306 when the data packet supply unit outputs the RTP packet that is generated at 0 th order to the buffer unit 302. The data packet supply unit sequentially generates RTP packets of the 1st order or later and may notify a sequence number of each of the generated RTP packets to the generation unit 306 whenever the RTP packet is generated. Alternatively, the data packet supply unit may collectively perform the above-described instructions and notifications after generating a certain number of RTP packets and accumulating the generated RTP packets in the buffer unit 302. The generation unit 306 starts the processing of FIG. 18, for example, triggered by the above-described instruction and notification.

At operation S101, the generation unit 306 refers to the hierarchy field of the distribution destination management table 400 in FIG. 13 and recognizes substantially the deepest hierarchy maxN among hierarchies of the number of Z transmission destination devices 320 registered in the distribution destination management table 400.

At operation S102, the generation unit 306 initializes an index "n" that indicates a hierarchy to 1. At operation S103, the generation unit 306 requests the buffer unit 302 to secure a storage area for an FEC packet 700 in the "n" th layer, and the buffer unit 302 secures the requested storage area. A control unit, which is not illustrated, in the buffer unit 302 manages a starting address of the secured storage area in association with a hierarchy of the "n" th layer.

For example, when the data packet supply unit generates a RTP payload 606 with a fixed length, a size of the storage area secured by the buffer unit 302 may be a length obtained by adding a length of various headers in the FEC packet 700 to the above-described fixed length. Alternatively, when a substantially maximum length of a RTP payload 606 generated by the data packet supply unit is defined, the size of the storage area secured by the buffer unit 302 may be a length obtained by adding a length of various headers in the FEC packet 700 to the above-described substantially the maximum length.

At operation S104, the generation unit 306 determines whether n<maxN. If n<maxN, processing proceeds to operation S105, while if n maxN, processing proceeds to operation S106.

At operation S105, the generation unit 306 increments an index "n" for 1. The processing returns to operation S103. The operations S101 to S105 are pre-processing to secure a storage area for FEC packets 700 from the first layer to the maxN layer. After the pre-processing, at operations S106 to S121, processing is repeated for each data packet in a block of the first layer. Post-processing is performed at operations S122 to S125.

At operation S106, the generation unit 306 initializes an index "d" that indicates an order of data packets 600 in a block of the first layer to 0. At operation S107, the generation unit 306 initializes an index n that indicates a hierarchy to 1 again.

At operation S108, the generation unit 306 refers to the block management table 500 in FIG. 14 and determines the index "d" corresponds to a start number of which blocks in the "n" th layer. If the index "d" is a start number of any of blocks in the "n" th layer, processing proceeds to operation S109. Conversely, if the index "d" is not a start number of any of blocks in the "n" th layer, processing proceeds to operation S110.

For example, when d=0 and n=1, the generation unit 306 searches the block management table 500 to find the last entry and recognizes the index 0 is a start number of blocks in the first layer. Accordingly, when d=0 and n=1, processing proceeds to operation S109.

At operation S109, the generation unit 306 reads the "d" th data packet 600 from the buffer unit 302. The generation unit 306 copies data of the read "d" th data packet 600 to a storage area for an FEC packet 700 in the "n" th layer.

For example, the generation unit 306 may retain a sequence number of the 0 th RTP packet that is notified from the data packet supply unit triggered by processing of FIG. 18 as a "base number." The generation unit 306 may obtain a sequence number of the "d" th data packet by adding the base number to the index "d."

The generation unit 306 may read the "d" th data packet from the buffer unit 302 by specifying a pair of a packet type, "data packet" and a sequence number of the "d" th data packet to the buffer unit 302. The generation unit 306 may specify a starting address of a storage area for the FEC packet 700 that is a copy destination to the buffer unit 302 by notifying the buffer unit 302 of the hierarchy depth "n."

A method to specify a packet to the buffer unit 302 may be different according to an embodiment, and the above-described method is just one example. For example, according to the embodiment, the generation unit 306 performs processing as described below at operation S109.

The generation unit 306 sets a RTP header 705 of an FEC packet 700 in the "n" th layer. For example, the generation unit 306 sets a defined constant to a payload type field and performs processing such as issuing a sequence number for an FEC packet 700. Setting a RTP header 705 for an FEC packet 700 is a known technique, and therefore will not be described in detail.

Moreover, the generation unit 306 initializes an FEC header 707 of an FEC packet 700 in the "n" th layer. For example, the generation unit 306 copies a value of corresponding field in a RTP header 605 of the "d" th data packet 600 to each recovery field in the FEC header 707 of the FEC packet 700 in the "n" th layer.

Moreover, the generation unit 306 sets E bit of the FEC header 707 to 1 to extend the FEC header 707 and sets a value that indicates the "n" th layer in a hierarchy field of the FEC header 707. Furthermore, the generation unit 306 copies a sequence number of the "d" th data packet 600 in the SN base field of the FEC header 707. Moreover, the generation unit 306 calculates a block size corresponding to the FEC packet 700 to be generated from a start number and an end number of blocks of an entry in the block management table 500 that is found by the search at operation S108. The generation unit 306 sets an L bit of the FEC header 707 according to the calculated size as appropriate.

Moreover, the generation unit 306 initializes an FEC level 0 header 708 of the FEC packet 700 in the "n" th layer. For example, when the data packet supply unit generates a RTP payload 606 with a fixed length, the generation unit 306 sets a certain constant to a protection length of the FEC level 0 header 708. The generation unit 306 sets a bit corresponding to the "d" th data packet 600 (the "0" th bit at operation S109) to 1 after initializing all bits in the mask field to "0."

The generation unit 306 copies a RTP payload 606 of the "d" th data packet 600 to an FEC level 0 payload 709 of the FEC packet 700 in the "n" th layer. As described above, at operation S109, data of the "d" th data packet 600 is copied to the storage area for the FEC packet 700 in the "n" th layer.

At operation S110, the generation unit 306 reads the d th data packet 600 from the buffer unit 302. The generation unit 306 calculates exclusive-OR of data currently stored in the storage area for the FEC packet 700 in the "n" th layer and data of the read "d" th data packet 600. Furthermore, the generation unit 306 overwrites the storage area for the FEC packet 700 in the "n" th layer with the calculated exclusive-OR. For example, the generation unit 306 performs overwrite processing as described below.

The generation unit 306 overwrites each recovery field in the FEC header 707 of FEC packets 700 in the n th layer with exclusive-OR of a current value and a value of a corresponding field in a RTP header 605 of the "d" th data packet 600. The generation unit 306 overwrites an FEC level 0 payload 709 of FEC packet 700 in the "n" th layer with exclusive-OR of the current value and the RTP payload 606 of the "d" th data packet 600. Moreover, the generation unit 306 sets a bit corresponding to the "d" th data packet 600 in a mask field of an FEC level 0 header 708 of the FEC packets 700 in the "n" th layer to 1.

After processing of operation S109 or operation S110, the generation unit 306 determines whether n<maxN at operation S111. If n<maxN, processing proceeds to operation S112, while if n maxN, processing proceeds to operation S113 in FIG. 19.

At operation S112, the generation unit 306 increments the index "n" typically for 1. The processing returns to operation S108. The generation unit 306 reflects a content of the "d" th data packet 600 to respective FEC packets 700 in the first layer to the maxN th layer through the above-described operations S107 to S112.

At operation S113 in FIG. 19, the generation unit 306 requests the transmission unit 307 to transmit the "d" th data packet. The transmission unit 307 that accepts the request initializes an index "k" to 1 to sequentially process each entry in the distribution destination management table 400 at operation S113.

At operation S114, the transmission unit 307 transmits the "d" th data packet 600 to a transmission destination device 320 corresponding to the "k" th entry in the distribution destination management table 400. For example, at operation S114, the transmission unit 307 reads an IP address from the "k" th entry in the distribution destination management table 400 and generates an IP header 601 of a data packet 600 by using the read IP address. Moreover, the transmission unit 307 also generates a UDP header 603. The transmission unit 307 transmits a data packet 600 that is a RTP packet to which the IP header 601 and the UDP header 603 are applied to the k th transmission destination device 320.

At operation S115, the transmission unit 307 reads a value "Nk" of a hierarchy field in the "k" th entry in the distribution destination management table 400 (in other words, a depth of a hierarchy of the "k" th transmission destination device 320).

At operation S116, the transmission unit 307 refers to the block management table 500 and determines whether the index "d" is an end number of a block in the "Nk" th layer or a shallower layer. If the index "d" is an end number of a block in the "Nk" th layer or a shallower layer, the transmission unit 307 stores that the index "d" is the end number of a block in which hierarchy and processing proceeds to operation S117. Conversely, if the index "d" is not an end number of a block in the "Nk" th layer or a shallower layer, processing proceeds to operation S118.

For example, when k=2, a value of the hierarchy field of the k th entry in the distribution destination management table 400 in FIG. 13 is 2. Thus, Nk=2. Accordingly, the transmission unit 307 determines whether the index "d" is an end number of a block in the first layer or the second layer.

At operation S117, the transmission unit 307 reads data in the storage area for the FEC packet 700 of a hierarchy stored at operation S116 (in other words, data of the FEC packet 700 corresponding to a block the end number of which is "d"). The transmission unit 307 transmits the read FEC packet to the "k" th transmission destination device 320.

For example, at operation S117, the transmission unit 307 reads an IP address from the "k" th entry in the distribution destination management table 400 and generates an IP header 701 of the FEC packet 700 by using the read IP address. Moreover, the transmission unit 307 also generates a UDP header 703. The transmission unit 307 transmits a data packet 600 that is a RTP packet to which the IP header 701 and the UDP header 703 are applied to the "k" th transmission destination device 320. After transmitting the FEC packet 700, processing proceeds to operation S118.

At operation S118, the transmission unit 307 determines whether the index "k" is less than the number of transmission destination devices 320 (in other words, the number of entries Z in the distribution destination management table 400). If the index "k" is less than the number Z of transmission destination devices 320, processing proceeds to operation S119. Conversely, if the index "k" reaches the number Z of transmission destination devices 320, the transmission unit 307 notifies the generation unit 306 of end of transmission and processing proceeds to operation S120.

At operation S119, the transmission unit 307 increments the index "k" typically for 1. Processing returns to operation S114. At operation S120, the generation unit 306 determines whether the index "d" is smaller than an end number of a block in the first layer. The end number of a block in the first layer may be defined as a constant in a program executed by the CPU 201 that achieves the generation unit 306 if a block size of the first layer is fixed. Alternatively, the generation unit 306 may read a value of a block end number field in the last entry of the block management table 500 (in other words, an entry that indicates a block in the first layer) sorted as FIG. 14.

If the index "d" is less than the end number of the block in the first layer, processing proceeds to operation S121. Conversely, if the index "d" reaches the end number of a block in the first layer, processing proceeds to operation S122.

At operation S121, the generation unit 306 increments the index d typically for 1. Processing returns to operation S107 in FIG. 18. At operation S122, the generation unit 306 initializes the index "n" that indicates a hierarchy to 1 again.

At operation S123, the generation unit 306 requests the buffer unit 302 to release a storage area for an FEC packet 700 in the "n" th layer. The buffer unit 302 releases the storage area according to the request.

At operation S124, the generation unit 306 determines whether n<maxN. If n<maxN, processing proceeds to operation S125, while if n maxN, the generation unit 306 ends a series of processing in FIGS. 18 and 19 relating to the block in the current first layer.

At operation S125, the generation unit 306 increments the index "n" typically for 1. The processing returns to operation S123. Through the above-described operations S122 to S125, the storage areas secured through the operations 5102 to S105 are released.

In the example illustrated in FIGS. 18 and 19, processing is once completed at the end of one block in the first layer (for example, the block B1-1 in FIG. 2). However, as illustrated in FIG. 2, the data packet supply unit may generate many RTP payloads 606 corresponding to a plurality of blocks in the first layer.

Accordingly, the data packet supply unit may instruct the generation unit 306 to start processing of FIGS. 18 and 19 whenever RTP packets the number of which corresponds to blocks in the first layer. For example, in FIG. 2, the data packet supply unit may instruct the generation unit 306 to start processing of FIGS. 18 and 19 when the data packet supply unit generates a RTP packet corresponding to the data packet D0 and a RTP packet corresponding to the data packet D24 respectively.

Alternatively, the data packet supply unit may instruct the generation unit 306 to start processing of FIGS. 18 and 19 typically when the data packet supply unit generates a RTP packet corresponding to the data packet D0. In this case, processing of FIGS. 18 and 19 may be changed as below. For example, when the index "d" reaches the end number of the block in the first layer at operation S120, the generation unit 306 performs processing of operation S106 or later again instead of performing processing of operation S122 or later.

The data packet supply unit may instruct the generation unit 306 to end processing when the data packet supply unit generates a RTP packet corresponding to the last data packet in the stream. When the data packet supply unit instructs the generation unit 306 to end processing, the data packet supply unit may notify a sequence number of the last RTP packet to the generation unit 306. The generation unit 306 that receives the instruction to end the processing performs operations S122 to S125 after completing processing of the last RTP packet.

Figure 20:
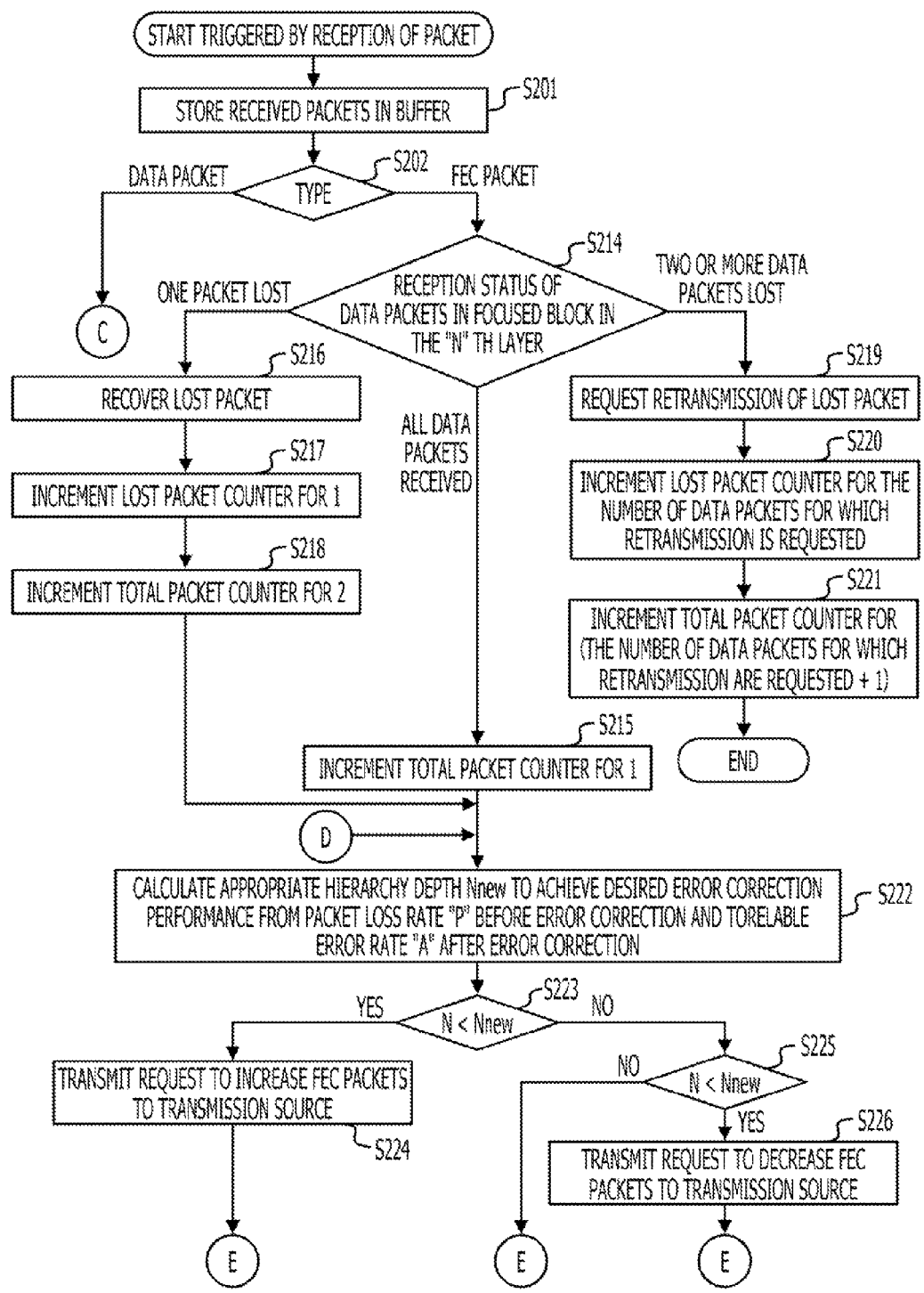
FIG. 20 illustrates an operation flow chart common to a relay node and a leaf node (1 of 2)
Figure 21:
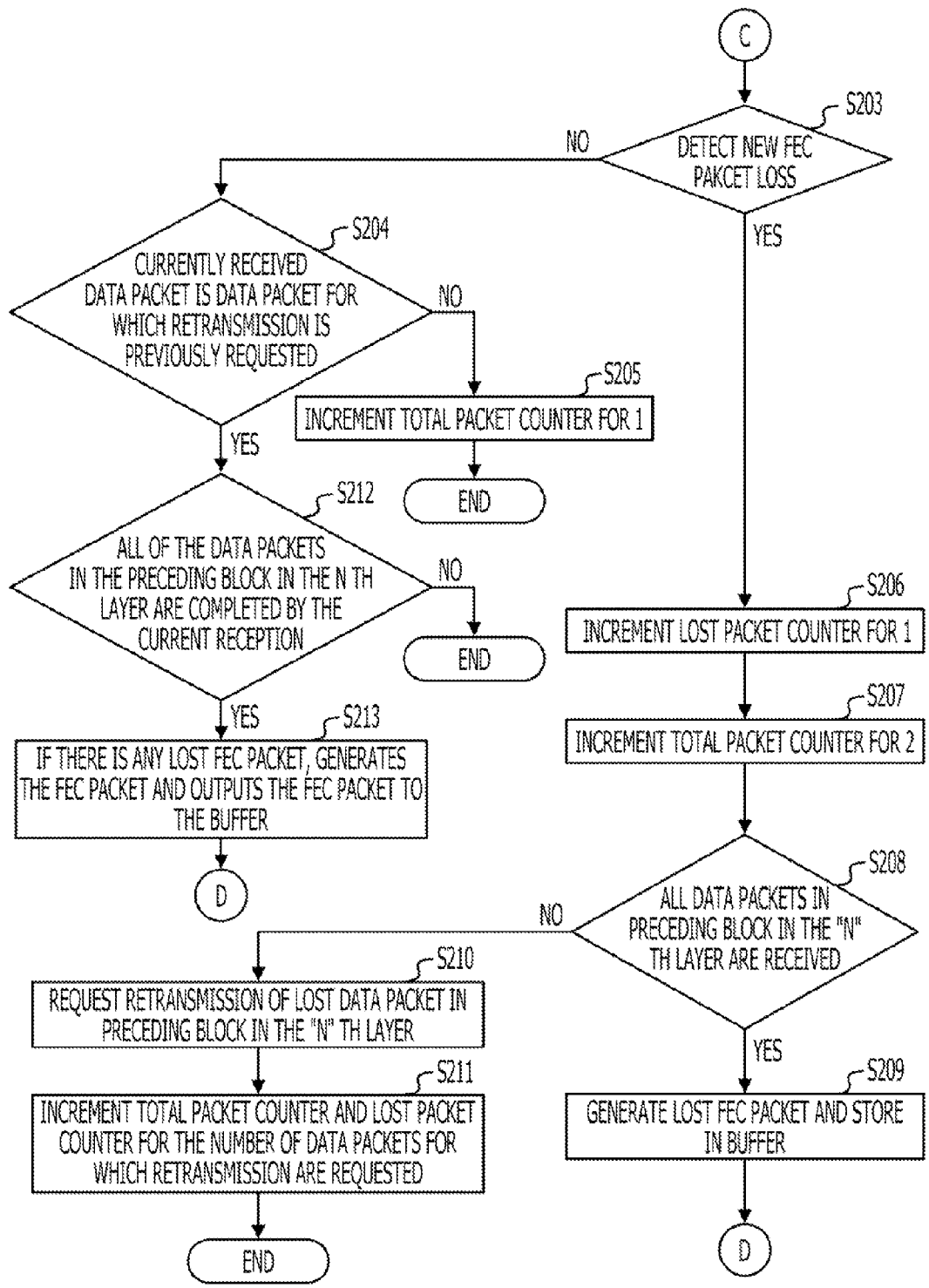
FIG. 21 illustrates an operation flow chart common to a relay node and a leaf node (2 of 2)
Figure 22:
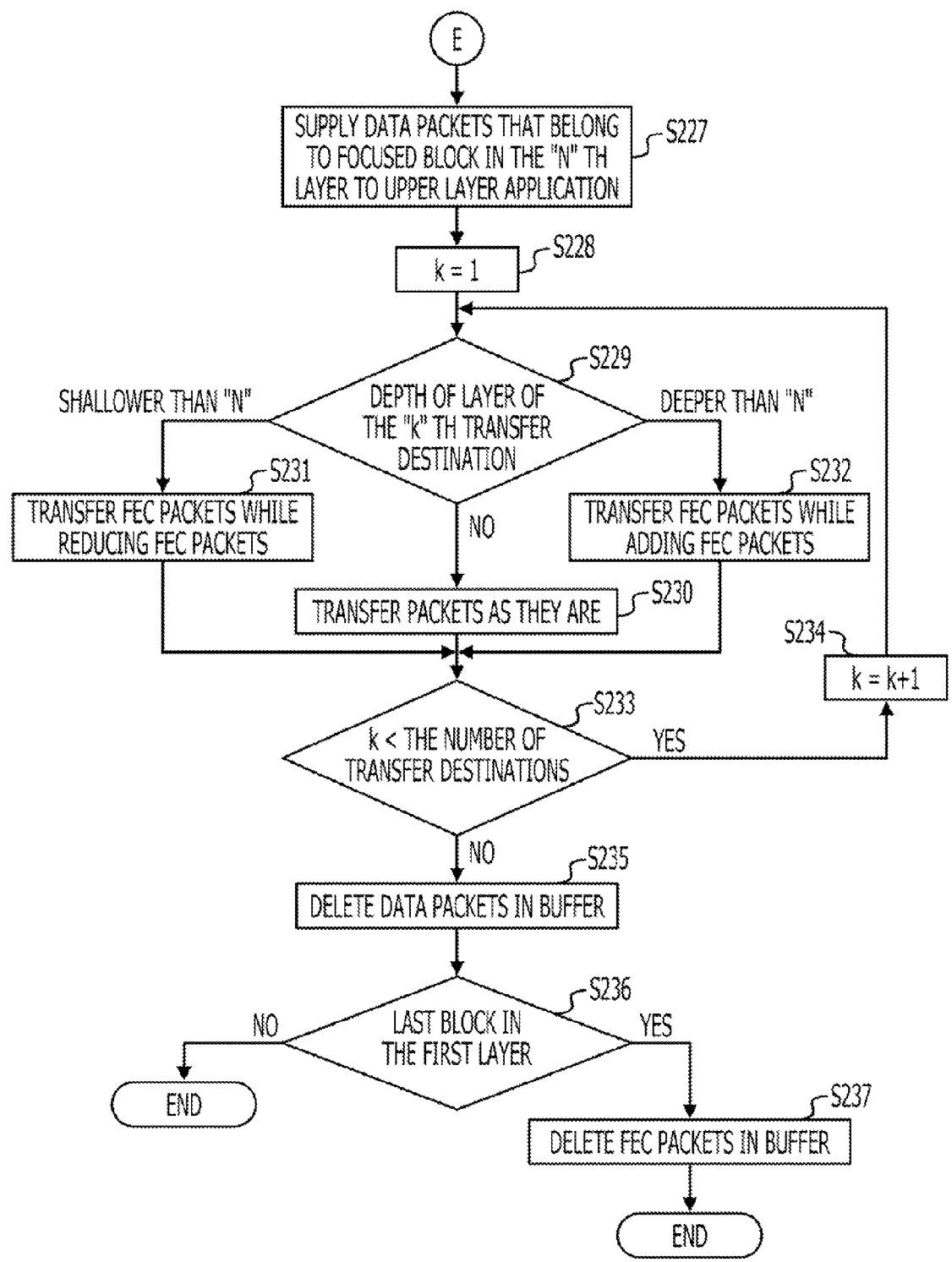
FIG. 22 illustrates an operation flow chart of a relay node.
Figure 23:
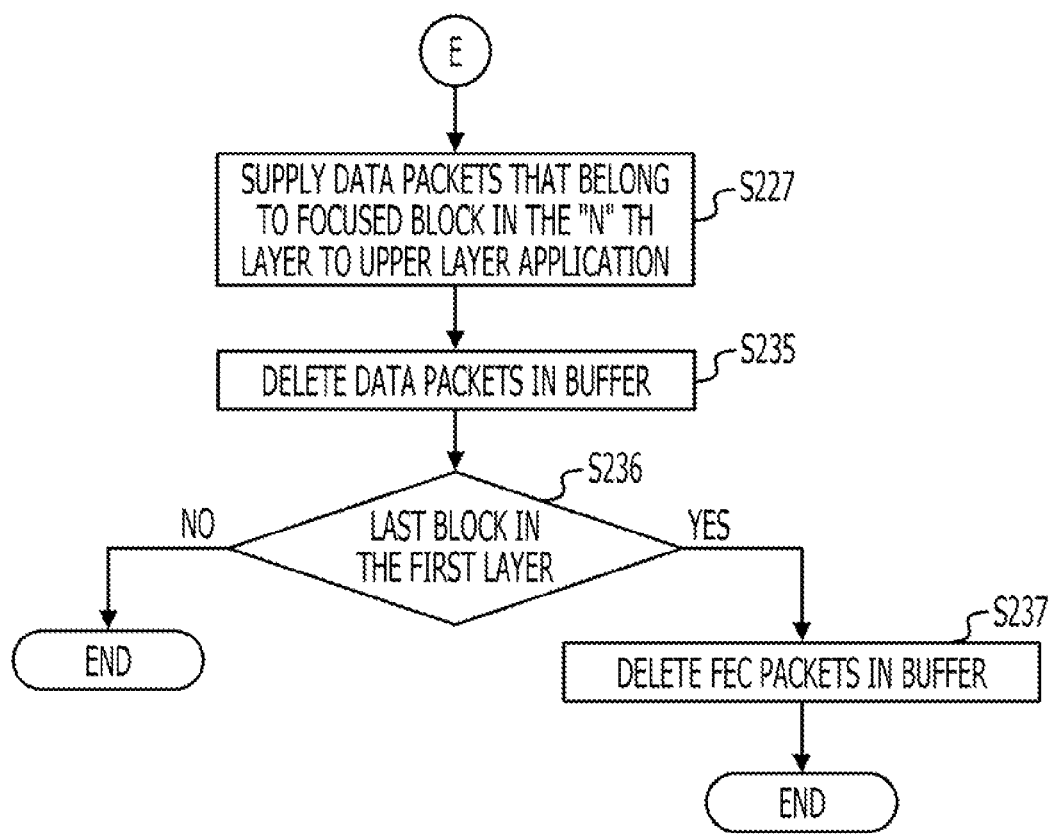
FIG. 23 illustrates an operation flow chart of a leaf node.

Operations of a relay node and a leaf node will be described by referring to flow charts in FIGS. 20 to 23. FIGS. 20 and 21 illustrate operations common to both the relay node and the leaf node. FIG. 22 illustrates operation unique to the relay node. FIG. 23 illustrates operation unique to the leaf node.

Figure 24:
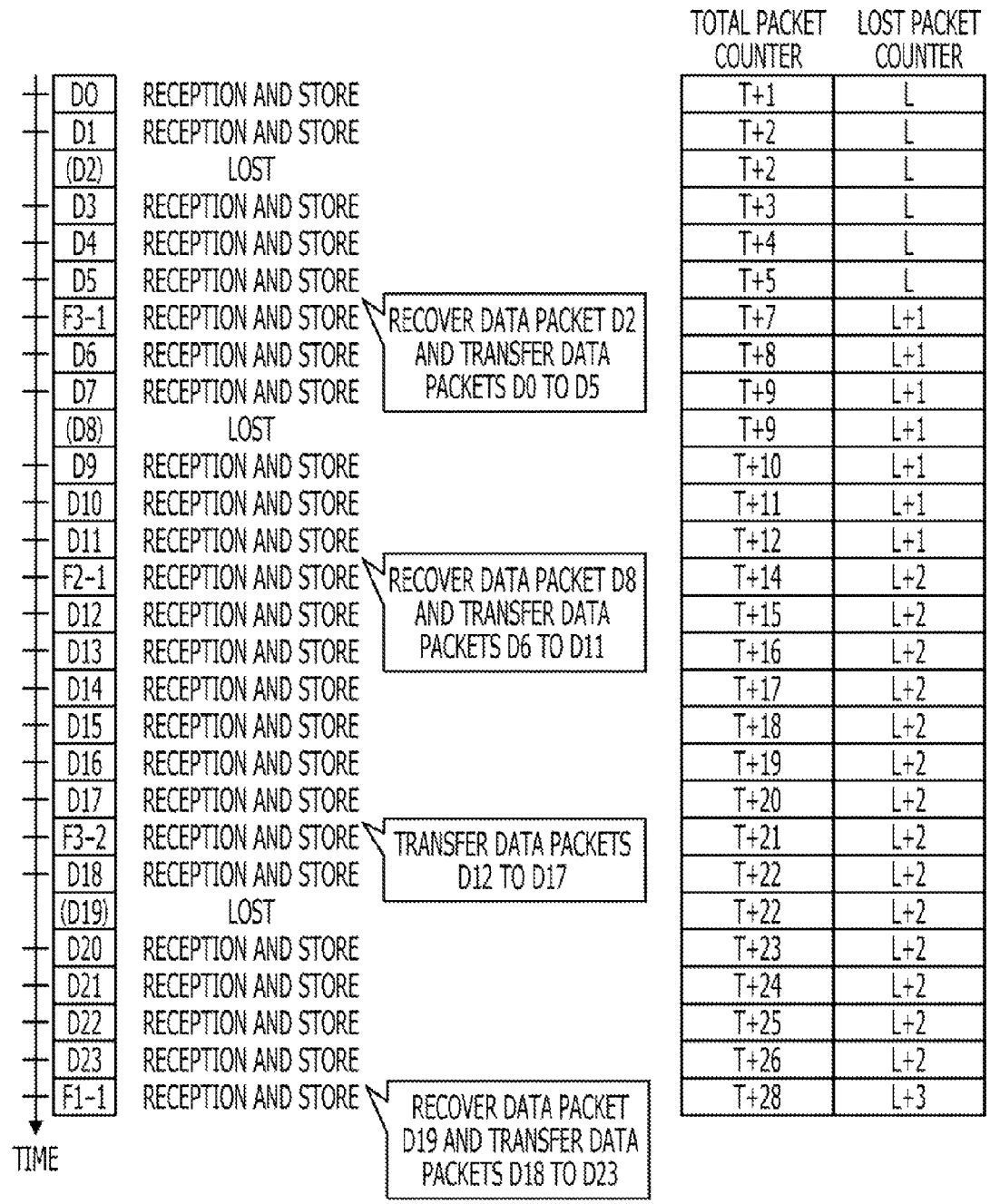
FIG. 24 is a timing chart of a first case.
Figure 25:
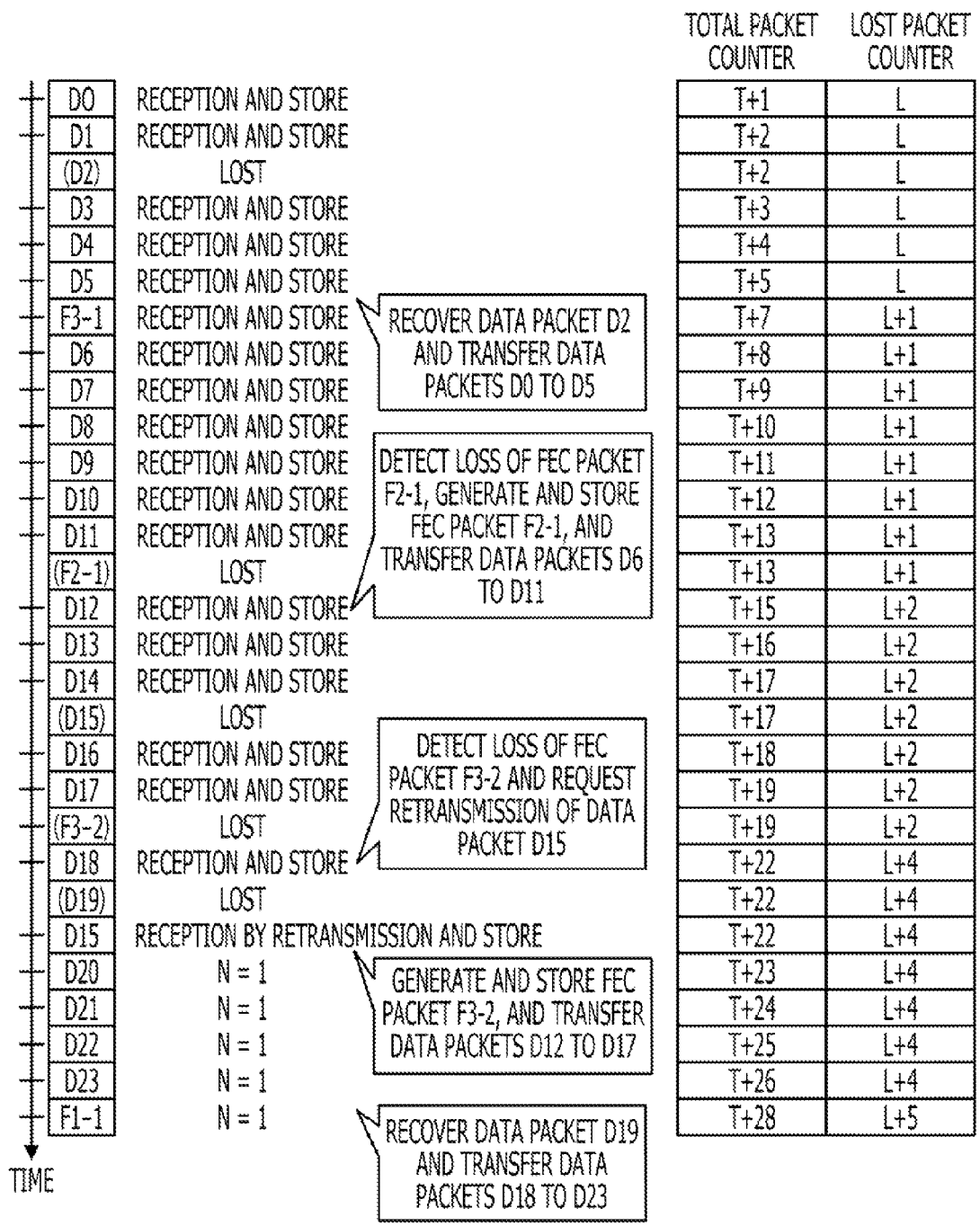
FIG. 25 is a timing chart of a second case.

Timing charts of FIGS. 24 and 25 are referred to as appropriate when describing the relay node and the leaf node. FIG. 24 illustrates a timing chart of the first case, while FIG. 25 illustrates a timing chart of the second case.

The lowest layer for a transfer device 300 is represented as "the N th layer" (1≤N) when FIGS. 20 to 23 are described. In the examples of FIGS. 24 and 25, N=3. According to the embodiment, the transmission source device 310 also retains a distribution destination management table (not illustrated) with substantially the same format as that of the distribution destination management table 400 in FIG. 13. An entry in the distribution destination management table of the transmission source device 310 records an IP address of a transfer device 300 and a hierarchy that is "the N th layer." Accordingly, FEC packets in the first layer to the N th layer are transmitted from the transmission source device 310 to the transfer device 300.

The first case in FIG. 24 illustrates that data packets, D2, D8, and D19 in the block B1-1 are lost as in FIG. 5. In FIG. 24, "received and stored" or "lost" are indicated for 24 data packets that belong to the block B1-1 and for four FEC packets that are generated for the block B1-1 or any block that is a subset of the block B1-1.

In FIG. 24, the "received and stored" indicates that the packet is appropriately received by the reception unit 301 and stored in the buffer unit 302, while "lost" indicates that the packet is lost and thereby is not received by the reception unit 301. Moreover, descriptions in balloons in FIG. 24 emphatically indicate processing performed by the transfer device 300 triggered by reception of a packet.

The "total packet counter" and "lost packet counter" in FIG. 24 that will be described later, are counters in the transfer device 300 and may be accessed from the determination unit 303 and the instruction unit 308. FIG. 24 illustrates how values of the two counters change under an assumption that values of the two counters immediately before receiving the data packet D0 are T and L respectively.

The second case in FIG. 25 illustrates when the data packet D2, the FEC packet F2-1, the data packet D15, the FEC packet F3-2, and the data packet D19 are lost. The format of FIG. 25 is substantially the same as that of FIG. 25. In the second case, the data packet D15 may not be recovered because the FEC packet F3-2 itself is lost that corresponds to the block B3-3 to which the lost data packet D15 belongs. Thus, the transfer device 300 requests the transmission source device 310 to retransmit the data packet D15.

In order to simplify descriptions, the following (O-1) and (O-2) are assumed.

(O-1) Each component in the transfer device 300 recognizes a sequence number of the 0 th data packet in the first block of the first layer beforehand (in other words, the first packet of the stream) among data packets transmitted from the transmission source device 310.

(O-2) Each component in the transfer device 300 recognizes a block size of the first layer beforehand.

In order to establish the assumption (O-1), for example, the transmission source device 310 may transmit a control packet to notify a sequence number of the first data packet in the stream to the transfer device 300. Accordingly, each component in the transfer device 300 may recognize the sequence number of the first data packet in the stream. The assumption (O-1) may be established without using the control packet by modifying processing in FIG. 20. The modification will be described later.

The assumption (O-2) is established, if the block size of the first layer is fixed as a constant. Alternatively, the transmission source device 310 may transmit a control packet to notify the block size of the first layer to the transfer device 300 thereby each component in the transfer device 300 may recognize the block size of the first layer.

According to the above assumptions (O-1) and (O-2), each component in the transfer device 300 may recognize a number that indicates an order of the received data packet in the block of the first layer by the following expression (20.1).

$$seqB = (seq - seq0) \bmod bSize \quad (20.1)$$

In the expression (20.1), the "seq" indicates a sequence number of a data packet that the transfer device 300 receives while "seq0" indicates a sequence number of the first data packet in a stream. Moreover, "bSize" indicates a block size of the first layer, while "seqB" indicates a number in the block of the first layer of the data packet received by the transfer device 300. The "mod" indicates a remainder operator. The number in the block management table 500 in FIG. 14 is indicated by the number "seqB" that indicates an order in the block of the first layer indicated in the expression (20.1).

Processing in FIG. 20 is triggered when the reception unit 301 receives a packet from the transmission source device 310. Hereinafter, a reception that triggers processing in FIG. 20 is also referred to as "current reception."

At operation S201, the reception unit 301 outputs a packet currently received to the buffer unit 302. The buffer unit 302 stores the packet. Moreover, at operation S201, the reception unit 301 extracts at least a payload type and a sequence number of a RTP header of the received packet and notifies the extracted payload type and the sequence number to the determination unit 303. Moreover, the reception unit 301 notifies the reception of the packet to the recovery unit 304.

At operation S202, the determination unit 303 determines whether a type of the currently received packet is a data packet or an FEC packet based on a value of the payload type notified by the reception unit 301. As described for FIG. 16, a value of the payload of the RTP header 705 of the FEC packet 700 is a specific value that is 127. Thus, the determination unit 303 may perform determination of operation S202 based on a value of a payload type.

If the currently received packet is a data packet, processing proceeds to operation S203 in FIG. 21. Conversely, if the currently received packet is an FEC packet, processing proceeds to operation S214.

Processing of operation S203 in FIG. 20 is performed for one of the following (P-1) to (P-4).

(P-1) A packet to be received subsequently is a data packet and the data packet is received by the reception unit 301 without fail at operation S201. In this case, for example, in FIG. 24, a packet to be received subsequently at the time when the transfer device 300 receives a data packet D0 is the data packet D1. Thus, when the data packet D1 is received corresponds to the case of (P-1).

(P-2) A packet to be received subsequently is a data packet, however, the data packet is lost and another data packet that is to be received later than the packet to be received subsequently is received by the reception unit 301 at operation S201. In this case, for example, in FIG. 24, "the data packet to be received subsequently" at the time when the transfer device 300 receives the data packet D1 is the data packet D2. However, the data packet D2 is lost, and a data packet that is actually received subsequently is the data packet D3. Accordingly, when the data packet D3 is received in FIG. 24 corresponds to the case of (P-2).

(P-3) A packet to be received subsequently is an FEC packet, however, the FEC packet is lost and another data packet that is to be received later than the FEC packet is received by the reception unit 301 at operation S201. In this case, for example, in FIG. 25, "the FEC packet to be received subsequently" at the time when the transfer device 300 receives the data packet D11 is the FEC packet F2-1. However, the FEC packet F2-1 is lost, and a data packet that is actually received is the data packet D12. Moreover, in FIG. 25, "the FEC packet to be received subsequently" at the time when the transfer device 300 receives the data packet D17 is the FEC packet F3-2. However, the FEC packet F3-2 is lost, and a data packet that is actually received is the data packet D18. Accordingly, cases when the data packet D12 is received and D18 is received in FIG. 25 correspond to the case of (P-3).

(P-4) A data packet for which retransmission is requested to the transmission source device 310 because the data packet may not be recovered is received by the reception unit 301 at operation S201. In this case, for example, in FIG. 25, retransmission of the data packet D15 that is lost and may not be recovered is requested at operation S201. When the data packet D15 that is retransmitted from the transmission source device 310 is received after reception of the data packet D18 corresponds to the case (P-4). The (P-4) may occur regardless of a type of a packet to be received subsequently.

As described above, cases in which a packet received at operation S201 is a data packet may be the four cases, (P-1) to (P-4). Accordingly, the determination unit 303 determines whether the current reception corresponds to (P-3) at operation S203. Details of the determination processing are, for example, as described below.

The determination unit 303 retains a sequence number and a payload type notified by the reception unit 301 when the reception unit 301 receives the packet previously as a "previous sequence number" and a "previous payload type." At operation S203, if the previous payload type indicates an FEC packet, the determination unit 303 determines that "current reception at operation S201 does not corresponds to (P-3)" and processing proceeds to operation S204. This is because, according to the embodiment, FEC packets are not consecutive.

Meanwhile, when the previous payload type indicates a data packet, the determination unit 303 calculates a number that indicates an order in a block of the first layer according to the expression (20.1). In other words, the determination unit 303 assigns the previous sequence number to "seq" and calculates "seqB" in the expression (20.1). The determination unit 303 determines whether the calculated number "seqB" matches with an end number of a block in any of the entries in the block management table 500 in FIG. 14.

If there is any entry with an end number of a block that matches with the number "seqB" is found in the block management table 500, the determination unit 303 determines that "the current reception corresponds to (P-3)." In other words, the determination unit 303 newly detects an FEC packet loss at operation S203. Processing proceeds to operation S206.

For example, in the example of FIG. 25, at the time when the data packet D12 is received, the previous sequence number is a sequence number of the data packet D11. Thus, seqB=11. Moreover, the block management table 500 in FIG. 14 includes an entry that an end number of a block is 11. Accordingly, the determination unit 303 newly detects a loss of the FEC packet F2-1 at operation S203 and determines that "the current reception corresponds to (P-3)."

When the determination unit 303 newly detects a loss of the FEC packet as described above, the determination unit 303 may internally store the hierarchy of the lost FEC packet (in other words, a hierarchy of the entry found in the block management table 500). For example, when a loss of the FEC packet F2-1 is detected as described above, the determination unit 303 may internally store detection of a loss of an FEC packet in the second layer.

Conversely, if an end number of a block that matches with a number seqB is not in the block management table 500, the determination unit 303 determines that "the current reception corresponds to (P-1), (P-2), or (P-4)." Processing proceeds from operation S203 to operation S204.

Operation S204 is performed when the current reception corresponds to (P-1), (P-2), or (P-4). Accordingly, at operation S204, the determination unit 303 determines whether the current reception corresponds to (P-4).

For example, the transfer device 300 may retain a list (hereinafter referred to as "retransmission request list") on the RAM 202 that may be referred by each component in the transfer device 300, for example. Each element in the retransmission request list may be a sequence number of a data packet that the transfer device 300 requests retransmission to the transmission source device 310. Adding elements to the retransmission request list is performed at operations 5210 or S219, which will be described later. The determination unit 303 may determine whether the current reception corresponds to (P-4) by referring to the retransmission request list.

If the sequence number notified by the reception unit 301 at operation S201 is included in the retransmission request list, the determination unit 303 determines that "current reception corresponds to (P-4)" and deletes the sequence number notified by the reception unit 301 at operation S201 from the retransmission request list. Processing proceeds to operation S212.

For example, in FIG. 25, when the data packet D15 is received, the sequence number of the data packet D15 is included in the retransmission request list. Thus, the determination unit 303 determines that "current reception corresponds to (P-4)" at operation S204.

Conversely, if the sequence number notified by the reception unit 301 at operation S201 is not included in the retransmission request list, the determination unit 303 determines that "current reception corresponds to (P-1) or (P-2)." Processing proceeds to operation S205.

As described above, operation S205 is performed when the current reception corresponds to (P-1) or (P-2). According to the embodiment, determination that "the current reception corresponds to which of (P-1) or (P-2)" is postponed until an FEC packet is received or a loss of an FEC packet is detected later. Accordingly, at operation S205, the determination unit 303 increments a value of the total packet counter for 1. Processing triggered by the current reception is completed.

The total packet counter is for counting the number of packets to be originally received by the transfer device 300.

The lost packet counter is for counting the number of lost packets. Initial values for the two counters are 0. Moreover, the two counters are counted up across a plurality of blocks in the first layer. In other words, the two counters are not cleared for each block in the first layer.

As described above, the determination that "the current reception corresponds to which of (P-1) or (P-2)" is postponed, thus the value of the lost packet counter is not changed at operation S205. On the other hand, one data packet is received at the current reception, the determination unit 303 increments the total packet counter for typically 1.

For example, in either FIG. 24 or FIG. 25, when the current reception corresponds to (P-1) or (P-2), the value of the total packet counter increases for 1, however, the value of the lost packet counter does not increase. For example, in FIG. 24, when the data packet D0 is received, the value of the total packet counter increases from T to (T+1), however, the value of the lost packet counter remains to be L and does not change. Furthermore, when the data packet D3 is received, a value of the total packet counter increases from (T+2) to (T+3); however, the value of the lost packet counter remains to be L and does not change. The lost packet counter is incremented in association with a loss of the data packet D2 when the FEC packet F3-1 is received later.

Processing of operation S206 is performed when the current reception corresponds to (P-3) as described above. Accordingly, the determination unit 303 increments the lost packet counter for typically 1 at operation S206 in association with a loss of an FEC packet detected at operation S203.

For example, in the example of FIG. 25, when the data packet D12 is received, the determination unit 303 detects a loss of an FEC packet F2-1 at operation S203. Accordingly, the determination unit 303 counts the lost FEC packet F2-1 as a lost packet, thereby incrementing the lost packet counter typically for 1 at operation S206.

Likewise, in the example of FIG. 25, when the data packet D 18 is received, the determination unit 303 detects a loss of an FEC packet F3-2 at operation S203. Accordingly, the determination unit 303 counts the lost FEC packet F3-2 as a lost packet, thereby increasing the lost packet counter for 1 at operation S206.

At subsequent operation S207, the determination unit 303 increments the total packet counter typically for 2. This is because both the currently received data packet and an FEC packet that a loss of which is detected at operation S203 triggered by the reception of the data packet are included in "packets to be originally received by the transfer device 300."

In the example of FIG. 25, when the data packet D12 is received, the determination unit 303 increments the total packet counter for 2. In other words, the determination unit 303 counts the data packet D12 and the FEC packet F2-1 as "packets to be originally received by the transfer device 300." Similarly, in the example of FIG. 25, when the data packet D18 is received, the determination unit 303 counts the data packet D18 and the FEC packet F3-2 at operation S207.

At operation S208, the determination unit 303 determines whether the reception unit 301 already receives all data packets in a preceding block in the N th layer (in other words, the lowest layer). The "preceding block in the N th layer" is a block to which a data packet immediately before an FEC packet the loss of which is detected at operation S203 belongs in the N th layer.

If the reception unit 301 already receives all of the data packets in the preceding block in the N th layer, processing proceeds to operation S209. Conversely, if there is any data packet that the reception unit 301 does not receive yet in the preceding block in the N th layer, processing proceeds to operation S210.

A value that indicates the N th layer that is the lowest layer for the transfer device 300 (for example, an integer N itself) is retained, for example, in the instruction unit 308, and may be referred by other components (for example, the determination unit 303, the recovery unit 304, and the generation unit 306). Immediately after the transfer device 300 starts transferring data packets from the transmission source device 310 to the transmission destination device 320, a default value may be used as a value that indicates the N th layer. After the instruction unit 308 notifies the second hierarchy information to the transmission source device 310, the hierarchy indicated by the second hierarchy information is the N th layer. The value of N may be changed dynamically in response to a change in an error rate between the transmission source device 310 and the transfer device 300.

At operation S208, the determination unit 303 may identify a data packet that belongs to "a preceding block in the N th layer" from the block management table 500 in FIG. 14. Thus, the determination unit 303 may perform determination of operation S208 by inquiring a control unit, which is not illustrated, of the buffer unit 302 whether the identified data packet is stored in the buffer unit 302. An example of determination processing at operation S208 is, for example, as described below.

In FIG. 25, when the reception unit 301 receives the data packet D12 after receiving the data packet D11 without receiving the FEC packet F2-1, "a preceding block in the N th layer" is a block B3-2 to which the data packets D6 to D11 belong. In the example of FIG. 25, the data packets D6 to D11 are not lost but received. Accordingly, in this case, processing proceeds to operation S209.

For example, when a value of the hierarchy field found at operation S203 is smaller than N, the determination unit 303 searches for the last entry among entries that are present before the entry found at operation S203 and the value of the hierarchy field substantially equals to N. The second entry corresponding to the block B3-1 is found and a value of the block end number field in the entry is 5. Moreover, the entry in the block management table 500 that the determination unit 303 finds at operation S203 is the fourth entry corresponding to the block B2-1 and has a value of 11 as the block end number.

Thus, the determination unit 303 identifies the data packet D6 that is the sixth (=5+1) data packet to the data packet D11 that is the eleventh data packet as data packets that belong to the "preceding block in the N th layer." The determination unit 303 recognizes all of the data packets D6 to D11 are already received as a result of an inquiry to the buffer unit 302. Accordingly, processing proceeds to operation S209.

Meanwhile, in FIG. 25, when the reception unit 301 receives the data packet D18 after receiving the data packet D17 without receiving the FEC packet F3-2, the "preceding block in the N th layer" is a block B3-3 to which the data packets D12 to D17 belong. In the example of FIG. 25, among the data packets D12 to D15, the data packet D15 is lost and is not received. In this case, processing proceeds to operation S210.

In this case, the determination unit 303 already finds the sixth entry in the block management table 500 at operation S203. The value of the hierarchy field of the found entry is N (=3), thus the determination unit 303 identifies the data packets D12 to D17 as data packets that belong to the "preceding block in the N th layer" based on a content of the found entry. As a result of the inquiry to the buffer unit 302, the determination unit 303 recognizes the data packet D15 is not received. Accordingly, processing proceeds to operation S210.

At operation S209, the determination unit 303 requests the generation unit 306 to generate the lost FEC packet by using data packets that belong to the "preceding block in the N th layer." The generation unit 306 generates the FEC packet according to the request, and outputs the FEC packet to the buffer unit 302. Processing proceeds to operation S222 in FIG. 20.

The determination unit 303 rewrites an internal memory that stores a hierarchy of the lost FEC packet after instructing the generation unit 306 to generate the lost FEC packet. For example, when the determination unit 303 instructs the generation unit 306 to generate the lost FEC packet F2-1 in the second layer, the determination unit 303 clears an internal memory that "a loss of FEC packet in the second layer is detected."

Processing of operation S209 may be performed, for example, as described below. The determination unit 303 identifies a packet to be used for generating an FEC packet based on a content of an entry found as a result of searching the block management table 500 at determination of operation S203. In the example of FIG. 25, when the reception unit 301 receives the data packet D12, the determination unit 303 may identify the FEC packet F3-1 and data packets D6 to D11 as packets used for generating the lost FEC packet F2-1 as described below.

At operation S203, the determination unit 303 already finds an entry that indicates "the hierarchy is 2, the block start number is 0, and the block end number is 11." Moreover, in the example of FIG. 25, N=3. Accordingly, the determination unit 303 specifies all packets in hierarchies deeper than a layer (=2) of the found entry up to the N th layer and those stored in the buffer unit 302 as packets to be used for generating the FEC packet F2-1 to the generation unit 306.

According to the embodiment as will be described later, when an FEC packet is received, an old FEC packet in the same hierarchy is discarded if the FEC packet in the same hierarchy is already stored in the buffer unit 302. Accordingly, in the above example, the determination unit 303 may recognize the FEC packet F3-1 in the third layer that is already received as a packet to be used for generating the lost FEC packet F2-1.

Moreover, the determination unit 303 recognizes the data packets D6 to D11 that belong to the "preceding block in the N th layer" recognized at operation S208 as data packets to be used for generating the lost FEC packet F2-1. The determination unit 303 instructs the generation unit 306 to generate the FEC packet F2-1 by using the data packets D6 to D11 and the FEC packet F3-1 that are recognized as described above.

The generation unit 306 reads data packets D6 to D11 and the FEC packet F3-1 from the buffer unit 302. The generation unit 306 generates the FEC packet F2-1 according to the expression (4.1), and stores the generated FEC packet F2-1 in the buffer unit 302.

In other words, the generation unit 306 calculates exclusive-OR of FEC level 0 payload 709 of the FEC packet F3-1 and respective RTP payloads 606 of data packets D6 to D11 as FEC level 0 payload 709 of the FEC packet F2-1. The generation unit 306 sets E bit to 1 in the FEC header 707 of the FEC packet F2-1 and sets a value that indicates "the second layer" corresponding to a hierarchy of the FEC packet F2-1 in the hierarchy field.

Moreover, the generation unit 306 calculates exclusive-OR of values of respective recovery fields in the FEC header 707 of the FEC packet F3-1 and values in the corresponding fields in the RTP headers 605 of the respective data packets D6 to D11. The generation unit 306 sets the calculated values to respective recovery fields in the FEC header 707 of the FEC packet F2-1.

Moreover, the generation unit 306 sets the SN base field in the FEC header 707 of the FEC packet F2-1 and the mask field in the FEC level 0 header 708 based on sequence numbers of the data packets D6 to D11. As for other fields (refer to FIGS. 16 and 17) that are not described here, the generation unit 306 sets values as appropriate so as to comply with RFC 5109.

The generation unit 306 stores the FEC packet F2-1 generated as described above in the buffer unit 302 in association with a hierarchy, "the second layer." Processing proceeds from operation S209 to operation S222 in FIG. 20.

At operation S210, the determination unit 303 requests the transmission source device 310 to retransmit one or a plurality of packets among data packets that belong to the preceding block in the N th layer and that the non-reception of which are confirmed at operation S208 (in other words, lost data packets). For example, in FIG. 25, after a loss of the FEC packet F3-2 is detected at operation S203 triggered by the reception of the data packet D18, the determination unit 303 requests the transmission source device 310 to retransmit the data packet D15 at operation S210.

The retransmission request may be performed through the instruction unit 308. Furthermore, the retransmission request includes a sequence number to identify the lost data packet. At subsequent operation S211, the determination unit 303 increments the total packet counter and the lost packet counter for the number of data packets for which retransmission are requested at operation S210. Processing triggered by the current reception is completed.

For example, in the example of FIG. 25, the data packet that the determination unit 303 requests retransmission at operation S210 is typically the data packet D15. Thus, the determination unit 303 increments the total packet counter for 1 and increments the lost packet counter for 1.

As a result, the total packet counter is incremented for 3 in total at operations S207 and S211 triggered by the reception of the data packet D18, and the value is changed from (T+19) to (T+22) as illustrated in FIG. 25. Moreover, the lost packet counter is incremented for 2 in total at operations S206 and S211 triggered by the reception of the data packet D18, and the value is changed from (L+2) to (L+4) as illustrated in FIG. 25.

Operation S212 in FIG. 21 is executed when the current reception corresponds to (P-4) as described above. The determination unit 303 determines whether all data packets in the preceding block in the N th layer are completed. At operation S212, for example, as in determination at operation S208, determination may be made through an inquiry from the determination unit 303 to the buffer unit 302.

If the data packets in the preceding block in the N th layer are not completed by the current reception, a series of processing triggered by the current reception is completed in order to wait for all of the data packets in the preceding block in the "N" th layer are completed. For example, the determination unit 303 requests retransmission of a plurality of data packets to the transmission source device 310 at operation S210, and if typically one data packet among the data packets for which retransmission are requested is received by the reception unit 301, all of the data packets in the preceding block in the N th layer are not completed yet. Thus, processing is completed in order to wait until all of the data packets are retransmitted.

Conversely, when all of the data packets in the preceding block in the N th layer are completed by the current reception, processing proceeds from operation S212 to operation S213. In the example of FIG. 25, when the current reception is reception of retransmitted data packet D15, all of the data packets in the preceding block in the N th layer are completed by the current reception. In this case, processing proceeds to operation S213.

At operation S212, "the preceding block in the N th layer" is a block in the N th layer preceding the FEC packet (the loss of the FEC packet is detected at operation S203 or the FEC packet received at operation S201) that triggers determination whether retransmission is requested. In the example of FIG. 25, when the current reception is reception of the retransmitted data packet D15, the block B3-3 to which data packets D12 to D17 belong is "the preceding block in the N th layer."

At operation S213, the determination unit 303 determines whether there is any lost FEC packet. In the example of FIG. 25, when the loss of the FEC packet 3-2 is detected at operation S203 triggered by the reception of the data packet D18, the determination unit 303 may internally store detection of the loss of FEC packet of the third layer. At operation S213, the determination unit 303 may determine whether there is any lost FEC packet based on own internal memory.

Even if no FEC packet is lost, retransmission is caused when a plurality of data packets is lost in one block in the N th layer. Thus, the FEC packet is not necessarily lost when operation S213 is performed. Accordingly, the determination unit 303 determines whether there is any lost FEC packet. If there is no lost FEC packet, processing proceeds to operation S222 in FIG. 20.

Conversely, if there is any lost FEC packet, the determination unit 303 further instructs the generation unit 306 to generate the FEC packet at operation S213. The generation unit 306 generates the FEC packet and outputs the FEC packet to the buffer unit 302. Processing proceeds to operation S222 in FIG. 20.

The determination unit 303 rewrites an internal memory that stores a hierarchy of the lost FEC packet after instructing the generation unit 306 to generate the lost FEC packet. For example, when the determination unit 303 instructs the generation unit 306 to generate the lost FEC packet F3-2 in the third layer, the determination unit 303 clears an internal memory that "loss of FEC packet in the third layer is detected."

Details of generation of the FEC packet at operation S213 is similar to operation S209. In the example of FIG. 25, the determination unit 303 specifies the data packets D12 to D17 to be used for generating the lost FEC packet F3-2 to the generation unit 306 at operation S213. As described above, when the lost FEC packet F3-2 is in the lowest layer (the third layer), the generation unit 306 does not use other FEC packets that are already received.

In other words, the generation unit 306 calculates exclusive-OR of FEC level 0 payload 709 of the FEC packet F3-2 and respective RTP payloads 606 of data packets D12 to D17 as FEC level 0 payload 709 of the FEC packet F3-2. The generation unit 306 sets E bit to 1 in the FEC header 707 of the FEC packet F3-2 and sets a value that indicates "the third layer" corresponding to a hierarchy of the FEC packet F3-2 in the hierarchy field.

Moreover, the generation unit 306 sets exclusive-OR of values in corresponding fields in the respective RTP headers 605 of the data packets D12 to D17 to respective recovery fields in the FEC header 707 of the FEC packet F3-2. Moreover, the generation unit 306 sets the SN base field in the FEC header 707 of the FEC packet F3-2 and the mask field in the FEC level 0 header 708 based on sequence numbers of the data packets D12 to D17. As for other fields (refer to FIGS. 16 and 17) that are not described here, the generation unit 306 sets values as appropriate so as to comply with RFC 5109.

The generation unit 306 stores the FEC packet F3-2 generated as described above in the buffer unit 302 in association with a hierarchy, "the third layer." Processing proceeds from operation S213 to operation S222 in FIG. 20.

Operation S214 in FIG. 20 is performed when the current reception is reception of an FEC packet. The determination unit 303 that detects reception of an FEC packet instructs the buffer unit 302 to discard an old FEC packet in the same hierarchy when the FEC packet in a hierarchy that is the same hierarchy as the currently received FEC packet is already stored in the buffer unit 302. The buffer unit 302 discards the old FEC packet according to the instruction.

In the example of FIG. 24, at the time when the FEC packet F3-2 is received, the FEC packet F3-1 in the same third layer is already stored in the buffer unit 302. Accordingly, the determination unit 303 instructs the buffer unit 302 to discard the FEC packet F3-1.

On the other hand, in the example of FIG. 24, at the time when the FEC packet F2-1 is received, there is no other FEC packet in the second layer stored in the buffer unit 302. Accordingly, there is no FEC packet to be discarded.

After the old FEC packet is discarded according to cases as described above, the determination unit 303 determines a reception status of data packets in a focused block in the N th layer. The "focused block in the N th layer" is a block to which a data packet preceding the currently received FEC packet belongs in the N th layer.

When the reception unit 301 receives all of the data packets that belong to focused block in the N th layer, processing proceeds to operation S215. Moreover, when typically one data packet is lost among data packets that belong to the focused block in the N th layer (in other words, the reception unit 301 receives all of the remaining data packets), processing proceeds to operation S216. When two or more data packets are lost among data packets that belong to the focused block in the N th layer, processing proceeds to operation S219. Determination of the reception state at operation S214 may be achieved by inquiring to the buffer unit 302 as in the determination at operation S208.

In the examples of FIGS. 24 and 25, when the reception unit 301 receives the FEC packet F3-1, the "focused block in the N th layer" is a block B3-1 to which the data packets D0 to D5 belong, and the data packet D2 is lost. Accordingly, processing proceeds from operation S214 to operation S216.

Likewise, in the example of FIG. 24, when the current reception is reception of the FEC packet F2-1, processing proceeds from operation S214 to operation S216 as well. This is because the data packet D8 is lost among data packets D6 to D11.

Similarly, in the example of FIG. 24, when the current reception is reception of the FEC packet F1-1, processing proceeds from operation S214 to operation S216 as well. This is because the data packet D19 is lost among data packets D18 to D23.

Moreover, in the example of FIG. 24, when the current reception is reception of the FEC packet F3-2, all of the data packets D12 to D17 that belong to the focused block in the N th layer are already received. Accordingly, processing proceeds from operation S214 to operation S215.

At operation S215, the determination unit 303 increments the total packet counter for 1 in order to reflect the current FEC packet reception. Processing proceeds to operation S222.

Meanwhile, at operation S216, the determination unit 303 requests the recovery unit 304 to recover one lost data packet.

The recovery unit 304 reads an FEC packet and data packets to be used for recovery from the buffer unit 302 according to the request, and recovers the lost data packet by using the read packets. Moreover, the recovery unit 304 outputs the recovered data packet to the buffer unit 302. Details of operation S216 may be, for example, as described below.

The determination unit 303 recognizes a hierarchy of the currently received FEC packet from the hierarchy field of the FEC header 707. When the hierarchy recognized by the determination unit 303 is the lowest layer (in other words, the N th layer), FEC_New( ) corresponds to the currently received FEC packet according to the expression (5.10). Accordingly, the determination unit 303 instructs the recovery unit 304 to perform recovery by using all data packets other than the one lost data packet that belong to the focused block in the N th layer and the currently received FEC packet.

In the example of FIG. 24, when the FEC packet F3-1 is received, a hierarchy recognized by the determination unit 303 is the third layer (in other words, the N th layer). Accordingly, the determination unit 303 instructs the recovery unit 304 to recover the data packet D2 by using data packets D0, D1, and D3 to D5 that belong to the focused block in the third layer and the FEC packet F3-1.

The recovery unit 304 reads the data packets D0, D1, and D3 to D5 and the FEC packet F3-1 from the buffer unit 302 and recovers the data packet D2 by using the read packets. The recovery unit 304 outputs the recovered data packet to the buffer unit 302.

For example, the recovery unit 304 calculates exclusive-OR of FEC level 0 payload 709 of the FEC packet F3-1 and respective RTP payloads 606 of data packets D0, D1, and D3 to D5 as the RTP payload 606 of the data packet D2.

Moreover, the recovery unit 304 calculates exclusive-OR of values of respective recovery fields in the FEC header 707 of the FEC packet F3-1 and values in the corresponding fields in the respective RTP headers 605 of the data packets D0, D1, and D3 to D5. The recovery unit 304 sets the calculated value in a corresponding field in the RTP header 605 of the data packet D2.

Alternatively, when the FEC packet F1-1 is received in the example of FIG. 24, a hierarchy that the determination unit 303 recognizes from the hierarchy field of the FEC header 707 of the FEC packet F1-1 is the first layer. As described above, when the hierarchy that the determination unit 303 recognizes is not the lowest layer, according to the expression (5.9), FEC_New( ) is exclusive-OR of the currently received FEC packet and FEC packets that are already received in respective hierarchies deeper than the hierarchy recognized by the determination unit 303.

In the example of FIG. 24, when the FEC packet F1-1 is received, according to the expression (5.9) (more specifically, the expression (5.13)), FEC_New( ) is exclusive-OR of FEC packets, F1-1, F2-1, and F3-2 because n=1<N. Accordingly, the determination unit 303 instructs the recovery unit 304 to recover the data packet D19 by using the FEC packets F1-1, F2-1, and F3-2 and data packets, D18, and D20 to D23.

The recovery unit 304 reads the FEC packets F1-1, F2-1, and F3-2 and data packets, D18, and D20 to D23 from the buffer unit 302 and recovers the data packet D19 by using the read packets. The recovery unit 304 outputs the recovered data packet D19 to the buffer unit 302.

For example, the recovery unit 304 calculates exclusive-OR of FEC level 0 payload 709 of the FEC packets, F1-1, F2-1, and F3-2 and respective RTP payloads 606 of data packets D18, and D20 to D23. The recovery unit 304 sets the calculated result to the RTP payload 606 of the data packet 019.

Moreover, the recovery unit 304 calculates exclusive-OR of values of respective recovery fields in the FEC header 707 of the FEC packets, F1-1, F2-1, and F3-2 and values in the corresponding fields in the respective RTP headers 605 of the data packets D18, and D20 to D23. The recovery unit 304 sets the calculated value in the corresponding field in the RTP header 605 of the data packet D19.

When the lost data packet is recovered on the buffer unit 302 as described above, processing proceeds from operation S216 to operation S217. At operation S217, the determination unit 303 increments the lost packet counter for 1.

In the example of FIG. 24, when the FEC packet F2-1 is received, the determination unit 303 already confirms the loss of the data packet D8 at operation S214 triggered by the reception of the FEC packet F2-1. Accordingly, the determination unit 303 increments the lost packet counter for 1 to reflect the loss of the data packet D8.

Moreover, at operation S218, the determination unit 303 increments the total packet counter for 2 to reflect the current reception of the FEC packet and the loss of one data packet. Processing proceeds to operation S222. The order to execute operations S216 to S218 may be replaced as appropriate.

Operations S219 to S221 are performed if two or more data packets are lost in the above-described "focused block in the N th layer." In other words, if the lost data packet may not be recovered from the data packets and the FEC packet that are already received, operations S219 to S221 are performed. The order to execute operations S219 to S221 may be replaced as appropriate.

For example, at operation S219, the determination unit 303 requests the transmission source device 310 to retransmit all of the two or more lost packets. The retransmission request includes sequence numbers to identify the lost data packets. Moreover, the retransmission request may be performed through the instruction unit 308.

At operation S220, the determination unit 303 increments the lost packet counter for the number of data packets for which retransmission are requested at operation S219. At operation S221, the determination unit 303 increments the total packet counter for the number obtained by adding one to the number of data packets for which retransmission are requested at operation S219. The reason why one is added is to reflect the current FEC packet reception to the total packet counter. A series of processing triggered by the current reception is completed in order to wait for retransmission of the data packets.

Operation S222 is performed after operations S209, S213, S215, or S218 is executed. In other words, processing of operation S222 or later is performed when an FEC packet and all data packets that belong to a block preceding the FEC packet in the N th layer are in the buffer unit 302.

According to the embodiment, at operation S222, the instruction unit 308 calculates a packet loss rate P before error correction (in other words, an error rate of a link between the transmission source device 310 and the transfer device 300). For example, the instruction unit 308 obtains the packet loss rate P before error correction by dividing a value of the lost packet counter by a value of the total packet counter.

Moreover, according to the embodiment, a tolerable error rate A after error correction is defined as a constant. The tolerable error rate A after error correction, for example, may be defined to a program executed by the CPU 201 to achieve the instruction unit 308. The tolerable error rate A after error correction may be any value of 0<A<1. For example, A=0.001.

For example, in streaming data such as video and audio data, even if data is missing to some degree, a person who watches or listens to the video or the audio may not feel unnatural. In other words, depending on a content of payloads of data packets, it may be tolerable even if some of lost data packets may not be recovered.

Moreover, generally in a communication system, retransmission requests with a certain frequency or lower is tolerable regardless of a content of payloads of data packets. The "certain frequency" may differ according to usage and purpose of communication.

Accordingly, an appropriate constant is defined as a tolerable error rate A after error correction according to characteristics of streaming data as described above, and tolerable frequency of occurrence of retransmission requests. In other words, the tolerable error rate A after error correction is a value that is tolerable as a ratio of data packets that may not be recovered.

At operation S222, the instruction unit 308 calculates an appropriate hierarchy depth, Nnew from the calculated packet loss rate P before error correction and defined tolerable error rate A after error correction to obtain desired error correction performance.

It is assumed that one FEC packet is inserted for the number of B data packets. In other words, it is assumed that a block in the lowest layer is made up of the number of B data packets. In the example of FIG. 1, B=6 when the lowest layer is the third layer, while B=12 when the lowest layer is the second layer.

A packet loss rate after error correction using FEC packet is about BP2. This is because, "a data packet may not be recovered even error correction using FEC packet is applied" is substantially the same as "(Q-1) and (Q-2) described below are both established."

(Q-1) The data packet is lost.

(Q-2) One or more data packets of the number of (B-1) remaining data packets that belong to the same block as the certain lost data packet in the N th layer is lost, or an FEC packet that is inserted immediately after the above-described block is lost.

A probability that (Q-1) is established is a packet loss rate P. Moreover, a probability that (Q-2) is established is 1-(1-P)B. The expression (20.2) is established by a binomial theorem.

$$(1-P)^B = \sum_{k=0}^{B} \{{}_BC_k \times 1^k \times (-P)^{B-k}\} \quad (20.2)$$

Furthermore, it is assumed P<<1 for the packet loss rate P. When P<<1, a second-order term or higher may be ignored. Accordingly, the expression (20.2) is obtained from the expression (20.3).

$$(1-P)^B \approx {}_BC_{B-1} \times (-P)^1 + {}_BC_B \times (-P)^0 = -BP+1 \quad (20.3)$$

Thus, when P<<1, a probability that (Q-2) is established is as represented by the expression (20.4).

$$1-(1-P)^B \approx 1-(BP+1)=BP \quad (20.4)$$

Thus, a probability that both (Q-1) and (Q-2) are established is about BP2 as represented by the expression (20.5).

$$P\{1-(1-P)^B\} \approx BP^2 \quad (20.5)$$

Therefore, at operation S222, the instruction unit 308 calculates a value B so that a packet loss rate after error correction BP2 is a tolerable error rate A or lower, and obtains an appropriate hierarchy depth, Nnew from the calculated value of B. In other words, the instruction unit 308 calculates the value of B in the expression (20.7) as a substantially maximum B that satisfies the expression (20.6).

$$BP^2 \leq A \quad (20.6)$$

$$B = A/P^2 \quad (20.7)$$

For example, when A=0.003 and P=0.02, according to the expression (20.7), B=7.5. Accordingly, the instruction unit 308 obtains a depth of the shallowest hierarchy among hierarchies the block size of which is 7.5 or less as an appropriate hierarchy depth, Nnew. In the examples of FIG. 1 or FIG. 14, the block size of the second layer is 12 and that of the third layer is 6, thereby Nnew=3. The instruction unit 308 may refer to the block management table 500 in FIG. 14 in order to recognize a block size.

A relationship among the above-described packet loss rate P before error correction, a tolerable error rate after error correction A and a block size B of the lowest layer is described from a different view point as below. The expression (20.8) is obtained by deforming the expression (20.6).

$$P \leq \sqrt{\frac{A}{B}} \quad (20.8)$$

When a block size of the lowest layer for the current transfer device 300 is assigned to B of the right side of the expression (20.8), if the packet loss rate P before error correction satisfies the expression (20.8), the current error correction performance (also referred to as FEC strength) is sufficient. Conversely, if the expression (20.8) is not satisfied, the current error correction performance is insufficient. Therefore, the instruction unit 308 instructs the transmission source device 310 to make a lowest layer deeper than the N th layer.

At operation S222, when an appropriate hierarchy depth, Nnew is calculated as described above, processing proceeds to operation S223. At operation S223, the instruction unit 308 determines whether the current depth of the lowest layer N is shallower than the calculated appropriate depth of a hierarchy, Nnew. When N<Nnew (in other words, error correction performance is insufficient), processing proceeds to operation S224. Conversely, when N≥Nnew (in other words, error correction performance is sufficient), processing proceeds to operation S225.

At operation S224, the instruction unit 308 transmits an FEC packet increase request to the transmission source device 310. The increase request includes information that specifies an appropriate hierarchy depth, Nnew (for example, the depth Nnew itself, or a difference between the depth Nnew and the depth N). In other words, the instruction unit 308 requests the transmission source device 310 to increase a ratio to insert FEC packets by making substantially maximum depth of a hierarchy to which FEC packets are generated deeper.

After transmitting the increase request, processing proceeds to operation S227 in FIG. 22 or FIG. 23. In other words, when the transfer device 300 operates as a relay node, processing proceeds to operation S227 in FIG. 22 after transmitting the increase request. When the transfer device 300 operates as a leaf node, processing proceeds to operation S227 in FIG. 23 after transmitting the increase request.

At operation S225, the instruction unit 308 determines whether the current depth of the lowest layer N is deeper than the calculated appropriate hierarchy depth, Nnew. When N>Nnew (in other words, error correction performance is excessive), processing proceeds to operation S226.

Conversely, when N=Nnew (in other words, error correction performance is appropriate), processing proceeds to operation S227 in FIG. 22 or FIG. 23. In other words, when the transfer device 300 operates as a relay node, processing proceeds to operation S227 in FIG. 22. When the transfer device 300 operates as a leaf node, processing proceeds to operation S227 in FIG. 23.

At operation S226, the instruction unit 308 transmits an FEC packet reduction request to the transmission source device 310. The reduction request includes information that specifies an appropriate hierarchy depth, Nnew (for example, the depth Nnew itself, or a difference between the depth Nnew and the depth N). In other words, the instruction unit 308 requests the transmission source device 310 to reduce a ratio to insert FEC packets by making a substantially maximum hierarchy to which FEC packet are generated shallower (for example, change from N to Nnew).

After transmitting the reduction request, processing proceeds to operation S227 in FIG. 22 or FIG. 23. In other words, when the transfer device 300 operates as a relay node, processing proceeds to operation S227 in FIG. 22 after transmitting the reduction request. When the transfer device 300 operates as a leaf node, processing proceeds to operation S227 in FIG. 23 after transmitting the reduction request.

A control unit, which is not illustrated, in the buffer unit 302 of the transfer device 300 supplies data packets that belong to a focused block in the N th layer to the upper layer application, which is not illustrated. For example, the control unit in the buffer unit 302 may supply a RTP packet that is a UDP payload 604 of respective data packets that belong to the focused block in the N th layer to a video playback application.

The "focused block in the N th layer" at operation S227 is one of the (R-1) to (R-3) below.

(R-1) When operation S227 is executed after processing proceeds from operation S209 to operation S222, "a preceding block in the N th layer" at operation S208. In the example of FIG. 25, when the data packet D12 is received, the block B3-2 in the third layer to which data packets D6 to D11 preceding the FEC packet F2-1 the loss of which is detected triggered by the reception of the data packet D12 belong.

(R-2) When operation S227 is executed after processing proceeds from operation S213 to operation S227, "a block preceding the N th layer" at operation S222. For example, when the data packet D15 that is retransmitted in the example of FIG. 25 is received, the block B3-3 in the third layer that includes the data packet 15.

(R-3) When operation S227 is executed after processing proceeds from operation S215 to operation S218, "focused block in the N th layer" at operation S214. In the example of FIG. 24, when the FEC packet F3-1 is received, the block B3-1 in the third layer to which the data packets D0 to D5 preceding the FEC packet F3-1 belong. In the example of FIG. 24, when the FEC packet F3-2 is received, the block B3-3 in the third layer to which the data packets D12 to D17 preceding the FEC packet F3-2 belong.

At operation S228, the transmission unit 307 initializes an index "k" to 1 in order to sequentially process entries in the distribution destination management table 400. At operation S229, the transmission unit 307 refers to the "k" th entry in the distribution destination management table 400 and reads a depth of hierarchy of the "k" th transmission destination device 320. When a depth of the hierarchy read by the transmission unit 307 equals to N, processing proceeds to operation S230. When a depth of the hierarchy read by the transmission unit 307 is deeper than N, processing proceeds to operation S232.

At operation S230, the transmission unit 307 transmits data packets 600 that belong to a "focused block in the N th layer" and an FEC packet 700 immediately after the data packets to the k th transmission destination device 320. Processing proceeds to operation S233.

The transmission unit 307 sets an IP address of the k th entry in the distribution destination management table 400 to transmission destination IP address fields of an IP header 601 of the data packets 600 and an IP header 701 of the FEC packet 700. Moreover, the transmission unit 307 sets an IP address of the transfer device 300 in the transmission source IP address field in the IP header 601 and the IP header 701.

At operation S231, the transmission unit 307 transmits the data packets 600 that belong to "focused block in the N th layer" at operation S227 to the k th transmission destination device 320 while thinning out the FEC packets 700. The transmission unit 307 sets the IP header 601 and IP header 701 when transmitting packets as in operation S230. Processing proceeds to operation S233.

The "thinning out" at operation S231 is processing as described below. In other words, when the depth of hierarchy of the "k" th transmission destination device 320 is substantially the same as or deeper than the hierarchy of the FEC packet 700 immediately after "focused block in the N th layer," the transmission unit 307 transmits the FEC packet 700 to the "k" th transmission destination device 320. Conversely, when the depth of a hierarchy of the "k" th transmission destination device 320 is shallower than the hierarchy of the FEC packet 700, the transmission unit 307 does not transmit the FEC packet 700 to the "k" th transmission destination device 320.

In the example of FIG. 24, when the current reception is reception of the FEC packet F2-1, the "focused block in the N th layer" is the block B3-2 to which the data packets D6 to D11 belong. The hierarchy of the FEC packet F2-1 immediately after the block B3-2 is the second layer.

Accordingly, the transmission unit 307 transmits the FEC packet F2-1 to the "k" th transmission destination device 320, when the depth of the hierarchy of the "k" th transmission destination device 320 is the second layer or deeper. Conversely, the transmission unit 307 does not transmit the FEC packet F2-1 to the "k" th transmission destination device 320, when the depth of the hierarchy of the "k" th transmission destination device 320 is shallower than the second layer (in other words, the first layer).

At operation S232, the data packets 600 that belong to the "focused block in the N th layer" at operation S227 are transmitted to the "k" th transmission destination device 320 while one or a plurality of FEC packets 700 is being added by collaboration of the generation unit 306 and the transmission unit 307. The transmission unit 307 sets the IP header 601 and the IP header 701 as in the operation S230 when transmitting packets. Processing proceeds to operation S233.

Adding the FEC packet 700 at operation S232 is substantially the same processing as that described by referring to FIG. 7. In the example of FIG. 24, it is assumed that the current reception is reception of the FEC packet F2-1 and the depth of the hierarchy of the "k" th transmission destination device 320 is the fourth layer.

In this case, as described above, the "focused block in the N th layer" is the block B3-2 to which the data packets D6 to D11 belong. Thus, the generation unit 306 refers to the block management table 500 and searches for an entry the hierarchy of which is deeper than the N th layer and is up to the depth of the hierarchy of the "k" th transmission destination device 320. As a result of the search, the generation unit 306 finds an entry corresponding to the block B4-3 in the fourth layer included as a subset in the block B3-2.

Accordingly, the generation unit 306 reads the data packets D6 to D8 that belong to the block B4-3 from the buffer unit 302 according to the found entry, and generates the FEC packet F4-2 from the data packets D6 to D8. The generation unit 306 outputs the generated FEC packet F4-2 to the buffer unit 302.

Moreover, the generation unit 306 notifies the transmission unit 307 that the newly generated packet is typically the FEC packet F4-2 and the order of the FEC packet F4-2 is immediately after the data packet D8. The transmission unit 307 transmits the data packets D6 to D8, the FEC packet F4-2, and the data packets D9 to D11 to the "k" th transmission destination device 320.

Depending on the depth of hierarchy of the "k" th transmission destination device 320, the generation unit 306 may generate a plurality of FEC packets 700 in a plurality of hierarchies at operation S232. Moreover, operation S232 may be performed for the eighth transmission destination device 320 as well after the generation unit 306 generates the FEC packet 700 in the fourth layer, for example, for the fifth transmission destination device 320. In this case, the generation unit 306 does not need to regenerate the same FEC packet 700 in the fourth layer. The transmission unit 307 may transmit the FEC packet 700 in the fourth layer that is already generated for the fifth transmission destination device 320 and stored in the buffer unit 302 to the eighth transmission destination device 320 (after rewriting the IP header 701 appropriately).

At operation S233, the transmission unit 307 determines whether the index "k" is less than the number of transmission destination devices 320 (in other words, the number of entries Z in the distribution destination management table 400). If the index "k" is less than the number Z of transmission destination devices 320, processing proceeds to operation S234. Conversely, if the index "k" reaches the number Z of transmission destination devices 320, processing proceeds to operation S235.

At operation S234, the transmission unit 307 increments the index "k" for 1. Processing returns to operation S229.

Moreover, at operation S235, the transmission unit 307 instructs the buffer unit 302 to delete all of the data packets that belong to the "focused block in the N th layer" in operation S227. For example, the transmission unit 307 specifies sequence numbers of the data packets to be deleted to the buffer unit 302. The buffer unit 302 deletes the specified data packets.

If operation S232 is executed at least once in a repetition loop of operations S229 to S234, at operation S235, the transmission unit 307 further instructs the buffer unit 302 to delete the FEC packets generated by the generation unit 306 at operation S232. The buffer unit 302 deletes the FEC packets in a hierarchy deeper than the N th layer according to the instruction.

At operation S236, the buffer unit 302 determines whether the "focused block in the N th layer" in operation S227 is the last block in the N th layer among blocks in the first layer by referring to, for example, the block management table 500. When the "focused block in the N th layer" in operation S227 is the last block in the N th layer among blocks in the first layer, processing proceeds to operation S237. Conversely, when the "focused block in the N th layer" is a block at a position other than the last block in the N th layer among blocks in the first layer, processing triggered by the current reception is completed.

For example, when the "focused block in the N th layer" is the block B3-4 to which the data packets D18 to D23 belong, processing proceeds to operation S237. Conversely, when the "focused block in the N th layer" is a block B3-3 to which the data packets D12 to D17 belong, processing is completed. At operation S237, the buffer unit 302 deletes all of the FEC packets retained therein. Processing triggered by the current reception is completed.

In the transfer device 300 that operates as a leaf node, after operations S224, S225, or S226, processing proceeds to operation S227 in FIG. 23. Operations S227, S235, S236, and S237 illustrated in FIG. 23 are substantially the same as those in FIG. 22, and will not be described in detail. In other words, the transfer device 300 that operates as a leaf node does not perform transfer processing in operations S228 to S234 in FIG. 22 but perform operation S235 or later immediately after performing operation S227.

The above-described embodiment may be described as below from the perspective that generating an FEC packet is common to both at a root node and at a relay node in which the relay node generates an FEC packet to deepen the hierarchy. In other words, among various types of processing performed by a computer such as the transfer device 200 and the transfer device 300, the above-described embodiment may be summarized as below by focusing on the generation of an FEC packet.

In other words, according to a program, a computer such as the transfer device 200 and the transfer device 300 obtain a plurality of data units that belong to the same first block in a hierarchy among hierarchical blocks defined by a plurality of hierarchies.

The "data unit" is, for example, a RTP payload 606 in the data packet 600. The "acquisition" at a root node is "acquisition" of data units supplied by a data packet supply unit and "acquisition" at a relay node is "acquisition" by reception of data units from a parent node (for example, transmission source device 310 for the transfer device 300).

When a "certain hierarchy" is the first layer which is the top layer, "a plurality of data units" is, for example, RTP payloads 606 of respective data packets D0 to D23. In other words, the "first block" is the block B1-1.

Moreover, when the "certain hierarchy" is the second layer, "the plurality of data units" is, for example, RTP payloads 606 of respective data packets D0 to D11. In other words, "the first block," in this case, is the block B2-1.

Moreover, when the "certain hierarchy" is the third layer, "the plurality of data units" is, for example, RTP payloads 606 of respective data packets D0 to D5. In other words, "the first block," in this case, is the block B3-1.

Moreover, when the "certain hierarchy" is the third layer, another example of "the plurality of data units" is RTP payloads 606 of respective data packets D12 to D17. In other words, "the first block" is the block B3-3.

Moreover, the computer generates error correction information that corresponds to the first block that equals to exclusive-OR of the above-described "plurality of data units." The "error correction information" is, for example, an FEC level 0 payload 709 of the FEC packet 700. For example, when "a plurality of data units" is the RTP payloads 606 of respective data packets D0 to D23, the error correction information is an FEC level 0 payload 709 of the FEC packet F1-1.

The computer performs the following processing for each of one or more hierarchies which are continuous from and lower than the above-described "certain hierarchy." In other words, the computer performs the following processing for one or more individual blocks other than one specific block among two or more blocks in each individual hierarchy that are included in the same block in a hierarchy that is one hierarchy above the each hierarchy. For example, the computer generates error correction information corresponding to the individual block and that equals to exclusive-OR of all data units that belong to the individual block among the "plurality of data units."

The "one specific block" is the last block in two or more blocks included in the same block in the hierarchy that is one hierarchy above. For example, "one specific block" in the second layer is the last block B2-2 between the block B2-1 and the block B2-2 in the second layer that are included in the same block B1-1 in the first layer. Accordingly, the "individual block" for which error correction information is generated is the block B2-1.

The "one specific block" in the third layer is, for example, the last block B3-2 between the block B3-1 and the block B3-2 in the third layer that are included in the same block B2-1 in the second layer. Accordingly, the "individual block" for which error correction information is generated is the block B3-1.

The "one specific block" may be, for example, the first block of two or more blocks that are included in the same block in a hierarchy that is one hierarchy above as long as increase in memory consumption or delay in network transfer do not cause problems.

For example, "one specific block" may be the first block B2-1 between the block B2-1 and the block B2-2 that are subsets of the block B1-1. In this case, an FEC packet is generated for the block B2-2, and the generated FEC packet is inserted immediately before the block B2-2 (in other words, between the data packets D11 and D12). The processing applies to hierarchies other than the second layer. When "one specific block" is the first block, the FEC packet for the block B1-1 in the first layer that is the top layer is inserted immediately before the block B1-1 (in other words, immediately before the data packet D0).

Moreover, the computer transmits error correction information for the above-described "plurality of data units" and "the first block," and error correction information for each of "individual block." The above-described operations of the computer corresponds to the operation that the root node generates FEC packets from the first layer to the N th layer and transmits the generated FEC packets.

The above-described operations of the computer corresponds to the operation that the relay node receives a series of data packets that belong to blocks in the first layer or deeper, generates FEC packets for several hierarchies by using the received data packets and transmits the generated FEC packets. The generation of the FEC packets by the relay node may be performed, for example, to recover a lost FEC packet or to make a hierarchy deeper.

Moreover, the computer may generate error correction information for the "first block" after generating and using the error correction information for the "individual block." In other words, the computer may generate the error correction information for the "first block" according to the expression (4.3).

In other words, the computer recognizes, in the above-described "each of one or more individual hierarchies that are continuous from and is lower than the certain hierarchy," the last block in the each individual hierarchy among one or more blocks that are included in "the first block" and for which error correction information are generated. The computer calculates error correction information for each block that is recognized for each hierarchy and exclusive-OR of all data units that are included in the first block among a plurality of blocks in the lowest layer in the "each of the one or more hierarchies" and that belong to the last block in the lowest layer.

For example, when "the certain hierarchy" is the first layer while the lowest layer is the third layer, the computer generates FEC level 0 payload 709 of the FEC packet F1-1 as error correction information by calculating exclusive-OR of the following (S-1) to (S-2).

(S-1) Respective FEC level 0 payloads 709 of the FEC packet F2-1 corresponding to the block B2-1 and the FEC packet F3-2 corresponding to the block B3-3.

(S-2) Respective RTP payloads 606 of the data packets D18 to D23 that are included in the block B1-1 and that belong to the last block B3-4 in the third layer.

The computer may not use error correction information for a block in a lower layer that is already generated. In other words, the computer may generate error correction information for the "first block" by calculating exclusive-OR of all data units that belong to the "first block" (for example, the block B1-1).

The above overview describes points common to the root node and the relay node by focusing on generation of error correction information. Meanwhile, overview of the embodiment will be described below from the perspective of points common to the relay node and the leaf node.

In other words, a computer such as a transfer device 200 or a transfer device 300 receives some or all of a plurality of data units that belong to the first block in a certain hierarchy among hierarchical blocks defined by a plurality of hierarchies. The "certain hierarchy" may be, for example, the first layer, or deeper layers such as the second layer and the third layer.

Moreover, when the "certain hierarchy" is higher than the determined lowest layer, the computer receives error correction information for each hierarchy up to the lowest layer. For example, when the "certain hierarchy" is the first layer and the lowest layer is the third layer, the computer receives error correction information for the second layer and the third layer.

For example, error correction information received for each hierarchy corresponds to one or more individual blocks in the hierarchy other than the last one block in two or more blocks in the hierarchy that are included in the same block in a hierarchy that is one hierarchy above the hierarchy. Furthermore, error correction information received for each hierarchy equals to exclusive-OR of all data units that belong to the individual block.

For example, (FEC level 0 payload 709 of) the FEC packet F2-1 as an example of the error correction information received by the second layer corresponds to the block B2-1 that is not the last block between the block B2-1 and the block B2-2 that are included in the same block B1-1 in the first layer. The FEC level 0 payload 709 of the FEC packet F2-1 equals to exclusive-OR of respective RTP payloads 606 of all data packets D0 to D11 that belong to the block B2-1.

Moreover, the computer receives error correction information that corresponds to the "first block" and equals to exclusive-OR of all of a plurality of data units that belong to the "first block." For example, when the "first block" is the block B1-1, the computer receives the FEC packet F1-1 that includes the FEC level 0 payload 709 as error correction information. Moreover, when the "first block" is the block B2-1, the computer receives the FEC packet F2-1 that includes the FEC level 0 payload 709 as error correction information.

The computer determines whether there is any lost data unit that the computer may not receive among a plurality of data units that belong to the "first block." If there is any lost data unit, the computer recovers the lost data unit by calculating exclusive-OR. The recovery is performed, for example, as below.

When the "certain hierarchy" is the lowest layer, the computer calculates exclusive-OR of all data units that may be received among data units that belong to the "first block" that is also the lowest layer block and error correction information for the "first block." The lost data unit is recovered by calculating the exclusive-OR.

In the example of FIG. 24, it is assumed that the "certain hierarchy" is the lowest layer, the third layer, and the "first block" is the block B3-1. In FIG. 24, the data packet D2 that belongs to the block B3-1 is lost. In this case, the computer recovers the "lost data unit" (in other words, the RTP payload 606 of the data packet D2) by calculating exclusive-OR of (T-1) to (T-2) described below.

(T-1) Respective RTP payloads 606 of data packets D0, D1, D3 to D5 that belong to the block B3-1.

(T-2) FEC level 0 payload 709 of the FEC packet F3-1 that corresponds to the block B3-1.

Moreover, when the "lowest layer block" that the lost data unit belongs in the lowest layer is "the last one block in two or more blocks", the computer recovers the lost data unit by either one of two methods below.

In the first method, the computer recovers a lost data unit by calculating exclusive-OR of (U-1) to (U-2) below.

(U-1) In each hierarchy from the "certain hierarchy" to the lowest layer, error correction information for the last block of one or more blocks in the same hierarchy that are included in the above-described "first block" and for which error correction information is received.

(U-2) All data units that may be received in one or more data units and that belong to the "lowest layer block."

In the example of FIG. 24, it is assumed that the "certain hierarchy" is the second layer, and the first block is the block B2-1. In this case, "the last block of one or more blocks in the same hierarchy that are included in the "first block" and for which error correction information is received" is the block B2-1 itself and the block B3-1 in the third layer.

In the example of FIG. 24, the data packet D8 that belongs to the block B2-1 is lost. The lowest layer block to which the lost data packet D8 belongs in the lowest layer, the third layer is the block B3-2.

Accordingly, the computer recovers "lost data unit" (in other words, RTP payload 606 of the data packet D8) by calculating exclusive-OR of (V-1) to (V-2) below.

(V-1) Respective FEC level 0 payloads 709 of FEC packet F3-1 and FEC packet F2-1 that correspond to the block B3-1 and the block B2-1.

(V-2) RTP payloads 606 of the data packets D6, D7, and D9 to D11 that belong to the block B3-2.

Alternatively, in the example of FIG. 24, it is assumed that the "certain hierarchy" is the first layer and the first block is B1-1. In this case, "the last block of one or more blocks in the same hierarchy that is included in the "first block" and for which error correction information is received" is the block B1-1 itself, the block B2-1 in the second layer, and the block B3-3 in the third layer.

In the example of FIG. 24, the data packet D19 that belongs to the block B1-1 is lost. The lowest layer block to which the lost data packet D19 belongs in the lowest layer, the third layer is the block B3-4.

Accordingly, the computer recovers the "lost data unit" (in other words, RTP payload 606 of the data packet D19) by calculating exclusive-OR of (W-1) to (W-2) below.

(W-1) Respective FEC level 0 payloads 709 of FEC packet F2-1 and FEC packet F3-2 that correspond to the block B2-1, the block B3-3, and the block B1-1 respectively.

(W-2) Respective RTP payloads of the data packets D18 and D20 to D23 that belong to the block B3-4.

In other words, when there is any lost data unit, the recovery according to the embodiment described by referring to FIGS. 20 to 25 may be generalized as described above by assuming a hierarchy that corresponds to the first error correction information after the lost data unit as the "certain hierarchy."

For example, as illustrated in FIG. 24, reception of a block B2-1 that is the subset of the block B1-1 is completed before the reception of the block B1-1 is completed. Accordingly, when reception of the block B2-1 except for the lost data packet D8 and FEC packet F2-1 that corresponds to the block B2-1 is completed, the computer may perform processing for a case that the certain hierarchy is the second layer and the first block is the block B2-1. As a result, the data packet D8 is recoverd at timing when the reception of the block B2-1 and the FEC packet F2-1 is completed.

In other words, the data packet D8 belongs to the block B1-1 in the first layer. However, recovery of the data packet D8 is already completed before the computer starts processing for a case that the "certain hierarchy" is the first layer and the first block is the block B1-1. Thus, according to operation of the computer that is overviewed above, it is implicitly assumed that the RTP payload 606 of the recovered data packet D8 is not the "lost data unit" when the "certain hierarchy" is the first layer, and the first block is the block B1-1.

Meanwhile, the data packet D19 belongs to the block B2-2 in the second layer, and the block B2-2 is the last block in the blocks in the second layer that are included in the block B1-1 in the first layer. Accordingly, when reception of the block B2-2 is completed, reception of the block B1-1 is completed. Thus, recovery of the data packet D19 that belongs to the block B2-2 in the second layer is achieved by operation of the computer when the "certain hierarchy" is the first layer and the "first block" is the block B1-1.

The second method to recover a lost data unit when the "the lowest layer block" to which the lost data unit belongs in the lowest layer is "the last one block in two or more blocks" will be described below.

According to the second method, the computer calculates exclusive-OR of all data units other than the lost data unit that belong to the "first block" and that are obtained by reception or by recovery that is already performed and error correction information that corresponds to the "first block." The lost data unit is recovered by the calculation of the exclusive-OR.

In the example of FIG. 24, it is assumed that the "the certain hierarchy" is the first layer and the "first block" is the block B1-1. In this case, the computer may recover the RTP payload 606 of the lost data packet D19 by the following method.

In other words, the computer may recover the "lost data unit" (in other words, RTP payload 606 of the data packet D19) by calculating exclusive-OR of the following (X-1) to (X-3).

(X-1) Respective RTP payloads 606 of data packets D0, D1, D3 to D7, D9 to D18, and D20 to D23 that are obtained by reception.

(X-2) Respective RTP payloads 606 of data packets, D2 and D8 that are obtained by recovery.

(X-3) FEC level 0 payload 709 of FEC packet F1-1.

Moreover, a computer that recovers the lost data unit as described above may transmit all data units that are acquired by reception or recovery and that belong to the "first block" to a transmission destination device. In other words, the computer may operate as a relay node. When transmitting the data units, the computer inserts error correction information between data units with an appropriate ratio and also transmits the error correction information to the transmission destination device.

For example, the computer that operates as a relay node acquires hierarchy information that corresponds to a communication route between the transmission destination device and the computer. The hierarchy information is, for example, a value of the hierarchy field of the distribution destination management table 400. Moreover, an initial value of the hierarchy information may be a certain default value, however the value may be dynamically specified with an appropriate frequency by the transmission destination device.

The computer transmits, all pieces of error correction information corresponding to any block in a specified hierarchy indicated by the hierarchy information or higher hierarchies among hierarchies from a "certain hierarchy" to the lowest layer to the transmission destination device.

For example, when the "certain hierarchy" is the first layer, the lowest layer is the third layer and the specified layer is the second layer, the computer transmits all pieces of error correction information that corresponds to any of the blocks in the first layer or the second layer. For example, when the "certain hierarchy" in "the first block" is the block B1-1, the computer transmits (Y-1) and (Y-2) below.

(Y-1) FEC packet F1-1 that includes error correction information corresponding to the block B1-1 as the FEC level 0 payload 709.

(Y-2) FEC packet F2-1 that includes error correction information corresponding to the block B2-1 as the FEC level 0 payload 709.

When the specified hierarchy is lower than the lowest layer, the computer generates error correction information within a range of the "first block" for each of the hierarchies that is or higher than the specified hierarchy. For example, the computer generates error correction information for each of one or more blocks in two or more blocks other than the last one block in the hierarchy that is an error correction information generation target hierarchy and the blocks are included in the same block in one hierarchy above the hierarchy. The error correction information to be generated equals to exclusive-OR of all data units that belong to the individual block. Moreover, the computer transmits error correction information that is generated as described above to the transmission destination device.

For example, when the lowest layer is the second layer and the specified layer is the fourth layer, the computer generates error correction information for the third layer and the fourth layer. For example, when the "certain hierarchy" is the first layer and the "first block" is the block B1-1, the computer generates the FEC level 0 payloads 709 of FEC packets, F3-1 and F3-2 respectively as error correction information for the third layer. Moreover, the computer generates the FEC level 0 payloads 709 of FEC packets, F4-1, F4-2, F4-3, and F4-4 respectively.

The present disclosure is not limited to the above-described embodiments, but may be modified into various forms. Hereinafter, various perspectives of alternative embodiments of the above-described embodiments will be described. For example, the embodiments may be modified in various manners from perspectives described below. Any of the alternative embodiments may be combined as long as they do not contradict each other.

The first perspective of alternative embodiments is related to a type of data to be transmitted and a packet format. According to the above-described embodiments, MPEG 2 data that is transmitted by RTP packet is exemplified. However, any type of data may be transmitted (in other words, a content of payload of data packet). For example, multicast for sharing a file may be performed instead of ALM for streaming distribution.

Moreover, the packet formats illustrated in FIGS. 15 to 17 are just examples. Depending on the embodiment, the RTP may not be used. Furthermore, depending on the embodiment, Transmission Control Protocol (TCP) may be used instead of UDP.

For example, instead of extending the existing protocol defined by RFC 5109, an original protocol may be used. The original protocol may be defined, for example, as a protocol of an upper layer of UDP or TCP.

A header of the original protocol includes a field to store information to distinguish a data packet and an FEC packet. Information to distinguish a data packet and an FEC packet may be, for example, 1 bit flag, or a longer flag such as a payload type field in the RTP header. In the FEC packet, the header of the original protocol further includes information that indicates a hierarchy of the FEC packet and information to distinguish data packets that are related to the FEC packet.

The data packet includes any type of payload after the header of the above-described original protocol. The FEC packet includes exclusive-OR of payloads of the corresponding plurality of data packets after the header of the original protocol.

The second perspective of alternative embodiment is related to extension of the packet formats in FIGS. 15 to 17. In the example of FIG. 15, the level 0 is typically used, however the level may be extended to a plurality of levels. Generally, in streaming data, important information tends to be included at a position closer to a head of a payload. Thus, RFC 5109 defines a usage of a plurality of levels in order to protect data by applying more FEC packets at a position closer to the head of the payload.

For example, the above-described embodiments may be extended so that L0 bytes from a head of RTP payload 606 of the data packet 600 is protected by a level 0 and the remaining L1 bytes by a level 1. For example, it is assumed that hierarchical blocks are defined as in FIG. 1 and the lowest layer for the transfer device 300 is the N th layer. Accordingly, an embodiment is possible in which L0 bytes from a head of the RTP payload 606 are protected by FEC packets up to the N th layer, and the remaining L1 bytes by FEC packets up to the (N-1) layer.

For example, it is assumed that N=3. An FEC packet corresponding to the block B3-1 includes exclusive-OR of L0 bytes from the head of respective RTP payloads 606 of data packets D0 to D5 that belong to the block B3-1 as the FEC level 0 payload 709. However, an FEC packet corresponding to the block B3-1 in the lowest layer does not include an FEC level 1 header and an FEC level 1 payload.

The FEC packet corresponding to the block B3-3 includes exclusive-OR of L0 bytes from the head of respective RTP payloads 606 of data packets D12 to D17 that belong to the block B3-3 as the FEC level 0 payload 709. However, an FEC packet corresponding to the block B3-3 does not include an FEC level 1 header and an FEC level 1 payload.

The FEC packet corresponding to the block B2-1 includes exclusive-OR of L0 bytes from the head of respective RTP payloads 606 of data packets D0 to D11 that belong to the block B2-1 as the FEC level 0 payload 709. Moreover, the FEC packet corresponding to the block B2-1 includes exclusive-OR of the remaining L1 bytes of the RTP payloads 606 of respective data packets D0 to D11 that belong to the block B2-1 as an FEC level 1 payload.

Moreover, the FEC packet corresponding to the block B1-1 includes exclusive-OR of L0 bytes from the head of respective RTP payloads 606 of data packets D0 to D23 that belong to the block B1-1 as the FEC level 0 payload 709. Moreover, the FEC packet corresponding to the block B1-1 includes exclusive-OR of the remaining L1 bytes of the respective RTP payloads 606 of data packets D0 to D23 that belong to the block B1-1 as an FEC level 1 payload.

As described above, in RTP payload 606 of the data packet 600, exclusive-OR of portions corresponding to level p (0≤p) may be set as FEC level p payload of the FEC packet 700 corresponding to each block from the first layer to the (N-p) layer.

The third perspective of alternative embodiment is related to the above-described assumption (O-1). The transfer device 300 may accumulate received packets in the buffer unit 302 for a certain period and may start processing of operation S202 or later instead of performing processing of operation S202 or later immediately after receiving and storing packets according to the above-described embodiment. Accordingly, the assumption (O-1) may be established without using any control packet.

The "certain period" may be until the FEC packet, for example, for the N th layer (in other words, the lowest layer) is received. For example, the transfer device 300 may typically accumulate received data packets D0 to D5 in the buffer unit 302 while the data packets D0 to D5 are being received.

The transfer device 300 recognizes a sequence number of a data packet D0 of a head of a stream triggered by reception of the first FEC packet F3-1 in the third layer, and may start processing of operation S202 or later for the packets that are already accumulated. For example, the transfer device 300 may recognize a value of an SB base field of the FEC packet F3-1 as a sequence number of the data packet D0 of the head of the stream.

As described above, the embodiment in which the transfer device 300 accumulates packets for a certain period and starts processing of the accumulated packets is advantageous in that even if received order of packets are replaced from the order of transmission, influence of the replacement of the order may be absorbed to a certain degree.

The fourth perspective of alternative embodiments are related to a burst packet loss. The embodiment is described in terms of mainly FEC packets and some of the exceptional processing is not described. According to the embodiment, the transfer device 300 may further perform exceptional processing, which is not described according to the embodiment.

For example, packets may be lost for entire one block in the N th layer, or consecutive packets may be bursty lost for a larger range. When a period that reception of packets is stopped exceeds the certain threshold, the transfer device 300 may request retransmission of the packets without waiting for receiving any packet in order to prepare for bursty packet loss.

The fifth perspective of alternative embodiments is related to omission of a retransmission request. Depending on an embodiment, retransmission requests of operations S210 and S219 may not be performed as appropriate. In other words, the transfer device 300 may perform operations of S222 to S237 even if all data packets of the N th layer are not completed.

For example, even if a part of data such as video or audio is missing to some degree, a person who watches or listens to the video or the audio may not feel unnatural. In other words, depending on a type of a payload of a data packet, it may be tolerable even if all data packets may not be completed.

Up to which depth of hierarchy the transmission source device 310 transmits FEC packets is adjusted by operations S222 to S226 in FIG. 20, and adjustment is appropriately settled according to a tolerable error rate after error correction. After the adjustment is appropriately settled, even if certain data packets may not be recovered, a ratio of data packets that may not be recovered equals to or lower than the tolerable error rate A after error correction. Thus, depending on the embodiment, the retransmission request may not be performed.

The sixth perspective of alternative embodiments is related to a frequency that the transfer device 300 requests the transmission source device 310 to increase or decrease FEC packet. According to the embodiment in FIG. 20, the transfer device 300 verifies whether a depth of hierarchies is appropriate for once for each block in the N th layer (the lowest layer), and requests the transmission source device 310 to increase or decrease FEC packets as needed. However, a request may be performed at any frequency depending on the embodiment.

For example, depending on an embodiment, a frequency that "once for each block of the number of M (1≤M) blocks in the first layer" may be employed instead of the above-described "once for each block in the N th layer."

The seventh perspective of alternative embodiments is related to timing when the transfer device 300 that operates as a relay node transfers a packet. According to the embodiment in FIG. 20, the transfer device 300 accumulates received packets in the buffer unit 302 instead of transferring the received packets immediately, and transfers packets after all data packets in one block in the N th layer are completed. Therefore, a delay in transfer that corresponds to a block size of the N th layer is caused.

However, a length of time that packets received by the transfer device 300 are accumulated in the buffer unit 302 may be any length depending on an embodiment. For example, the transfer device 300 may immediately transfer data packets that are received from the transmission source device 310 to the transmission destination device 320. In this case, the transfer device 300 does not discard the transferred data packets immediately, but stores the transferred data packets in the buffer unit 302 in case of loss of other data packets that belong to the same block in the N th layer.

The eighth perspective of alternative embodiments is related to a method to acquire the first or the second hierarchy information from an error rate (in other words, a packet loss rate). For example, when the transmission destination device 320 notifies an error rate itself to the acquisition unit 305, the acquisition unit 305 calculates an appropriate hierarchy depth according to the expression (20.7) and a definition of a block size in the block management table 500. The calculated result may be acquired as the first hierarchy information. Alternatively, the instruction unit 308 calculates an appropriate hierarchy depth according to the expression (20.7) and a definition of a block size in the block management table 500 from an error rate and may notify the calculated result to the transmission source device 310 as the second hierarchy information.

However, the acquisition unit 305 and the instruction unit 308 may acquire hierarchy information by referring to a table that stores a lower limit and an upper limit of error rates in association with a hierarchy depth instead of performing calculation.

For example, the instruction unit 308 searches the table and identify an entry that represents a range that includes an error rate of a link between the transmission source device 310 and the transfer device 300 by a pair of a lower limit and an upper limit. The instruction unit 308 acquires a hierarchy stored in the identified entry as the second hierarchy information and transmits the acquired second hierarchy information to the transmission source device 310.

Likewise, the acquisition unit 305 may acquire the first hierarchy information by referring to the table instead of performing calculation. A value of each entry in the table is set based, for example, on a tolerable error rate after error correction.

The ninth perspective of alternative embodiments is related to a data format retained by the transfer device 300. For example, although data is illustrated by a table format in FIGS. 13 and 14, any data format (for example, an array or a linear list) other than a table may be used.

The tenth perspective of alternative embodiments is related to functions used for generation of error correction information and recovery using the error correction information. According to the embodiment, calculation of exclusive-OR is performed for both the generation of error correction and recovery using the error correction information. However, other functions may be used depending on an embodiment.

For convenience of description, "ui" is assumed to be a data unit. In other words, "ui" is any bit sequence, and for example, a payload of a data packet.

A function "f" to calculate error correction information from a set of data units $\{ui|0 \leq i<n\}$ is represented by the expression (A.1) below.

$$f(\{ui|0i<n\}) \quad (A.1)$$

A function "g" that recovers lost data units, $uj(\square j, 0 \leq j<n)$ are represented by the expression (A.2) below.

$$uj=g(\{ui|0\square i<n, i\approx j\}U\{f(\{ui|0i<n\})\}) \quad (A.2)$$

The function "f" and the function "g" may be any function as long as the expressions (A.3) and (A.4) are satisfied. A set S1 and a set S2 in the expressions (A.3) and (A.4) are assumed to be non-empty sets in which elements are data units.

$$f(S1US2) = f(\{f(S1)\}US2) \quad (A.3)$$

$$uj = g(S1US2U\{f(S1US2U\{uj\})\}) \quad (A.4)$$
$$= g(\{f(S1)\}US2U\{f(S1US2U\{uj\})\})$$

The above-described embodiments are examples that f(S) for a set S is defined as "a function that is exclusive-OR of the respective elements in the set S" and g(S) is defined as "a function that is exclusive-OR of the respective elements in the set S" as well. The function "f" defined as described above satisfies the expression (A.3) may be understood from, for example, a case that a set (S1US2) is a block B1-1, or a case that a set S1 is a block B2-1. Moreover, the function "g" defined as described above satisfies the expression (A.4) may be understood from, for example, a set (S1US2U{uj}) is a block B1-1, or a case that a set S1 is entire combination of the block B2-1 and the block B3-2, or a block B2-1.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A non-transitory computer-readable medium storing a program causing a computer to execute a process comprising:
   acquiring a plurality of data units that belong to a first block in a certain hierarchy among hierarchical blocks defined by a plurality of hierarchies;
   generating error correction information corresponding to the first block that equals to an exclusive-OR of the plurality of data units;
   generating, in each individual hierarchy of one or more individual hierarchies that are continuous from and are lower than the certain hierarchy, error correction information corresponding to each individual block that equals to exclusive-OR of all data units that belong to the individual block among the plurality of data units, where the individual block is one or more individual blocks other than one specific block in two or more blocks in the individual hierarchy that are included in a same block in a hierarchy that is one hierarchy above the individual hierarchy;
   transmitting the plurality of data units;
   transmitting the error correction information corresponding to the first block; and
   transmitting the error correction information corresponding to each individual block, wherein a ratio of error correction information is different for each of the one or more individual hierarchies that are continuous from and are lower than the certain hierarchy, the ratio of error correction being less than or equal to an upper threshold for a first error rate and the ratio of error correction being greater than or equal to a lower threshold for a second error rate.

2. The non-transitory computer-readable recording medium according to claim 1,
   wherein the one specific block is a last block in the two or more blocks;
   wherein the generating the error correction information corresponding to the first block includes calculating the exclusive-OR of:
   respective pieces of the error correction information corresponding to the last block in one or more blocks in each individual hierarchy of one or more individual hierarchies where the one or more blocks are included in the first block and for which error correction information are generated and
   all data units that are included in the first block among the plurality of blocks in the lowest layer in the one or more hierarchies and that belong to the last block in the lowest layer.

3. The non-transitory computer-readable recording medium according to claim 1,
   wherein the generating the error correction information corresponding to the first block includes calculating the exclusive-OR of the plurality of data units by using all of the plurality of data units that belong to the first block.

4. The non-transitory computer-readable recording medium according to claim 1,
   wherein each block in each hierarchy among the plurality of hierarchies other than the lowest layer includes two blocks that are included in a hierarchy that is the one hierarchy below the each hierarchy.

5. A non-transitory computer-readable medium storing a program causing a computer to execute a process comprising:
   receiving all or some of a plurality of data units that belong to a first block in a certain hierarchy among hierarchical blocks defined by a plurality of hierarchies;

when the certain hierarchy is higher than a defined lowest layer, for each hierarchy that is lower than the certain hierarchy up to the defined lowest layer within a range of the first block, receiving error correction information corresponding to each of one or more individual blocks other than a last one block in the hierarchy in two or more blocks of the hierarchy that are included in a same block in a hierarchy that is one hierarchy above the hierarchy and that equals to exclusive-OR of all data units that belong to the individual block;

receiving error correction information corresponding to the first block and that equals to an exclusive-OR of all of the plurality of data units that belong to the first block;

determining whether there is any lost data unit that may not be received among the plurality of data units that belong to the first block;

when there is the lost data unit and the certain hierarchy is the lowest layer, recovering the lost data unit by calculating the exclusive-OR of all data units that may be received among data units that belong to the first block and the error correction information corresponding to the first block;

when there is the lost data unit, and a lowest layer block to which the lost data unit belongs in the lowest layer is the last one block in the two or more blocks in the lowest layer;

recovering the lost data unit by one of:

calculating the exclusive-OR of respective pieces of the error correction information corresponding to the last block in one or more blocks in each hierarchy from the certain hierarchy to the lowest layer where the block is included in the first block and for which error correction information is received and all data units that may be received in one or more data units that belong to the lowest layer block; and calculating the exclusive-OR of all data units that belong to the first block acquired by reception or by recovery that is already performed other than the lost data unit and the error correction information corresponding to the first block, wherein a ratio of error correction information is different for each of the one or more hierarchies that are continuous from and are lower than the certain hierarchy, the ratio of error correction being less than or equal to an upper threshold for a first error rate and the ratio of error correction being greater than or equal to a lower threshold for a second error rate.

6. The non-transitory computer-readable recording medium according to claim 5, the program causing the computer to execute the process further comprising:

acquiring hierarchy information corresponding to a communication route between a transmission destination device and the computer;

transmitting the plurality of data units that belong to the first block acquired by reception or recovery to the transmission destination device; and transmitting all of the error correction information corresponding to any block in each hierarchy that is the same as a specified hierarchy indicated by the hierarchy information or higher among hierarchies from the certain hierarchy to the lowest layer to the transmission destination device.

7. The non-transitory computer-readable recording medium according to claim 5, the program causing the computer to execute the process further comprising:

when the specified hierarchy is lower than the lowest layer, for each hierarchy that is lower than the lowest layer and that is the same as the specified hierarchy or higher within a range of the first block, generating error correction information corresponding to each of one or more individual blocks other than the last block in two or more blocks in the hierarchy that are included in the same block in a hierarchy that is the one hierarchy above the hierarchy and that equals to the exclusive-OR of all data units that belong to the individual block; and transmitting the generated error correction information to the transmission destination device.

8. A communication apparatus comprising:

a memory; and a processor configured to execute a plurality of instructions stored in the memory comprising, receiving data from a transmission source device, the data including:

some or all of a plurality of data units that belong to a first block in a certain hierarchy among hierarchical blocks defined by a plurality of hierarchies, when the certain hierarchy is higher than a defined lowest layer, for each hierarchy lower than the certain hierarchy to the lowest layer within a range of the first block, the data including:

the error correction information corresponding to each of one or more individual blocks in the hierarchy other than a last one block in two or more blocks of the hierarchy that are included in the same block in a hierarchy that is one hierarchy above the hierarchy, and equals to an exclusive-OR of all data units that belong to the individual block; and the error correction information corresponding to the first block and that equals to the exclusive-OR of all of the plurality of data units that belong to the first block;

determining whether there is any lost data unit among the plurality of data units that belong to the first block;

recovering the lost data unit comprising:

when there is the lost data unit and the certain hierarchy is the lowest layer, recovering the lost data unit by calculating the exclusive-OR of:

all data units that may be received by the receiving among data units that belong to the first block; and the error correction information that corresponds to the first block;

when there is the lost data unit, and a lowest layer block to which the lost data unit belongs in the lowest layer is the last one block in the two or more blocks in the lowest layer, recovering the lost data unit by one of:

calculating the exclusive-OR of respective pieces of the error correction information for the last block in one or more blocks in each hierarchy from the certain hierarchy to the lowest layer where the block is included in the first block and for which the error correction information is received; and all data units that may be received by the receiving in one or more data units that belong to the lowest layer block; and calculating exclusive-OR of all data units that belong to the first block acquired by reception by the receiving or acquired by recovery that is already performed by the recovery unit other than the lost data unit; and the error correction information corresponding to the first block;

acquiring first hierarchy information that corresponds to a first communication route between the communication apparatus and a transmission destination device;

when the specified hierarchy indicated by the first hierarchy information is lower than the lowest layer, for each hierarchy that is lower than the lowest layer and that is the same as the specified hierarchy or higher within a range of the first block, generating error correction information corresponding to each of one or more individual blocks other than the last one block in two or more blocks in the hierarchy that are included in the same block in a hierarchy that is one hierarchy above the hierarchy and that equals to the exclusive-OR of all data units that belong to the individual block; and transmitting data to the transmission destination device, the data including:
- the plurality of data units that belongs to the first block and all of which are received by the reception unit or are completed by recovery by the recovery unit;
- all pieces of the error correction information that correspond to any block in each hierarchy that is the same as the specified hierarchy or higher among hierarchies from the certain hierarchy to the lowest layer; and
- the error correction information generated by the generating when the specified hierarchy is lower than the lowest layer, wherein a ratio of error correction information is different for each of the one or more hierarchies that are continuous from and are lower than the certain hierarchy, the ratio of error correction being less than or equal to an upper threshold for a first error rate and the ratio of error correction being greater than or equal to a lower threshold for a second error rate.

9. The apparatus according to claim 8,
wherein the first hierarchy information indicates a lower hierarchy as the specified hierarchy when a first loss rate of data units in the first communication route becomes higher;
wherein the acquiring receives the first hierarchy information from the transmission destination device;
the processor being further configured to execute instructions comprising:
  recognizing a second loss rate of data units in a second communication route between the communication apparatus and the transmission source device according to determination by the determining;
when determined error correction performance may not be achieved by inserting the error correction information with a ratio of one error correction information for each block in the lowest layer for data units that are lost with the second loss rate;
recognizing a first specific hierarchy lower than the lowest layer based on the second loss rate that may achieve the error correction performance for data units that are lost at the second loss rate when the error correction information is inserted at a ratio of one error correction information for each block in the first specific hierarchy and configured to instruct a value indicating the first specific hierarchy to the transmission source device as the second hierarchy information;
when the error correction performance may be achieved for data units that are lost at the second loss rate by inserting the one error correction information for each block in a second specific hierarchy that is higher than the lowest layer;
recognizing the second specific hierarchy based on the second loss rate; and instructing a value that indicates the second specific hierarchy as the second hierarchy information.

10. The apparatus according to claim 8,
wherein, the first hierarchy information indicates a lower hierarchy as the specified hierarchy when a first loss rate of data units in the first communication route is higher;
the processor being further configured to execute instructions comprising:
  recognizing a second loss rate of data units in a second communication route between the communication apparatus and the transmission source device according to determination by the determining and to instruct the second loss rate to the transmission source device;
wherein the acquiring receives the first loss rate from the transmission destination device;
when a determined error correction performance may not be achieved for data units that are lost at the first loss rate by inserting the one error correction information for each block in the lowest layer,
  the acquiring recognizes a third specific hierarchy that is lower than the lowest layer based on the first loss rate and that may achieve the error correction performance for data units that are lost at the first loss rate by inserting the error correction information with a ratio of the one error correction information for each block in the third specific hierarchy;
  the acquiring acquires a value that indicates the third specific hierarchy as the first hierarchy information;
when the error correction performance may be achieved for data units that are lost at the first loss rate by inserting the error correction information with a ratio of one error correction information for each block in a fourth specific hierarchy that is higher than the lowest layer;
  the acquiring recognizes the fourth specific hierarchy based on the first loss rate; and
  the acquiring acquires a value that indicates the fourth specific hierarchy as the first hierarchy information.

* * * * *